US009111785B2

(12) United States Patent
Gregory et al.

(10) Patent No.: US 9,111,785 B2
(45) Date of Patent: *Aug. 18, 2015

(54) SEMICONDUCTOR STRUCTURE WITH IMPROVED CHANNEL STACK AND METHOD FOR FABRICATION THEREOF

(71) Applicant: MIE Fujitsu Semiconductor Limited, Kuwana (JP)

(72) Inventors: Paul E. Gregory, Palo Alto, CA (US); Pushkar Ranade, Los Gatos, CA (US); Lucian Shifren, San Jose, CA (US)

(73) Assignee: Mie Fujitsu Semiconductor Limited, Kuwana, Mie (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/955,787

(22) Filed: Jul. 31, 2013

(65) Prior Publication Data
US 2013/0313652 A1 Nov. 28, 2013

Related U.S. Application Data

(63) Continuation of application No. 13/039,986, filed on Mar. 3, 2011, now Pat. No. 8,525,271.

(51) Int. Cl.
*H01L 21/70* (2006.01)
*H01L 27/092* (2006.01)
(Continued)

(52) U.S. Cl.
CPC ...... *H01L 27/0928* (2013.01); *H01L 21/76224* (2013.01); *H01L 21/823807* (2013.01);
(Continued)

(58) Field of Classification Search
CPC ............... H01L 21/76224; H01L 21/823807; H01L 21/823892; H01L 21/0928; H01L 29/665; H01L 29/66651; H01L 29/7833; H01L 21/823842; H01L 27/092; H01L 21/823814
USPC ........ 257/368–369, 77, 351, 328, 288, E21.4, 257/E21.33, E21.54; 438/199
See application file for complete search history.

(56) References Cited

U.S. PATENT DOCUMENTS 3,958,266 A 5/1976 Athanas
4,000,504 A 12/1976 Berger
(Continued)

FOREIGN PATENT DOCUMENTS

EP 0274278 7/1988
EP 0312237 4/1989
(Continued)

OTHER PUBLICATIONS

Notification of Transmittal of The International Search Report and The Written Opinion of the International Searching Authority, or the Declaration, PCT/US2012/027053, 12 pages dated May 23, 2012.
(Continued)

*Primary Examiner* — Mohammed Shamsuzzaman
(74) *Attorney, Agent, or Firm* — Baker Botts L.L.P.

(57) ABSTRACT

A method for fabricating a semiconductor structure with a channel stack includes forming a screening layer under a gate of a PMOS transistor element and a NMOS transistor element, forming a threshold voltage control layer on the screening layer, and forming an epitaxial channel layer on the threshold control layer. At least a portion of the epitaxial channel layers for the PMOS transistor element and the NMOS transistor element are formed as a common blanket layer. The screening layer for the PMOS transistor element may include antimony as a dopant material that may be inserted into the structure prior to or after formation of the epitaxial channel layer.

12 Claims, 39 Drawing Sheets

(51) Int. Cl.
*H01L 21/8238* (2006.01)
*H01L 29/78* (2006.01)
*H01L 21/762* (2006.01)
*H01L 29/66* (2006.01)

(52) U.S. Cl.
CPC ...... *H01L29/66651* (2013.01); *H01L 29/7833* (2013.01); *H01L 21/823892* (2013.01); *H01L 29/665* (2013.01)

(56) References Cited

U.S. PATENT DOCUMENTS

| | | | |
|---|---|---|---|
| 4,021,835 A | 5/1977 | Etoh et al. | |
| 4,242,691 A | 12/1980 | Kotani et al. | |
| 4,276,095 A | 6/1981 | Beilstein, Jr. et al. | |
| 4,315,781 A | 2/1982 | Henderson | |
| 4,518,926 A | 5/1985 | Swanson | |
| 4,559,091 A | 12/1985 | Allen et al. | |
| 4,578,128 A | 3/1986 | Mundt et al. | |
| 4,617,066 A | 10/1986 | Vasudev | |
| 4,662,061 A | 5/1987 | Malhi | |
| 4,761,384 A | 8/1988 | Neppl et al. | |
| 4,780,748 A | 10/1988 | Cunningham et al. | |
| 4,819,043 A | 4/1989 | Yazawa et al. | |
| 4,885,477 A | 12/1989 | Bird et al. | |
| 4,908,681 A | 3/1990 | Nishida et al. | |
| 4,945,254 A | 7/1990 | Robbins | |
| 4,956,311 A | 9/1990 | Liou et al. | |
| 5,034,337 A | 7/1991 | Mosher et al. | |
| 5,144,378 A | 9/1992 | Hikosaka | |
| 5,156,989 A | 10/1992 | Williams et al. | |
| 5,156,990 A | 10/1992 | Mitchell | |
| 5,166,765 A | 11/1992 | Lee et al. | |
| 5,208,473 A | 5/1993 | Komori et al. | |
| 5,294,821 A | 3/1994 | Iwamatsu | |
| 5,298,763 A | 3/1994 | Shen et al. | |
| 5,369,288 A | 11/1994 | Usuki | |
| 5,373,186 A | 12/1994 | Schubert et al. | |
| 5,384,476 A | 1/1995 | Nishizawa et al. | |
| 5,426,279 A | 6/1995 | Dasgupta | |
| 5,426,328 A | 6/1995 | Yilmaz et al. | |
| 5,444,008 A | 8/1995 | Han et al. | |
| 5,552,332 A | 9/1996 | Tseng et al. | |
| 5,559,368 A | 9/1996 | Hu et al. | |
| 5,608,253 A | 3/1997 | Liu et al. | |
| 5,622,880 A | 4/1997 | Burr et al. | |
| 5,624,863 A | 4/1997 | Helm et al. | |
| 5,625,568 A | 4/1997 | Edwards et al. | |
| 5,641,980 A | 6/1997 | Yamaguchi et al. | |
| 5,663,583 A | 9/1997 | Matloubian et al. | |
| 5,712,501 A | 1/1998 | Davies et al. | |
| 5,719,422 A | 2/1998 | Burr et al. | |
| 5,726,488 A | 3/1998 | Watanabe et al. | |
| 5,726,562 A | 3/1998 | Mizuno | |
| 5,731,626 A | 3/1998 | Eaglesham et al. | |
| 5,736,419 A | 4/1998 | Naem | |
| 5,753,555 A | 5/1998 | Hada | |
| 5,754,826 A | 5/1998 | Gamal et al. | |
| 5,756,365 A | 5/1998 | Kakumu | |
| 5,763,921 A | 6/1998 | Okumura et al. | |
| 5,780,899 A | 7/1998 | Hu et al. | |
| 5,847,419 A | 12/1998 | Imai et al. | |
| 5,856,003 A | 1/1999 | Chiu | |
| 5,861,334 A | 1/1999 | Rho | |
| 5,877,049 A | 3/1999 | Liu et al. | |
| 5,885,876 A | 3/1999 | Dennen | |
| 5,889,315 A | 3/1999 | Farrenkopf et al. | |
| 5,895,954 A | 4/1999 | Yasumura et al. | |
| 5,899,714 A | 5/1999 | Farrenkopf et al. | |
| 5,918,129 A | 6/1999 | Fulford, Jr. et al. | |
| 5,923,067 A | 7/1999 | Voldman | |
| 5,923,987 A | 7/1999 | Burr | |
| 5,936,868 A | 8/1999 | Hall | |
| 5,946,214 A | 8/1999 | Heavlin et al. | |
| 5,985,705 A | 11/1999 | Seliskar | |
| 5,989,963 A | 11/1999 | Luning et al. | |
| 6,001,695 A | 12/1999 | Wu | |
| 6,020,227 A | 2/2000 | Bulucea | |
| 6,043,139 A | 3/2000 | Eaglesham et al. | |
| 6,060,345 A | 5/2000 | Hause et al. | |
| 6,060,364 A | 5/2000 | Maszara et al. | |
| 6,066,533 A | 5/2000 | Yu | |
| 6,072,217 A | 6/2000 | Burr | |
| 6,087,210 A | 7/2000 | Sohn | |
| 6,087,691 A | 7/2000 | Hamamoto | |
| 6,088,518 A | 7/2000 | Hsu | |
| 6,091,286 A | 7/2000 | Blauschild | |
| 6,096,611 A | 8/2000 | Wu | |
| 6,103,562 A | 8/2000 | Son et al. | |
| 6,118,148 A * | 9/2000 | Yamazaki | 257/327 |
| 6,121,153 A | 9/2000 | Kikkawa | |
| 6,147,383 A | 11/2000 | Kuroda | |
| 6,153,920 A | 11/2000 | Gossmann et al. | |
| 6,157,073 A | 12/2000 | Lehongres | |
| 6,175,582 B1 | 1/2001 | Naito et al. | |
| 6,184,112 B1 | 2/2001 | Maszara et al. | |
| 6,190,979 B1 | 2/2001 | Radens et al. | |
| 6,194,259 B1 | 2/2001 | Nayak et al. | |
| 6,198,157 B1 | 3/2001 | Ishida et al. | |
| 6,218,892 B1 | 4/2001 | Soumyanath et al. | |
| 6,218,895 B1 | 4/2001 | De et al. | |
| 6,221,724 B1 | 4/2001 | Yu et al. | |
| 6,229,188 B1 | 5/2001 | Aoki et al. | |
| 6,232,164 B1 | 5/2001 | Tsai et al. | |
| 6,235,597 B1 | 5/2001 | Miles | |
| 6,245,618 B1 | 6/2001 | An et al. | |
| 6,268,640 B1 | 7/2001 | Park et al. | |
| 6,271,070 B2 | 8/2001 | Kotani et al. | |
| 6,271,551 B1 | 8/2001 | Schmitz et al. | |
| 6,288,429 B1 | 9/2001 | Iwata et al. | |
| 6,297,132 B1 | 10/2001 | Zhang et al. | |
| 6,300,177 B1 | 10/2001 | Sundaresan et al. | |
| 6,313,489 B1 | 11/2001 | Letavic et al. | |
| 6,319,799 B1 | 11/2001 | Ouyang et al. | |
| 6,320,222 B1 | 11/2001 | Forbes et al. | |
| 6,323,525 B1 | 11/2001 | Noguchi et al. | |
| 6,326,666 B1 | 12/2001 | Bernstein et al. | |
| 6,335,233 B1 | 1/2002 | Cho et al. | |
| 6,358,806 B1 | 3/2002 | Puchner | |
| 6,380,019 B1 | 4/2002 | Yu et al. | |
| 6,391,752 B1 | 5/2002 | Colinge et al. | |
| 6,426,260 B1 | 7/2002 | Hshieh | |
| 6,426,279 B1 | 7/2002 | Huster et al. | |
| 6,432,754 B1 | 8/2002 | Assaderaghi et al. | |
| 6,444,550 B1 | 9/2002 | Hao et al. | |
| 6,444,551 B1 | 9/2002 | Ku et al. | |
| 6,449,749 B1 | 9/2002 | Stine | |
| 6,461,920 B1 | 10/2002 | Shirahata et al. | |
| 6,461,928 B2 | 10/2002 | Rodder | |
| 6,472,278 B1 | 10/2002 | Marshall et al. | |
| 6,482,714 B1 | 11/2002 | Hieda et al. | |
| 6,489,224 B1 | 12/2002 | Burr | |
| 6,492,232 B1 | 12/2002 | Tang et al. | |
| 6,500,739 B1 | 12/2002 | Wang et al. | |
| 6,503,801 B1 | 1/2003 | Rouse et al. | |
| 6,503,805 B2 | 1/2003 | Wang et al. | |
| 6,506,640 B1 * | 1/2003 | Ishida et al. | 438/217 |
| 6,518,623 B1 | 2/2003 | Oda et al. | |
| 6,521,470 B1 | 2/2003 | Lin et al. | |
| 6,534,373 B1 | 3/2003 | Yu | |
| 6,541,328 B2 | 4/2003 | Whang et al. | |
| 6,541,829 B2 | 4/2003 | Nishinohara et al. | |
| 6,548,842 B1 | 4/2003 | Bulucea et al. | |
| 6,551,885 B1 | 4/2003 | Yu | |
| 6,552,377 B1 | 4/2003 | Yu | |
| 6,573,129 B2 | 6/2003 | Hoke et al. | |
| 6,576,535 B2 | 6/2003 | Drobny et al. | |
| 6,600,200 B1 | 7/2003 | Lustig et al. | |
| 6,620,671 B1 | 9/2003 | Wang et al. | |
| 6,624,488 B1 | 9/2003 | Kim | |
| 6,627,473 B1 | 9/2003 | Oikawa et al. | |
| 6,630,710 B1 | 10/2003 | Augusto | |

(56) References Cited

U.S. PATENT DOCUMENTS

| | | | |
|---|---|---|---|
| 6,660,605 B1 | 12/2003 | Liu | |
| 6,662,350 B2 | 12/2003 | Fried et al. | |
| 6,667,200 B2 | 12/2003 | Sohn et al. | |
| 6,670,260 B1 | 12/2003 | Yu et al. | |
| 6,693,333 B1 | 2/2004 | Yu | |
| 6,730,568 B2 | 5/2004 | Sohn | |
| 6,737,724 B2 | 5/2004 | Hieda et al. | |
| 6,743,291 B2 | 6/2004 | Ang et al. | |
| 6,743,684 B2 | 6/2004 | Liu | |
| 6,751,519 B1 | 6/2004 | Satya et al. | |
| 6,753,230 B2 | 6/2004 | Sohn et al. | |
| 6,760,900 B2 | 7/2004 | Rategh et al. | |
| 6,770,944 B2 | 8/2004 | Nishinohara et al. | |
| 6,787,424 B1 | 9/2004 | Yu | |
| 6,797,553 B2 | 9/2004 | Adkisson et al. | |
| 6,797,602 B1 | 9/2004 | Kluth et al. | |
| 6,797,994 B1 | 9/2004 | Hoke et al. | |
| 6,808,004 B2 | 10/2004 | Kamm et al. | |
| 6,808,994 B1 | 10/2004 | Wang | |
| 6,813,750 B2 | 11/2004 | Usami et al. | |
| 6,821,825 B2 | 11/2004 | Todd et al. | |
| 6,821,852 B2 | 11/2004 | Rhodes | |
| 6,822,297 B2 | 11/2004 | Nandakumar et al. | |
| 6,831,292 B2 | 12/2004 | Currie et al. | |
| 6,835,639 B2 | 12/2004 | Rotondaro et al. | |
| 6,852,602 B2 | 2/2005 | Kanzawa et al. | |
| 6,852,603 B2 | 2/2005 | Chakravarthi et al. | |
| 6,881,641 B2 | 4/2005 | Wieczorek et al. | |
| 6,881,987 B2 | 4/2005 | Sohn | |
| 6,891,439 B2 | 5/2005 | Jaehne et al. | |
| 6,893,947 B2 | 5/2005 | Martinez et al. | |
| 6,900,519 B2 | 5/2005 | Cantell et al. | |
| 6,901,564 B2 | 5/2005 | Stine et al. | |
| 6,916,698 B2 | 7/2005 | Mocuta et al. | |
| 6,917,237 B1 | 7/2005 | Tschanz et al. | |
| 6,927,463 B2 | 8/2005 | Iwata et al. | |
| 6,928,128 B1 | 8/2005 | Sidiropoulos | |
| 6,930,007 B2 | 8/2005 | Bu et al. | |
| 6,957,163 B2 | 10/2005 | Ando | |
| 6,963,090 B2 | 11/2005 | Passlack et al. | |
| 6,995,397 B2 | 2/2006 | Yamashita et al. | |
| 7,002,214 B1 * | 2/2006 | Boyd et al. | 257/351 |
| 7,008,836 B2 | 3/2006 | Algotsson et al. | |
| 7,013,359 B1 | 3/2006 | Li | |
| 7,015,546 B2 | 3/2006 | Herr et al. | |
| 7,015,741 B2 | 3/2006 | Tschanz et al. | |
| 7,022,559 B2 | 4/2006 | Barnak et al. | |
| 7,036,098 B2 | 4/2006 | Eleyan et al. | |
| 7,038,258 B2 | 5/2006 | Liu et al. | |
| 7,039,881 B2 | 5/2006 | Regan | |
| 7,045,456 B2 | 5/2006 | Murto et al. | |
| 7,057,216 B2 | 6/2006 | Ouyang et al. | |
| 7,061,058 B2 | 6/2006 | Chakravarthi et al. | |
| 7,064,039 B2 | 6/2006 | Liu | |
| 7,064,399 B2 | 6/2006 | Babcock et al. | |
| 7,071,103 B2 | 7/2006 | Chan et al. | |
| 7,078,325 B2 | 7/2006 | Curello et al. | |
| 7,078,776 B2 | 7/2006 | Nishinohara et al. | |
| 7,089,513 B2 | 8/2006 | Bard et al. | |
| 7,089,515 B2 | 8/2006 | Hanafi et al. | |
| 7,091,093 B1 | 8/2006 | Noda et al. | |
| 7,105,399 B1 | 9/2006 | Dakshina-Murthy et al. | |
| 7,109,099 B2 | 9/2006 | Tan et al. | |
| 7,119,381 B2 | 10/2006 | Passlack | |
| 7,122,411 B2 | 10/2006 | Mouli | |
| 7,127,687 B1 | 10/2006 | Signore | |
| 7,132,323 B2 | 11/2006 | Haensch et al. | |
| 7,169,675 B2 | 1/2007 | Tan et al. | |
| 7,170,120 B2 | 1/2007 | Datta et al. | |
| 7,176,137 B2 | 2/2007 | Perng et al. | |
| 7,186,598 B2 | 3/2007 | Yamauchi et al. | |
| 7,189,627 B2 | 3/2007 | Wu et al. | |
| 7,199,430 B2 | 4/2007 | Babcock et al. | |
| 7,202,517 B2 | 4/2007 | Dixit et al. | |
| 7,211,871 B2 | 5/2007 | Cho | |
| 7,221,021 B2 | 5/2007 | Wu et al. | |
| 7,223,646 B2 | 5/2007 | Miyashita et al. | |
| 7,226,833 B2 | 6/2007 | White et al. | |
| 7,226,843 B2 | 6/2007 | Weber et al. | |
| 7,230,680 B2 | 6/2007 | Fujisawa et al. | |
| 7,235,822 B2 | 6/2007 | Li | |
| 7,256,142 B2 | 8/2007 | Fitzgerald | |
| 7,256,639 B1 | 8/2007 | Koniaris et al. | |
| 7,259,428 B2 | 8/2007 | Inaba | |
| 7,260,562 B2 | 8/2007 | Czajkowski et al. | |
| 7,294,877 B2 | 11/2007 | Rueckes et al. | |
| 7,297,994 B2 | 11/2007 | Wieczorek et al. | |
| 7,298,354 B2 | 11/2007 | Yang | |
| 7,301,208 B2 | 11/2007 | Handa et al. | |
| 7,304,350 B2 | 12/2007 | Misaki | |
| 7,307,471 B2 | 12/2007 | Gammie et al. | |
| 7,312,500 B2 | 12/2007 | Miyashita et al. | |
| 7,323,754 B2 | 1/2008 | Ema et al. | |
| 7,332,439 B2 | 2/2008 | Lindert et al. | |
| 7,348,629 B2 | 3/2008 | Chu et al. | |
| 7,354,833 B2 | 4/2008 | Liaw | |
| 7,380,225 B2 | 5/2008 | Joshi et al. | |
| 7,398,497 B2 | 7/2008 | Sato et al. | |
| 7,402,207 B1 | 7/2008 | Besser et al. | |
| 7,402,872 B2 | 7/2008 | Murthy et al. | |
| 7,416,605 B2 | 8/2008 | Zollner et al. | |
| 7,427,788 B2 | 9/2008 | Li et al. | |
| 7,442,971 B2 | 10/2008 | Wirbeleit et al. | |
| 7,449,733 B2 | 11/2008 | Inaba et al. | |
| 7,462,908 B2 | 12/2008 | Bol et al. | |
| 7,469,164 B2 | 12/2008 | Du-Nour | |
| 7,470,593 B2 | 12/2008 | Rouh et al. | |
| 7,485,536 B2 | 2/2009 | Jin et al. | |
| 7,487,474 B2 | 2/2009 | Ciplickas et al. | |
| 7,491,988 B2 | 2/2009 | Tolchinsky et al. | |
| 7,494,861 B2 | 2/2009 | Chu et al. | |
| 7,496,862 B2 | 2/2009 | Chang et al. | |
| 7,496,867 B2 | 2/2009 | Turner et al. | |
| 7,498,637 B2 | 3/2009 | Yamaoka et al. | |
| 7,501,324 B2 | 3/2009 | Babcock et al. | |
| 7,503,020 B2 | 3/2009 | Allen et al. | |
| 7,507,999 B2 | 3/2009 | Kusumoto et al. | |
| 7,514,766 B2 | 4/2009 | Yoshida | |
| 7,521,323 B2 | 4/2009 | Surdeanu et al. | |
| 7,531,393 B2 | 5/2009 | Doyle et al. | |
| 7,531,836 B2 | 5/2009 | Liu et al. | |
| 7,538,364 B2 | 5/2009 | Twynam | |
| 7,538,412 B2 | 5/2009 | Schulze et al. | |
| 7,562,233 B1 | 7/2009 | Sheng et al. | |
| 7,564,105 B2 | 7/2009 | Chi et al. | |
| 7,566,600 B2 | 7/2009 | Mouli | |
| 7,569,456 B2 | 8/2009 | Ko et al. | |
| 7,586,322 B1 | 9/2009 | Xu et al. | |
| 7,592,241 B2 | 9/2009 | Takao | |
| 7,595,243 B1 | 9/2009 | Bulucea et al. | |
| 7,598,142 B2 | 10/2009 | Ranade et al. | |
| 7,604,399 B2 | 10/2009 | Twerdochlib et al. | |
| 7,605,041 B2 | 10/2009 | Ema et al. | |
| 7,605,060 B2 | 10/2009 | Meunier-Beillard et al. | |
| 7,605,429 B2 | 10/2009 | Bernstein et al. | |
| 7,608,496 B2 | 10/2009 | Chu | |
| 7,615,802 B2 | 11/2009 | Elpelt et al. | |
| 7,622,341 B2 | 11/2009 | Chudzik et al. | |
| 7,638,380 B2 | 12/2009 | Pearce | |
| 7,642,140 B2 | 1/2010 | Bae et al. | |
| 7,644,377 B1 | 1/2010 | Saxe et al. | |
| 7,645,665 B2 | 1/2010 | Kubo et al. | |
| 7,651,920 B2 | 1/2010 | Siprak | |
| 7,655,523 B2 | 2/2010 | Babcock et al. | |
| 7,673,273 B2 | 3/2010 | Madurawe et al. | |
| 7,675,126 B2 | 3/2010 | Cho | |
| 7,675,317 B2 | 3/2010 | Perisetty | |
| 7,678,638 B2 | 3/2010 | Chu et al. | |
| 7,681,628 B2 | 3/2010 | Joshi et al. | |
| 7,682,887 B2 | 3/2010 | Dokumaci et al. | |
| 7,683,442 B1 | 3/2010 | Burr et al. | |
| 7,696,000 B2 | 4/2010 | Liu et al. | |
| 7,704,822 B2 | 4/2010 | Jeong | |
| 7,704,844 B2 | 4/2010 | Zhu et al. | |

(56) References Cited

U.S. PATENT DOCUMENTS

| | | |
|---|---|---|
| 7,709,828 B2 | 5/2010 | Braithwaite et al. |
| 7,723,750 B2 | 5/2010 | Zhu et al. |
| 7,737,472 B2 | 6/2010 | Kondo et al. |
| 7,741,138 B2 | 6/2010 | Cho |
| 7,741,200 B2 | 6/2010 | Cho et al. |
| 7,745,270 B2 | 6/2010 | Shah et al. |
| 7,750,374 B2 | 7/2010 | Capasso et al. |
| 7,750,381 B2 | 7/2010 | Hokazono et al. |
| 7,750,405 B2 | 7/2010 | Nowak |
| 7,750,682 B2 | 7/2010 | Bernstein et al. |
| 7,755,144 B2 | 7/2010 | Li et al. |
| 7,755,146 B2 | 7/2010 | Helm et al. |
| 7,759,206 B2 | 7/2010 | Luo et al. |
| 7,759,714 B2 | 7/2010 | Itoh et al. |
| 7,761,820 B2 | 7/2010 | Berger et al. |
| 7,795,677 B2 | 9/2010 | Bangsaruntip et al. |
| 7,808,045 B2 | 10/2010 | Kawahara et al. |
| 7,808,410 B2 | 10/2010 | Kim et al. |
| 7,811,873 B2 | 10/2010 | Mochizuki |
| 7,811,881 B2 | 10/2010 | Cheng et al. |
| 7,818,702 B2 | 10/2010 | Mandelman et al. |
| 7,821,066 B2 | 10/2010 | Lebby et al. |
| 7,829,402 B2 | 11/2010 | Matocha et al. |
| 7,831,873 B1 | 11/2010 | Trimberger et al. |
| 7,846,822 B2 | 12/2010 | Seebauer et al. |
| 7,855,118 B2 | 12/2010 | Hoentschel et al. |
| 7,859,013 B2 | 12/2010 | Chen et al. |
| 7,863,163 B2 | 1/2011 | Bauer |
| 7,867,835 B2 | 1/2011 | Lee et al. |
| 7,883,977 B2 | 2/2011 | Babcock et al. |
| 7,888,205 B2 | 2/2011 | Herner et al. |
| 7,888,747 B2 | 2/2011 | Hokazono |
| 7,895,546 B2 | 2/2011 | Lahner et al. |
| 7,897,495 B2 | 3/2011 | Ye et al. |
| 7,906,413 B2 | 3/2011 | Cardone et al. |
| 7,906,813 B2 | 3/2011 | Kato |
| 7,910,419 B2 | 3/2011 | Fenouillet-Beranger et al. |
| 7,919,791 B2 | 4/2011 | Flynn et al. |
| 7,926,018 B2 | 4/2011 | Moroz et al. |
| 7,935,984 B2 | 5/2011 | Nakano |
| 7,941,776 B2 | 5/2011 | Majumder et al. |
| 7,945,800 B2 | 5/2011 | Gomm et al. |
| 7,947,971 B2 | 5/2011 | Majhi et al. |
| 7,948,008 B2 | 5/2011 | Liu et al. |
| 7,952,147 B2 | 5/2011 | Ueno et al. |
| 7,960,232 B2 | 6/2011 | King et al. |
| 7,960,238 B2 | 6/2011 | Kohli et al. |
| 7,968,400 B2 | 6/2011 | Cai |
| 7,968,411 B2 | 6/2011 | Williford |
| 7,968,440 B2 | 6/2011 | Seebauer |
| 7,968,459 B2 | 6/2011 | Bedell et al. |
| 7,989,900 B2 | 8/2011 | Haensch et al. |
| 7,994,573 B2 | 8/2011 | Pan |
| 8,004,024 B2 | 8/2011 | Furukawa et al. |
| 8,012,827 B2 | 9/2011 | Yu et al. |
| 8,029,620 B2 | 10/2011 | Kim et al. |
| 8,039,332 B2 | 10/2011 | Bernard et al. |
| 8,046,598 B2 | 10/2011 | Lee |
| 8,048,791 B2 | 11/2011 | Hargrove et al. |
| 8,048,810 B2 | 11/2011 | Tsai et al. |
| 8,051,340 B2 | 11/2011 | Cranford, Jr. et al. |
| 8,053,340 B2 | 11/2011 | Colombeau et al. |
| 8,063,466 B2 | 11/2011 | Kurita |
| 8,067,279 B2 | 11/2011 | Sadra et al. |
| 8,067,280 B2 | 11/2011 | Wang et al. |
| 8,067,302 B2 | 11/2011 | Li |
| 8,076,719 B2 | 12/2011 | Zeng et al. |
| 8,097,529 B2 | 1/2012 | Krull et al. |
| 8,103,983 B2 | 1/2012 | Agarwal et al. |
| 8,105,891 B2 | 1/2012 | Yeh et al. |
| 8,106,424 B2 | 1/2012 | Schruefer |
| 8,106,481 B2 | 1/2012 | Rao |
| 8,110,487 B2 | 2/2012 | Griebenow et al. |
| 8,114,761 B2 | 2/2012 | Mandrekar et al. |
| 8,119,482 B2 | 2/2012 | Bhalla et al. |
| 8,120,069 B2 | 2/2012 | Hynecek |
| 8,125,035 B2 | 2/2012 | Nandakumar et al. |
| 8,129,246 B2 | 3/2012 | Babcock et al. |
| 8,129,797 B2 | 3/2012 | Chen et al. |
| 8,134,159 B2 | 3/2012 | Hokazono |
| 8,143,120 B2 | 3/2012 | Kerr et al. |
| 8,143,124 B2 | 3/2012 | Challa et al. |
| 8,143,678 B2 | 3/2012 | Kim et al. |
| 8,148,774 B2 | 4/2012 | Mori et al. |
| 8,163,619 B2 | 4/2012 | Yang et al. |
| 8,169,002 B2 | 5/2012 | Chang et al. |
| 8,170,857 B2 | 5/2012 | Joshi et al. |
| 8,173,499 B2 | 5/2012 | Chung et al. |
| 8,173,502 B2 | 5/2012 | Yan et al. |
| 8,176,461 B1 | 5/2012 | Trimberger |
| 8,178,430 B2 | 5/2012 | Kim et al. |
| 8,179,530 B2 | 5/2012 | Levy et al. |
| 8,183,096 B2 | 5/2012 | Wirbeleit |
| 8,183,107 B2 | 5/2012 | Mathur et al. |
| 8,185,865 B2 | 5/2012 | Gupta et al. |
| 8,187,959 B2 | 5/2012 | Pawlak et al. |
| 8,188,542 B2 | 5/2012 | Yoo et al. |
| 8,196,545 B2 | 6/2012 | Kurosawa |
| 8,201,122 B2 | 6/2012 | Dewey, III et al. |
| 8,214,190 B2 | 7/2012 | Joshi et al. |
| 8,217,423 B2 | 7/2012 | Liu et al. |
| 8,225,255 B2 | 7/2012 | Ouyang et al. |
| 8,227,307 B2 | 7/2012 | Chen et al. |
| 8,236,661 B2 | 8/2012 | Dennard et al. |
| 8,239,803 B2 | 8/2012 | Kobayashi |
| 8,247,300 B2 | 8/2012 | Babcock et al. |
| 8,255,843 B2 | 8/2012 | Chen et al. |
| 8,258,026 B2 | 9/2012 | Bulucea |
| 8,266,567 B2 | 9/2012 | El Yahyaoui et al. |
| 8,286,180 B2 | 10/2012 | Foo |
| 8,288,798 B2 | 10/2012 | Passlack |
| 8,299,562 B2 | 10/2012 | Li et al. |
| 8,324,059 B2 | 12/2012 | Guo et al. |
| 2001/0014495 A1 | 8/2001 | Yu |
| 2002/0042184 A1 | 4/2002 | Nandakumar et al. |
| 2002/0060338 A1 | 5/2002 | Zhang |
| 2003/0006415 A1 | 1/2003 | Yokogawa et al. |
| 2003/0020114 A1 | 1/2003 | Yu et al. |
| 2003/0047763 A1 | 3/2003 | Hieda et al. |
| 2003/0173626 A1 | 9/2003 | Burr |
| 2003/0183856 A1 | 10/2003 | Wieczorek et al. |
| 2003/0215992 A1 | 11/2003 | Sohn et al. |
| 2004/0075118 A1 | 4/2004 | Heinemann et al. |
| 2004/0075143 A1 | 4/2004 | Bae et al. |
| 2004/0084731 A1 | 5/2004 | Matsuda et al. |
| 2004/0087090 A1 | 5/2004 | Grudowski et al. |
| 2004/0126947 A1 | 7/2004 | Sohn |
| 2004/0175893 A1 | 9/2004 | Vatus et al. |
| 2004/0180488 A1 | 9/2004 | Lee |
| 2005/0106824 A1 | 5/2005 | Alberto et al. |
| 2005/0116282 A1 | 6/2005 | Pattanayak et al. |
| 2005/0250289 A1 | 11/2005 | Babcock et al. |
| 2005/0280075 A1 | 12/2005 | Ema et al. |
| 2006/0022270 A1 | 2/2006 | Boyd et al. |
| 2006/0049464 A1 | 3/2006 | Rao |
| 2006/0068555 A1 | 3/2006 | Zhu et al. |
| 2006/0068586 A1 | 3/2006 | Pain |
| 2006/0071278 A1 | 4/2006 | Takao |
| 2006/0154428 A1 | 7/2006 | Dokumaci |
| 2006/0197158 A1* | 9/2006 | Babcock et al. .............. 257/351 |
| 2006/0203581 A1 | 9/2006 | Joshi et al. |
| 2006/0220114 A1 | 10/2006 | Miyashita et al. |
| 2006/0223248 A1 | 10/2006 | Venugopal et al. |
| 2007/0040222 A1 | 2/2007 | Van Camp et al. |
| 2007/0117326 A1 | 5/2007 | Tan et al. |
| 2007/0158790 A1 | 7/2007 | Rao |
| 2007/0212861 A1 | 9/2007 | Chidambarrao et al. |
| 2007/0238253 A1 | 10/2007 | Tucker |
| 2008/0067589 A1 | 3/2008 | Ito et al. |
| 2008/0108208 A1 | 5/2008 | Arevalo et al. |
| 2008/0150007 A1 | 6/2008 | Brennan et al. |
| 2008/0169493 A1 | 7/2008 | Lee et al. |
| 2008/0169516 A1 | 7/2008 | Chung |
| 2008/0197439 A1 | 8/2008 | Goerlach et al. |

(56) References Cited

U.S. PATENT DOCUMENTS

| | | |
|---|---|---|
| 2008/0227250 A1 | 9/2008 | Ranade et al. |
| 2008/0237661 A1 | 10/2008 | Ranade et al. |
| 2008/0258198 A1 | 10/2008 | Bojarczuk et al. |
| 2008/0272409 A1 | 11/2008 | Sonkusale et al. |
| 2009/0057727 A1* | 3/2009 | Kapoor .................. 257/256 |
| 2009/0057746 A1 | 3/2009 | Sugll et al. |
| 2009/0075445 A1 | 3/2009 | Kavalieros et al. |
| 2009/0108350 A1 | 4/2009 | Cai et al. |
| 2009/0108352 A1 | 4/2009 | Majumdar et al. |
| 2009/0130805 A1 | 5/2009 | Babcock et al. |
| 2009/0134468 A1 | 5/2009 | Tsuchiya et al. |
| 2009/0224319 A1 | 9/2009 | Kohli |
| 2009/0302388 A1 | 12/2009 | Cai et al. |
| 2009/0309140 A1 | 12/2009 | Khamankar et al. |
| 2009/0311837 A1 | 12/2009 | Kapoor |
| 2009/0321849 A1 | 12/2009 | Miyamura et al. |
| 2010/0012988 A1 | 1/2010 | Yang et al. |
| 2010/0038724 A1 | 2/2010 | Anderson et al. |
| 2010/0047972 A1 | 2/2010 | Clark et al. |
| 2010/0100856 A1 | 4/2010 | Mittal |
| 2010/0148153 A1 | 6/2010 | Hudait et al. |
| 2010/0149854 A1 | 6/2010 | Vora |
| 2010/0187641 A1 | 7/2010 | Zhu et al. |
| 2010/0207182 A1 | 8/2010 | Paschal |
| 2010/0270600 A1 | 10/2010 | Inukai et al. |
| 2011/0059588 A1 | 3/2011 | Kang |
| 2011/0073961 A1 | 3/2011 | Dennard et al. |
| 2011/0074498 A1 | 3/2011 | Thompson et al. |
| 2011/0079860 A1 | 4/2011 | Verhulst |
| 2011/0079861 A1 | 4/2011 | Shifren et al. |
| 2011/0095811 A1 | 4/2011 | Chi et al. |
| 2011/0111553 A1 | 5/2011 | Babcock et al. |
| 2011/0121266 A1 | 5/2011 | Majhi et al. |
| 2011/0147828 A1 | 6/2011 | Murthy et al. |
| 2011/0169082 A1 | 7/2011 | Zhu et al. |
| 2011/0175168 A1 | 7/2011 | Wang et al. |
| 2011/0175170 A1 | 7/2011 | Wang et al. |
| 2011/0180880 A1 | 7/2011 | Chudzik et al. |
| 2011/0193164 A1 | 8/2011 | Zhu |
| 2011/0212590 A1 | 9/2011 | Wu et al. |
| 2011/0230039 A1 | 9/2011 | Mowry et al. |
| 2011/0242921 A1 | 10/2011 | Tran et al. |
| 2011/0248352 A1 | 10/2011 | Shifren et al. |
| 2011/0294278 A1 | 12/2011 | Eguchi et al. |
| 2011/0309447 A1 | 12/2011 | Arghavani et al. |
| 2012/0021594 A1 | 1/2012 | Gurtej et al. |
| 2012/0034745 A1 | 2/2012 | Colombeau et al. |
| 2012/0056275 A1 | 3/2012 | Cai et al. |
| 2012/0065920 A1 | 3/2012 | Nagumo et al. |
| 2012/0108050 A1 | 5/2012 | Chen et al. |
| 2012/0112207 A1 | 5/2012 | Cheng et al. |
| 2012/0132998 A1 | 5/2012 | Kwon et al. |
| 2012/0138953 A1* | 6/2012 | Cai et al. .................. 257/77 |
| 2012/0146155 A1 | 6/2012 | Hoentschel et al. |
| 2012/0164802 A1 | 6/2012 | Babcock et al. |
| 2012/0167025 A1 | 6/2012 | Gillespie et al. |
| 2012/0187491 A1 | 7/2012 | Zhu et al. |
| 2012/0190177 A1 | 7/2012 | Kim et al. |
| 2012/0223363 A1 | 9/2012 | Kronholz et al. |
| 2012/0223389 A1 | 9/2012 | Gregory et al. |

FOREIGN PATENT DOCUMENTS

| | | |
|---|---|---|
| EP | 0531621 | 3/1993 |
| EP | 0683515 | 11/1995 |
| EP | 0889502 | 1/1999 |
| EP | 1450394 | 8/2004 |
| JP | 59193066 | 11/1984 |
| JP | 4186774 | 7/1992 |
| JP | 8153873 | 6/1996 |
| JP | 8288508 | 11/1996 |
| JP | 2004087671 | 3/2004 |
| KR | 794094 | 1/2008 |
| WO | WO2011/062788 | 5/2011 |

OTHER PUBLICATIONS

Banerjee, et al. "Compensating Non-Optical Effects using Electrically-Driven Optical Proximity Correction", Proc. of SPIE vol. 7275 7275OE, 2009.

Cheng, et al. "Extremely Thin SOI (ETSOI) CMOS with Record Low Variability for Low Power System-on-Chip Applications", Electron Devices Meeting (IEDM), Dec. 2009.

Cheng, et al. "Fully Depleted Extremely Thin SOI Technology Fabricated by a Novel Integration Scheme Feturing Implant-Free, Zero-Silicon-Less, and Faceted Raised Source/Drain", Symposium on VLSI Technology Digest of Technical Papers, pp. 212-213, 2009.

Drennan, et al. "Implications of Proximity Effects for Analog Design", Custom Integrated Circuits Conference, pp. 169-176, Sep. 2006.

Hook, et al. "Lateral Ion Impant Straggle and Mask Proximity Effect", IEEE Transactions on Electron Devices, vol. 50, No. 9, pp. 1946-1951, Sep. 2003.

Hori, et al., "A 0.1 µm CMOS with a Step Channel Profile Formed by Ultra High Vacuum CVD and In-Situ Doped Ions", Proceedsing of the International Electron Devices Meeting, New York, IEEE, US, pp. 909-911, Dec. 5, 1993.

Matshuashi, et al. "High-Performance Double-Layer Expitaxial-Channel PMOSFET Compatible with a Single Gate CMOSFET", Symposium on VLSI Technology Digest of Technical Papers, pp. 36-37, 1996.

Shao, et al., "Boron Diffusion in Silicon: The Anomalies and Control by Point Defect Engineering", Materials Science and Engineering R: Reports, vol. 42, No. 3-4, pp. 65-114, Nov. 1, 2003, Nov. 2012.

Sheu, et al. "Modeling the Well-Edge Proximity Effect in Highly Scaled MOSFETs", IEEE Transactions on Electron Devices, vol. 53, No. 11, pp. 2792-2798, Nov. 2006.

Komaragiri, R. et al., "Depletion-Free Poly Gate Electrode Architecture for Sub 100 Nanometer CMOS Devices with High-K Gate Dielectrics", IEEE IEDM Tech Dig., San Francisco CA, 833-836, Dec. 13-15, 2004.

Samsudin, K et al., "Integrating Intrinsic Parameter Fluctuation Description into BSIMSOI to Forecast sub-15nm UTB SOI based 6T SRAM Operation", Solid-State Electronics (50), pp. 86-93, 2006.

Wong, H et al., "Nanoscale CMOS", Proceedings of the IEEE, Vo. 87, No. 4, pp. 537-570, Apr. 1999.

Ducroquet, F et al. "Fully Depleted Silicon-On-Insulator nMOSFETs with Tensile Strained High Carbon Content $Si_{1-y}C_y$ Channel", ECS 210th Meeting, Abstract 1033, 2006.

Ernst, T et al., "Nanoscaled MOSFET Transistors on Strained Si, SiGe, Ge Layers: Some Integration and Electrical Properties Features", ECS Trans. 2006, vol. 3, Issue 7, pp. 947-961, 2006.

Goesele, U et al., Diffusion Engineering by Carbon in Silicon, Mat. Res. Soc. Symp. vol. 610, 2000.

Holland, Ow and Thomas, DK "A Method to Improve Activation of Implanted Dopants in SiC", Oak Ridge National Laboratory, Oak Ridge, TN, 2001.

Kotaki, H., et al., "Novel Bulk Dynamic Threshold Voltage MOSFET (B-DTMOS) with Advanced Isolation (SITOS) and Gate to Shallow-Well Contact (SSS-C) Processes for Ultra Low Power Dual Gate CMOS", IEDM 96, pp. 459-462, 1996.

Lavéant, P. "Incorporated, Diffusion and Agglomeration of Carbon in Silicon", Solid State Phenomena, vols. 82-84, pp. 189-194, 2002.

Pinacho, R et al., "Carbon in Silicon: Modeling of Diffusion and Clustering Mechanisms", Journal of Applied Physics, vol. 92, No. 3, pp. 1582-1588, Aug. 2002.

Robertson, LS et al., "The Effect of Impurities on Diffusion and Activation of Ion Implanted Boron in Silicon", Mat. Res. Soc. Symp, vol. 610, 2000.

Scholz, R. et al., "Carbon-Induced Undersaturation of Silicon Self-Interstitials", Appl. Phys. Lett. 72(2), pp. 200-202, Jan. 1998.

Scholz, RF et al., "The Contribution of Vacancies to Carbon Out-Diffusion in Dilicon", Appl. Phys. Lett., Vol. 74, No. 3, pp. 392-394.

Stolka, PA et al., "Physical Mechanisms of Transient Enhanced Dopant Diffusion in Ion-Implanted Silicon", J. Appl. Phys. 81(9), pp. 6031-60510, May 1997.

(56) References Cited

OTHER PUBLICATIONS

Wann, C. et al., "Channel Profile Optimization and Device Design for Lower-Power High-Performance Dynamic-Threshold MOSFET", IEDM 96, pp. 113-116, 1996.

Werner, P et al., "Carbon Diffusion in Silicon", Applied Physics Letters, vol. 73, No. 17, pp. 2465-2467, Oct. 1998.

Yan, Ran-Hong et al., "Sealing the Si MOSFET: From Bulk to SOI to Bulk", IEEE Transactions on Electron Devices, vol. 39, No. 7, Jul. 1992.

Nodi, et al., "A 0.1-µm Delta-Doped MOSFET Fabricated with Post-Low-Energy Implanting Selective Epitaxy", IEEE Transactions on Electron Devices, vol. 45, No. 4. pp. 809-814, Apr. 1998.

Ahiko, et al. "A Channel Engineering : Combined with Channel Epitaxy Optimization and TED Suppression for 0.15µm n-n Gate CMOS Technology", 1995 Symposium on VLSI Technology Digest of Technical Papers, pp. 23-24.

Hokazono, et al., "Steep Channel & Halo Profiles Utilizing Boron-Diffusion-Barrier Layers (Si:C) for 32 nm Node and Beyond". 2008 Symposium on VLSI Technology Digest of Technical Papers, pp. 112-113.

Hokazono, et al., "Steep Channel Pofiles in n/pMOS Controlled by Boron-Doped Si-C Layers for Continual Bulk-CMOS Sealing", IEDM09-676 Symposium, pp. 29.11-29.14, 2009.

Thompson, et al., "MOS Scaling: Transistor Challenges for the 21st Century", Intel Technology Journal Q3'1998, pp. 1-19, 1998.

Chau, et al. "A 50nm Depleted-Substrate CMOS Transistor (DST)", Electron Device Meeting 2001, IEDM Technical Digest, IEEE International, pp. 29.1.1-29.1.4, 2001.

Ohguro, et al., "An 0.18-µm CMOS for Mixed Digital and Analog Applications with Zero-Volt-$V_{th}$ Epitaxial-Channel MOSFET's", IEEE Transactions on Electron Devices, vol. 46, No. 7, pp. 1378-1383, Jul. 1999.

\* cited by examiner

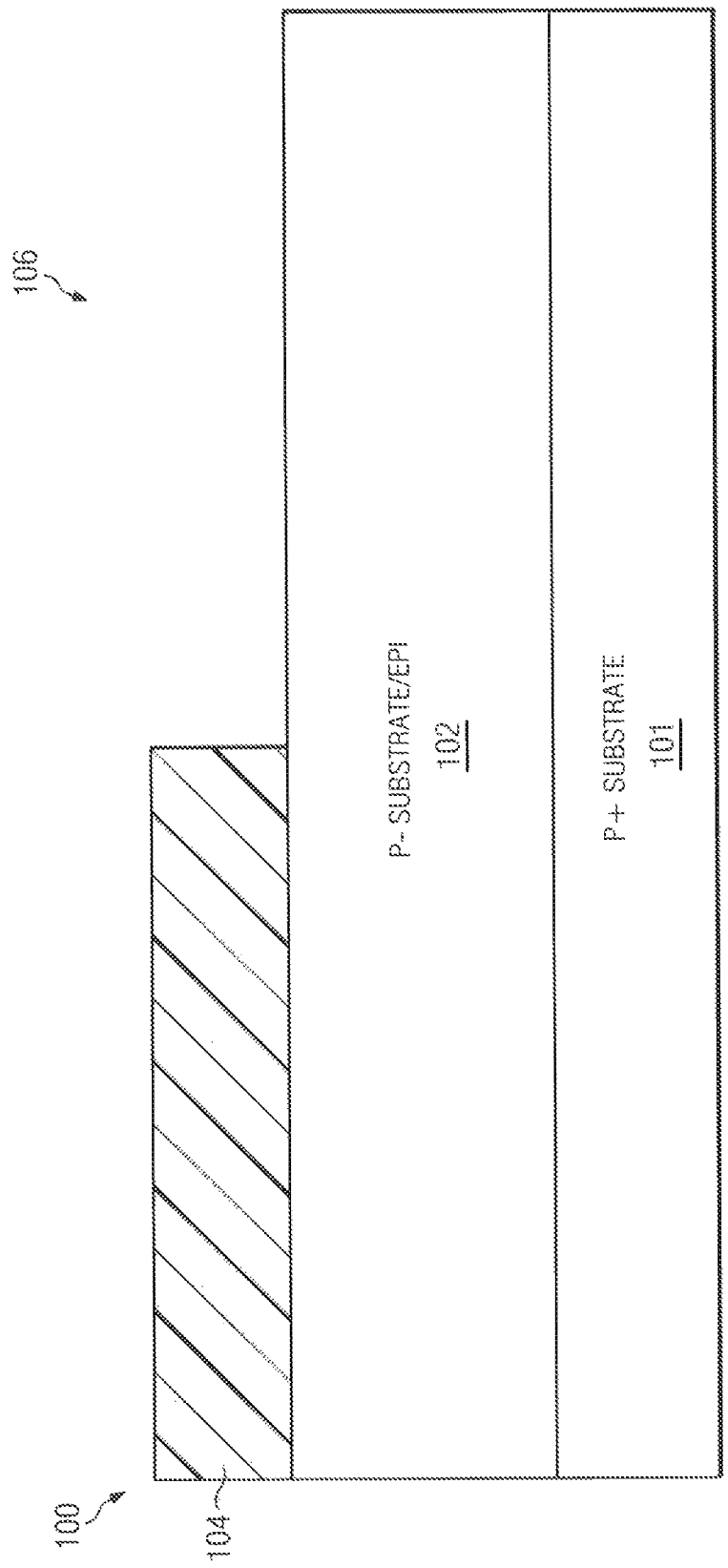

US 9,111,785 B2

SEMICONDUCTOR STRUCTURE WITH IMPROVED CHANNEL STACK AND METHOD FOR FABRICATION THEREOF

RELATED APPLICATIONS

This application is a continuation of U.S application Ser. No. 13/039,986 filed Mar. 3, 2011.

TECHNICAL FIELD

The present disclosure relates in general to semiconductor devices and manufacturing processes and more particularly to a semiconductor structure with an improved channel stack and method for fabrication thereof.

BACKGROUND

Field effect transistors are typically manufactured on a semiconductor substrate that is doped to contain mobile electric charge carriers. When incorporated into a semiconductor substrate lattice as a result of an activation process, dopant atoms can be either electron donors or acceptors. An activated donor atom donates weakly bound valence electrons to the material, creating excess negative charge carriers. These weakly bound electrons can move about in the semiconductor substrate lattice relatively freely, facilitating conduction in the presence of an electric field applied by a gate terminal. Similarly, an activated acceptor produces a mobile positive charge carrier known as a hole. Semiconductors doped with donor impurities are called n-type, while those doped with acceptor impurities are known as p-type. Common n-type donor atoms used in conjunction with silicon, semiconductor substrates include arsenic, phosphorus, and antimony.

The dopant implant or in-situ dopant growth parameters used for semiconductor substrate doping of the doped layers beneath the gate are key to optimum performance of the FET device with respect to important parameters, such as threshold voltage or channel mobility. However, limitations in implant tools, required thermal processing conditions, and variations in materials or process can easily result in unwanted diffusion of dopant materials away from the initial implanted position, decreasing performance or even preventing reliable transistor operation. This is particularly true when co-dopant implant processes are used, since different dopant types have different solid diffusion constants and respond differently to process conditions.

Cost effective electronic manufacturing requires transistor structures and manufacturing processes that are reliable at nanometer scales, and that do not require expensive or unavailable tools or process control conditions. While it is difficult to balance the many variables that control transistor electrical performance, finding suitable transistor dopant structures and manufacturing technique that result in acceptable electrical characteristics such as charge carrier mobility and threshold voltage levels are a key aspect of such commercially useful transistors.

SUMMARY

From the foregoing, it may be appreciated by those of skill in the art that a need has arisen for a technique to fabricate improved transistor devices that provides threshold voltage control and improved operational performance by creating a number of precisely doped layers beneath an undoped (intrinsic) channel layer that can be epitaxially grown on the doped layers. These doped layers and/or intrinsic channel layer can be formed as blanket layers that extend across multiple transistors, and can be later modified by shallow trench isolation or the like to separate transistors into blocks or individual elements. In accordance with the following disclosure, there is provided a doped semiconductor structure with an improved channel stack and method for fabrication thereof that substantially eliminates or greatly reduces disadvantages and problems associated with conventional transistor device design.

According to an embodiment of the disclosure, a method for fabricating a semiconductor structure with a channel stack is provided that includes forming a screening layer under a gate of a transistor element, forming a threshold voltage control layer on the screening layer of the transistor element, and forming an epitaxial channel layer on the threshold control layer of the transistor element. The screening layer for the PMOS transistor element includes antimony as a dopant material that may be inserted into the structure prior to or after formation of the epitaxial channel layer. As disclosed in greater detail in the specification, the concentration and type of single dopant or co-dopants atoms selected, the dopant implant or in-situ growth conditions, and the particular doping profiles, anneal profiles and transistor structure are all selected to maintain a device that is more reliable than conventional transistors.

Embodiments of the present disclosure may enjoy some, all, or none of these advantages. Other technical advantages may be readily apparent to one skilled in the art from the following figures, description, and claims.

BRIEF DESCRIPTION OF THE DRAWINGS

For a more complete understanding of the present disclosure, reference is made to the following description taken in conjunction with the accompanying drawings, wherein like reference numerals represent like parts, in which, FIGS. 1A to 1K illustrate a fabrication process for a semiconductor structure with a channel stack using a blanket channel and shallow trench isolation last approach;

DETAILED DESCRIPTION

Several approaches may be utilized to build a transistor element with a channel stack having a screening layer to screen the charges on the gate, a threshold voltage control layer to adjust the threshold voltage for the transistor element, and an intrinsic channel for high mobility and reduced random dopant fluctuation performance. Each approach has various advantages and disadvantages. In general, two tradeoffs are considered when building transistor elements on a semiconductor die, the number of steps in the process (relating to manufacturing costs) and channel formation (relating to transistor performance). The fewer masking steps and total steps required to build a design translates into a lower cost to build. Forming the channel later in the thermal cycle of the manufacturing process facilitates controlling the channel doping profile and avoiding unwanted contaminants from diffusing into the channel from other parts of the transistor design.

Figure 1B:
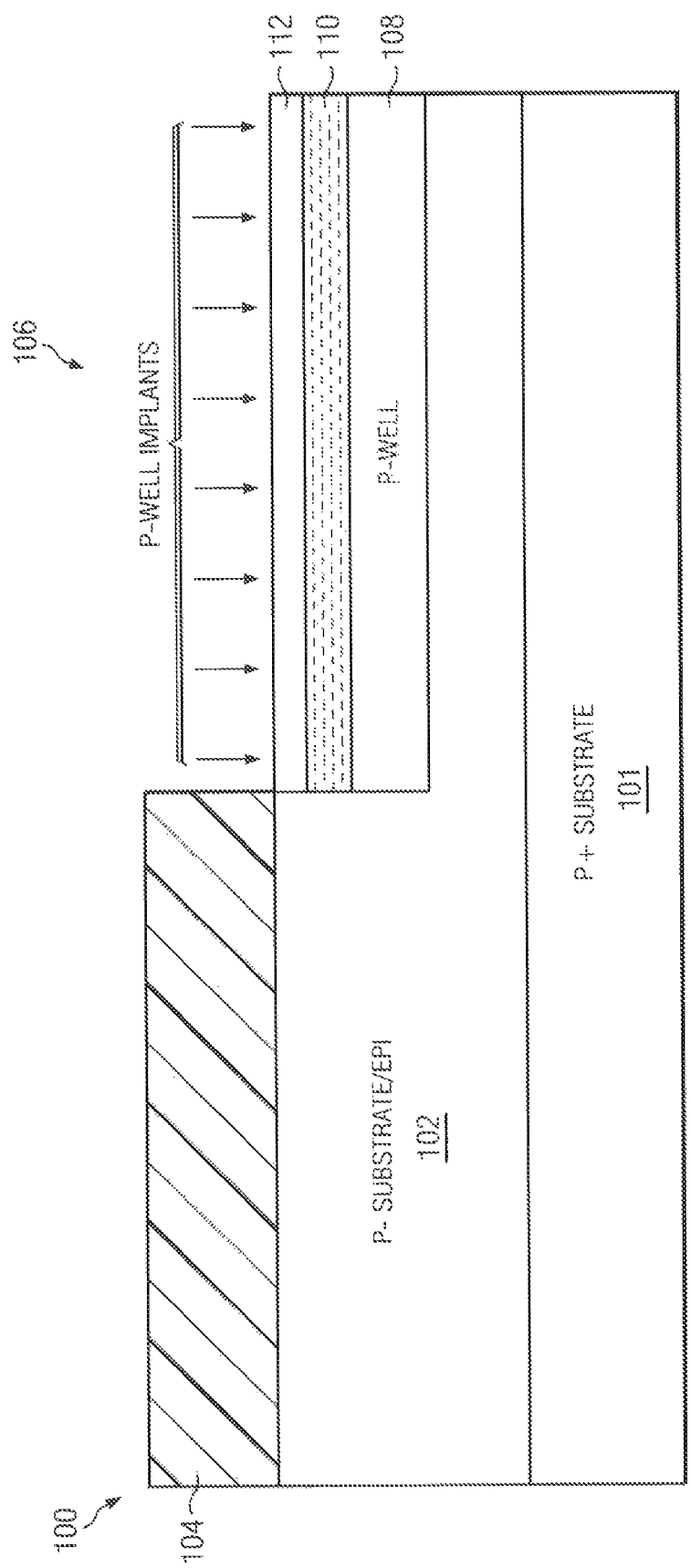
Figure 1C:
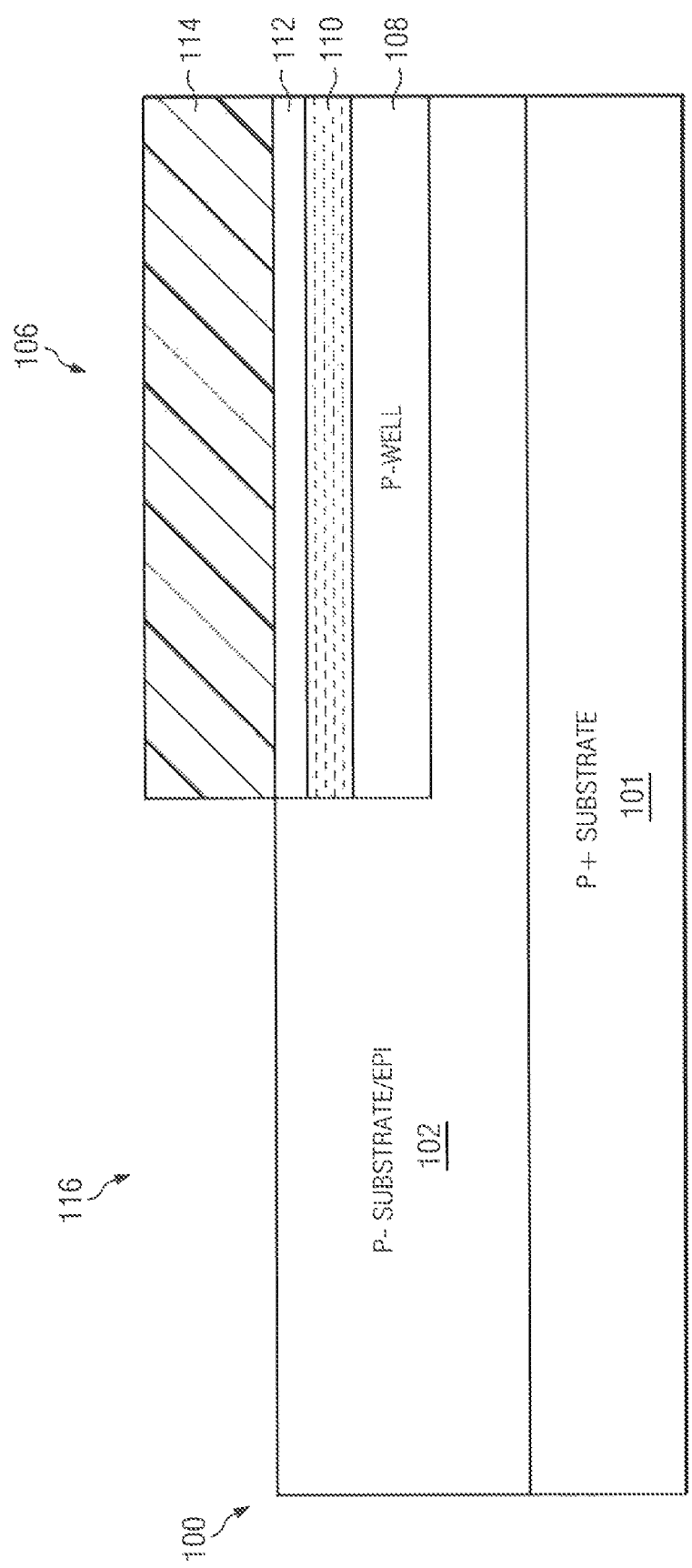
Figure 1D:
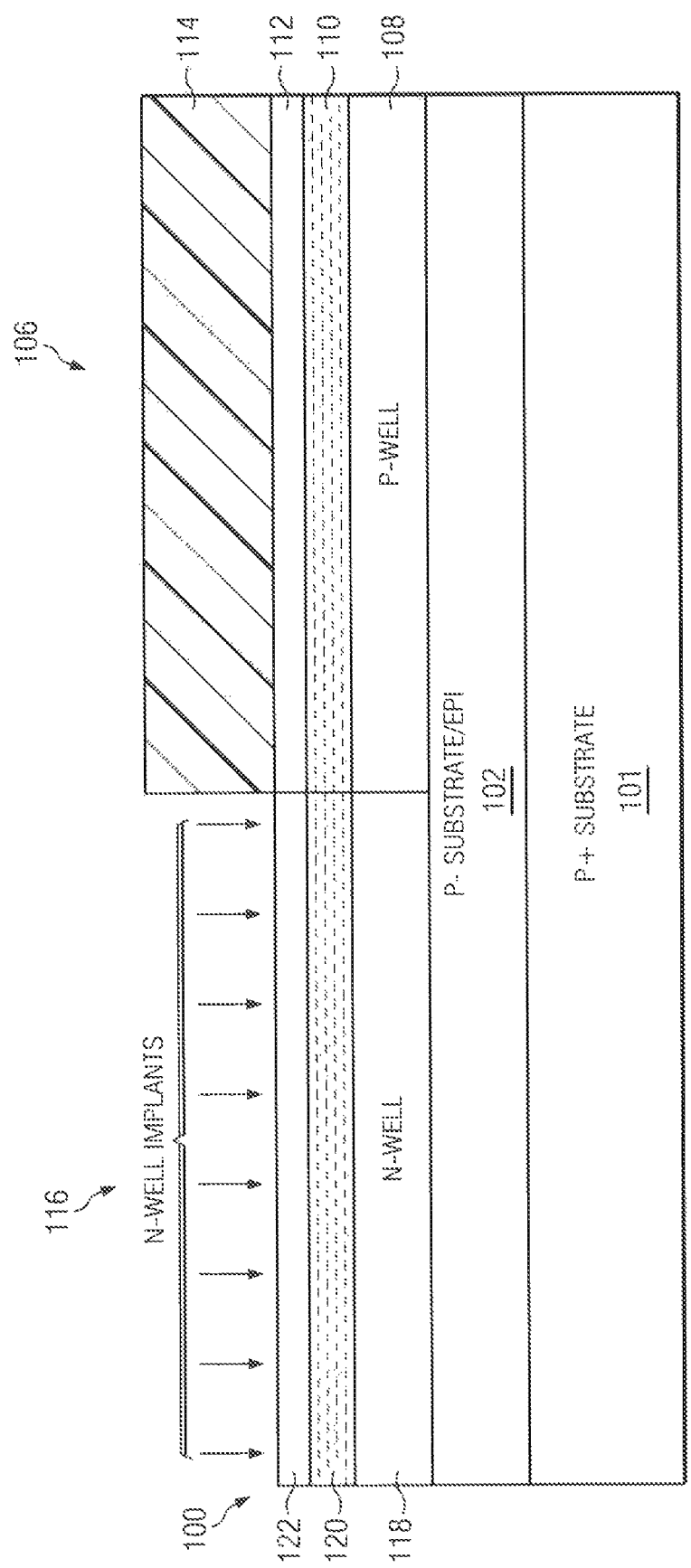
Figure 1E:
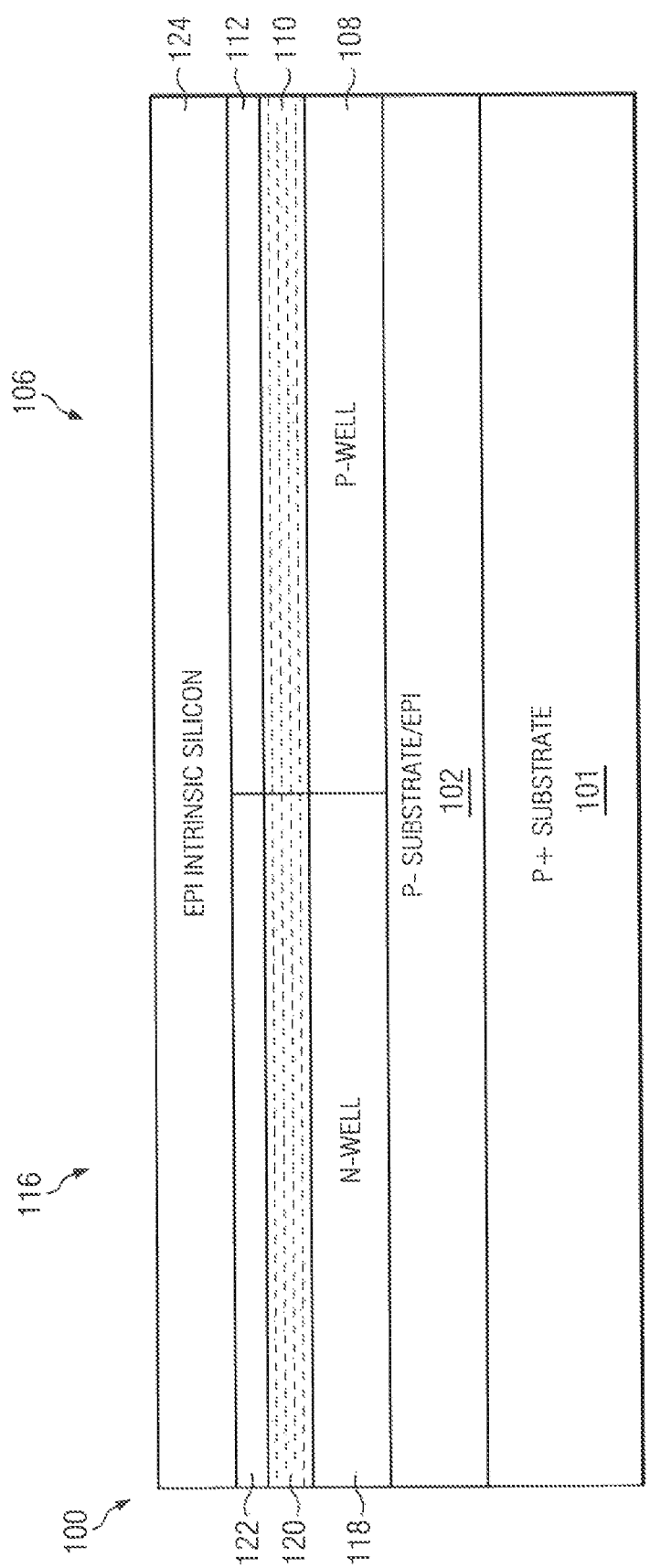

FIGS. 1A to 1K show a blanket channel and shallow trench isolation last approach for forming a structure 100 having transistor elements with the three layer channel stack to optimize overall transistor performance. The process begins in FIG. 1A with a P+ substrate 101 and a P− silicon epitaxy layer 102 formed thereon and used for structure 100. Initial patterning is performed by forming a photoresist mask 104 and etching away desired portions of the photoresist mask 104 to expose an area 106 for a first transistor element, in this instance a NMOS transistor. In FIG. 1E, ion implantation is performed to create a p-well region 108. Another ion implantation is performed to create a screening layer 110. Another ion implantation is performed to create a threshold voltage control layer 112. Alternatively, threshold voltage control layer 112 may be formed through diffusion from screening layer 110.

In FIG. 1C, photoresist layer 104 is removed and a new photoresist layer 114 is patterned to expose an area 116 for a second transistor element, in this instance a PMOS transistor. In FIG. 1D, ion implantation is performed to create a n-well region 118. Another ion implantation is performed to create a screening layer 120. Another ion implantation is performed to create a threshold voltage control layer 122. Alternatively, threshold voltage control layer 122 may be formed through diffusion from screening layer 120.

Figure 1F:
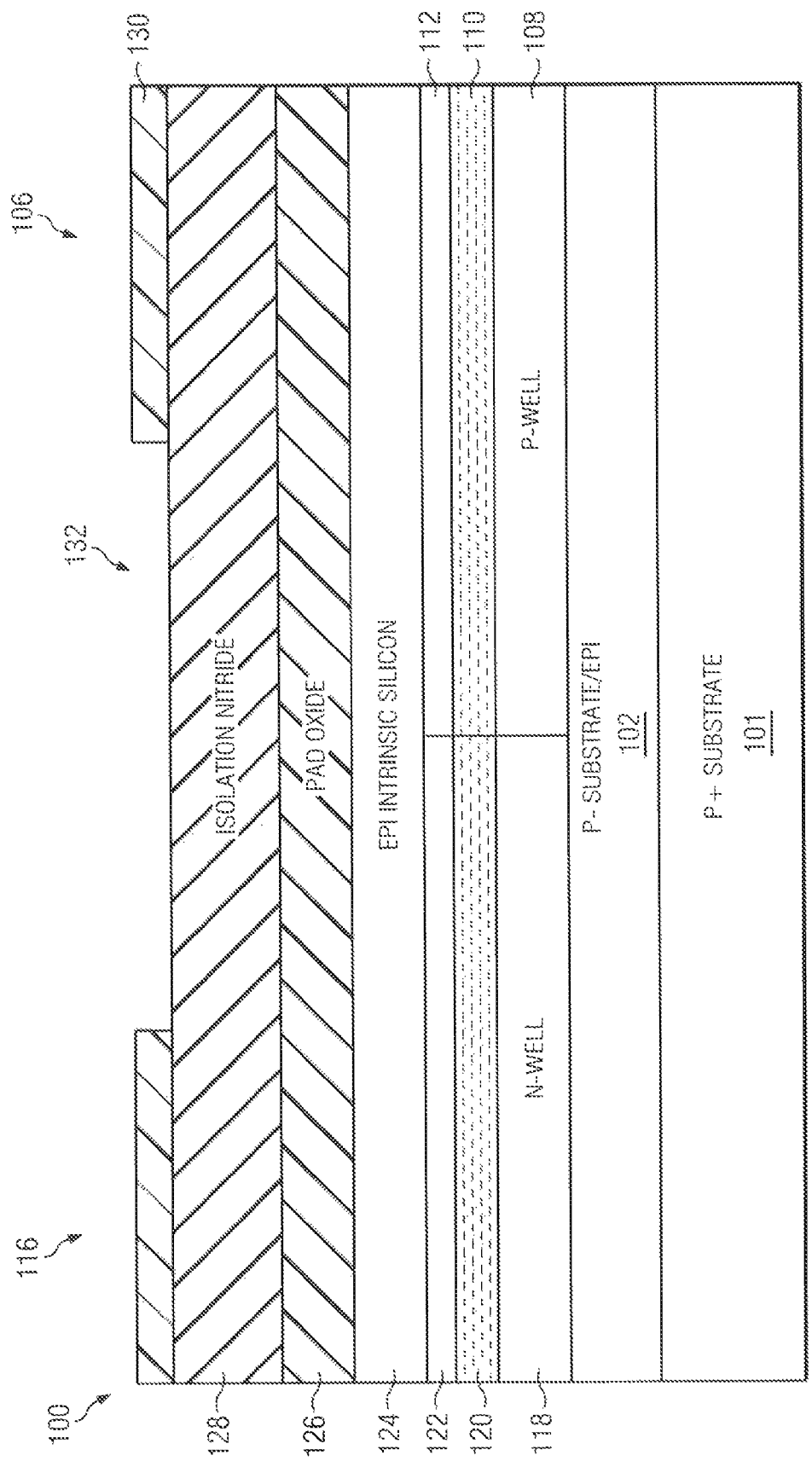

In FIG. 1E, photoresist layer 114 is removed and an epitaxial layer 124 of intrinsic silicon is grown across PMOS transistor 116 and NMOS transistor 106. Epitaxial layer 124 becomes the channel for each of PMOS transistor 116 and NMOS transistor 106. In FIG. 1F, the initial steps for isolating PMOS transistor 106 from NMOS transistor 116 are performed by depositing a pad oxide layer 126 on epitaxial layer 124, depositing a nitride layer 128 on pad oxide layer 126, and patterning a photoresist mask 130 to leave an exposed area 132 for a shallow trench isolation region.

Figure 1G:
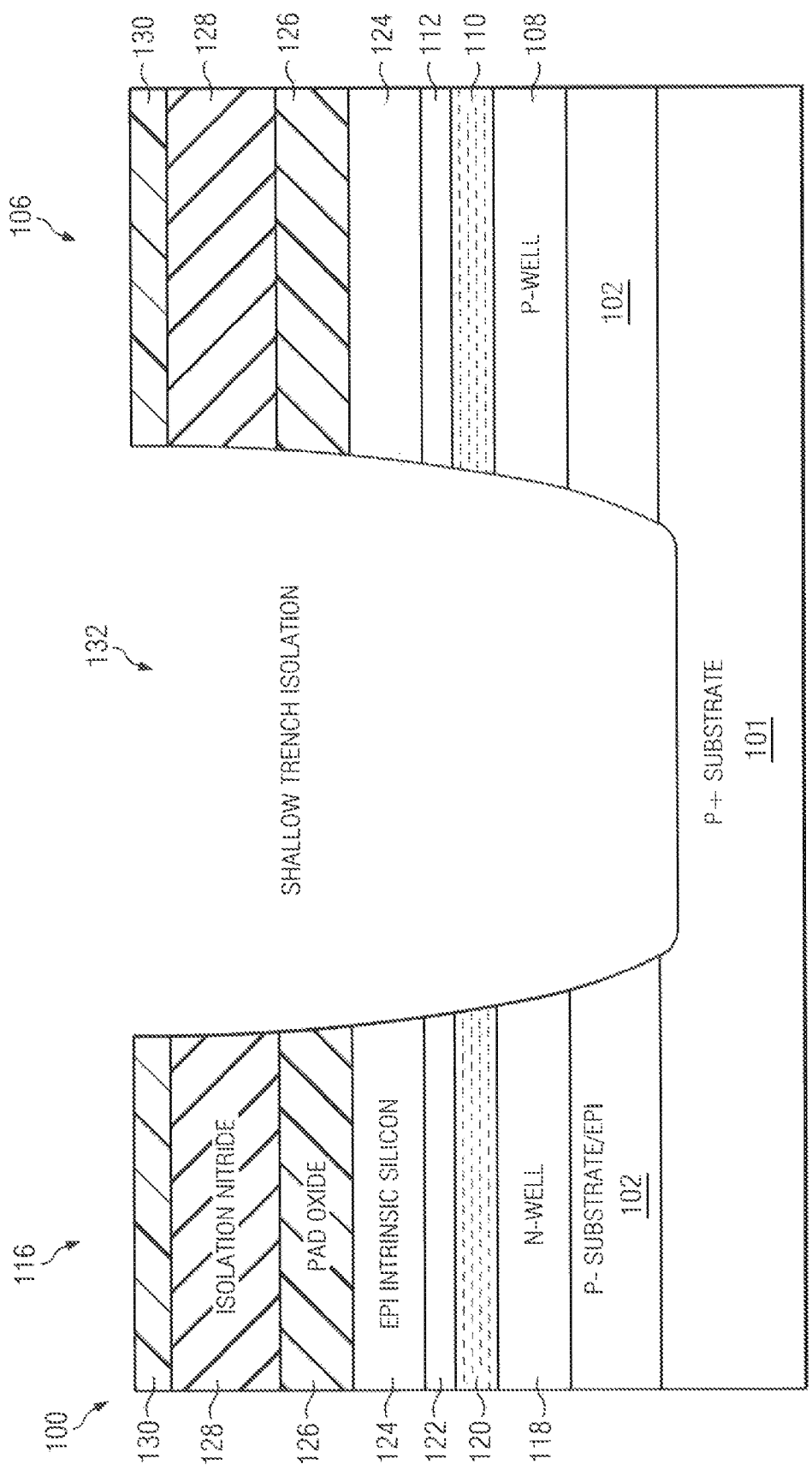
Figure 1H:
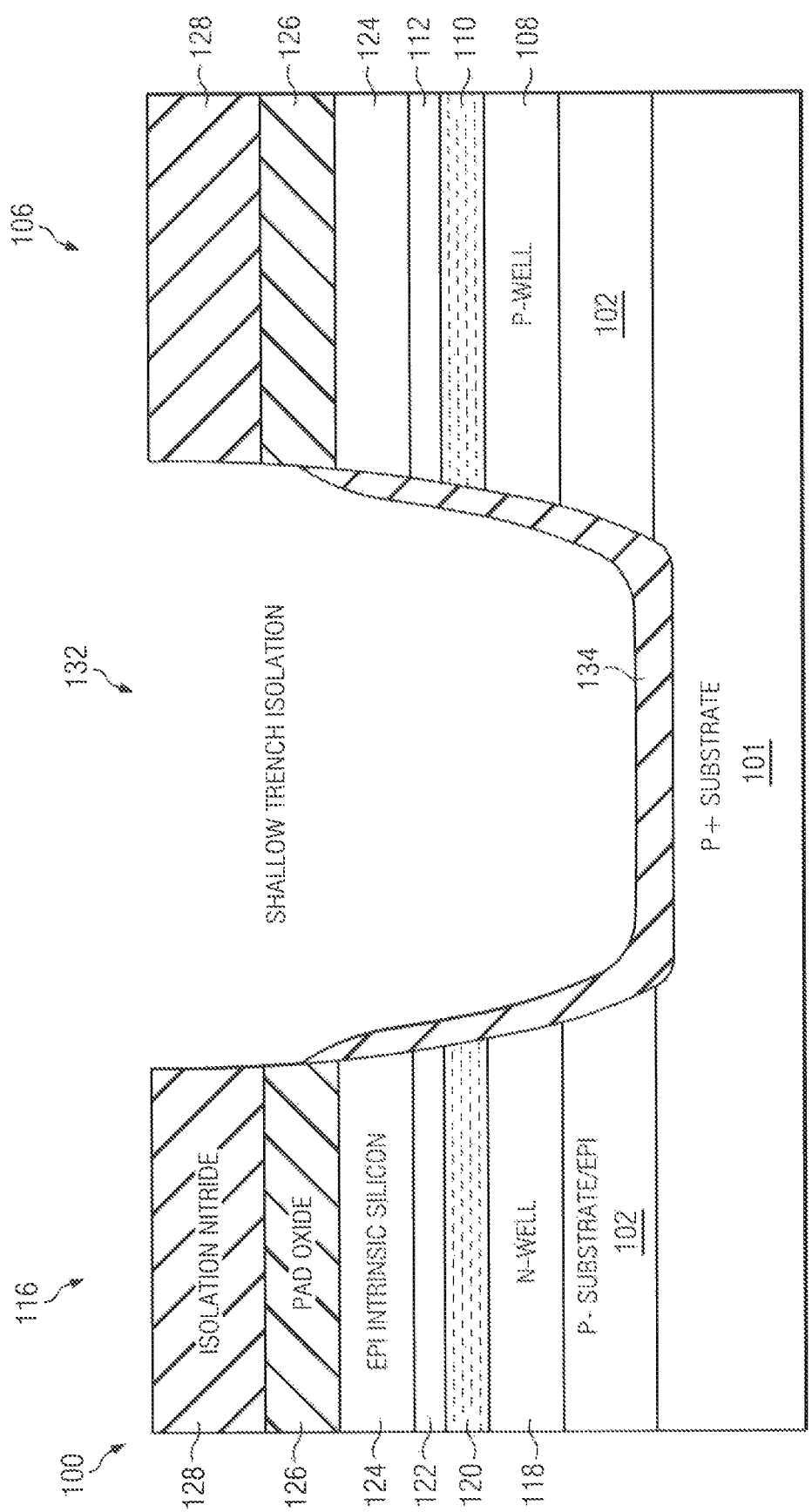

In FIG. 1G, portions of nitride isolation layer 128, pad oxide layer 126, epitaxial layer 124, threshold voltage control layers 112 and 122, screening layers 110 and 120, n-well region 118, p-well region 108, and silicon epitaxy layer 102 and substrate 101 are etched away in area 132 to leave a trench. In FIG. 1H, photoresist mask 130 is removed and a liner 134 is grown over structure 100 and into the trench.

Figure 1J:
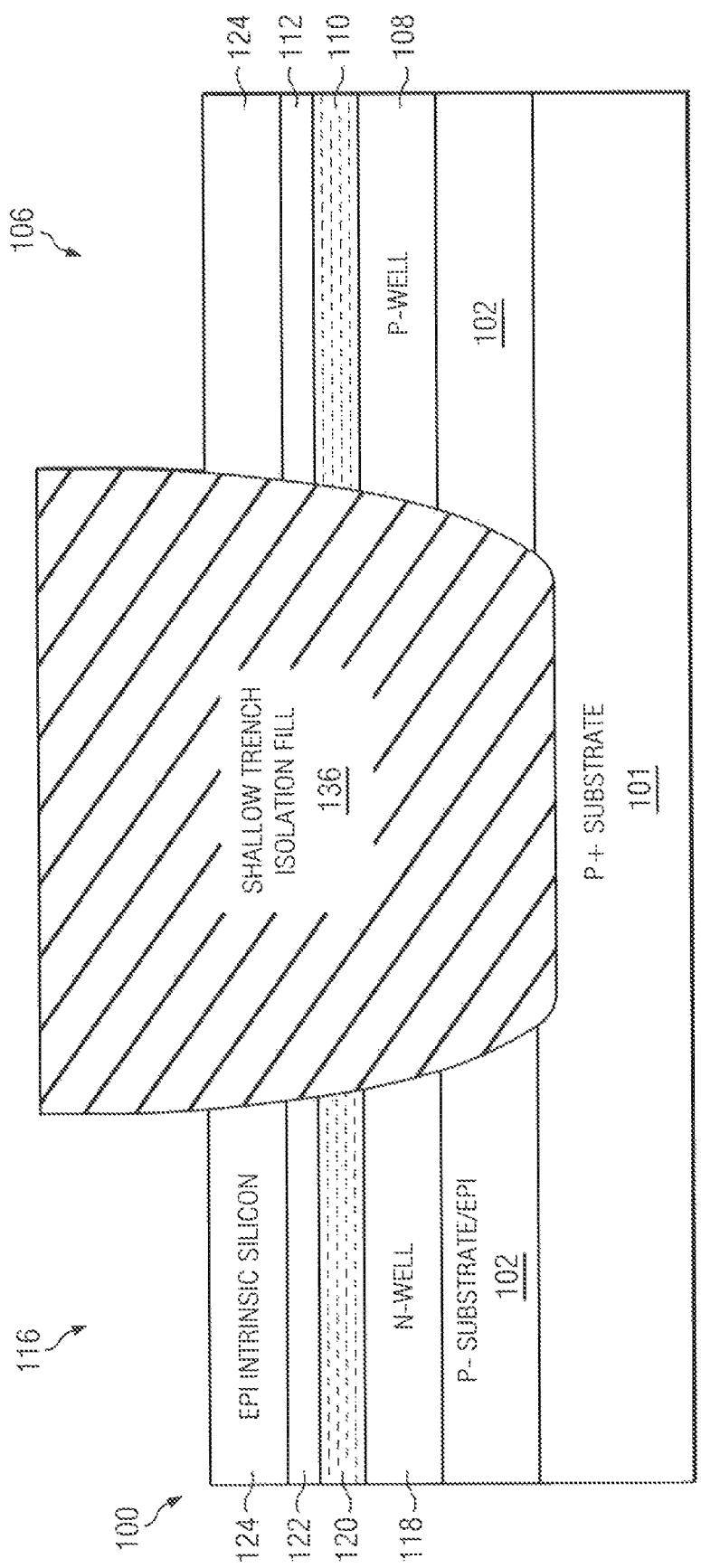
Figure 1K:
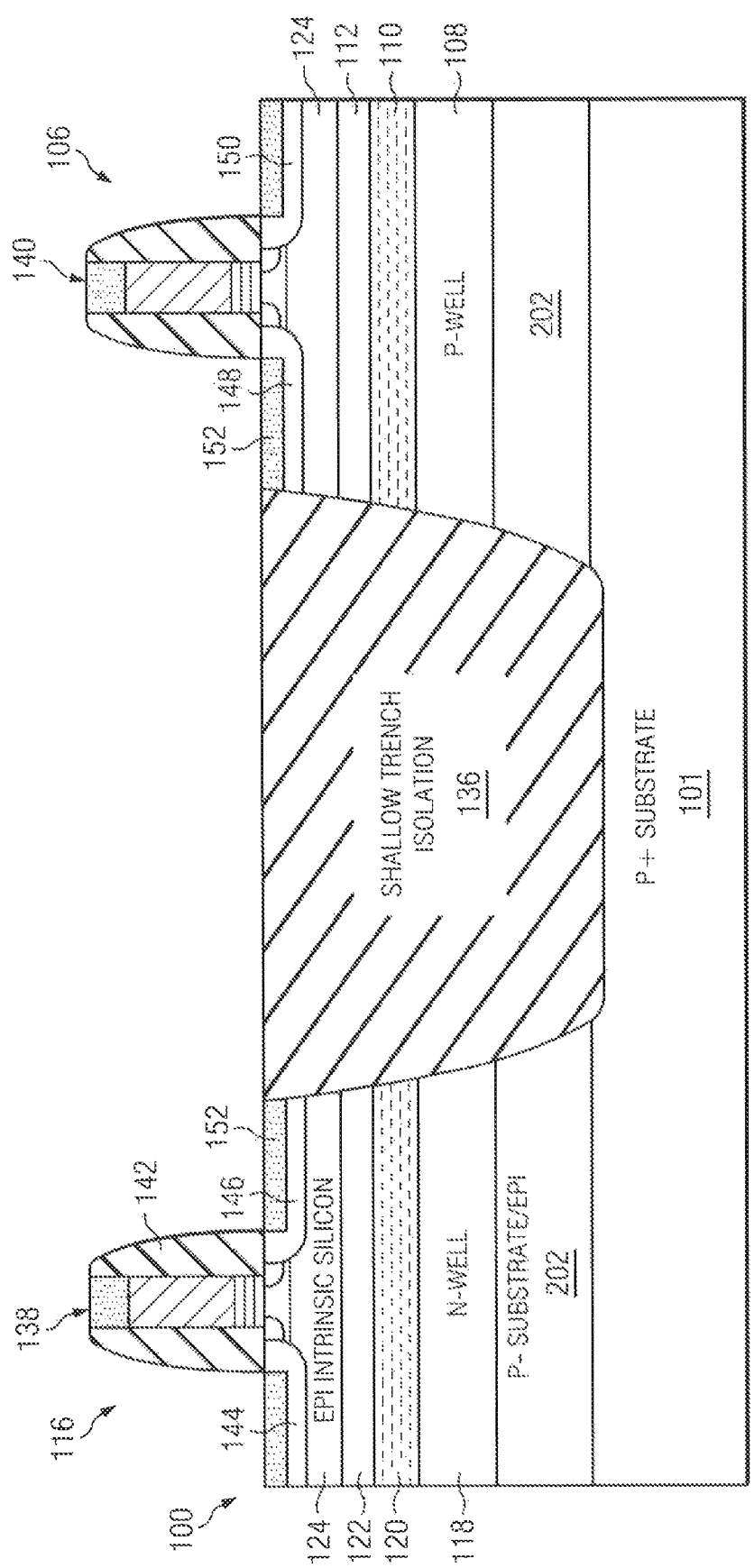

In FIG. 1I, the trench is filled with oxide to establish shallow trench isolation region 136. A re-flow anneal is performed to minimize voids in structure 100 and a curing anneal is performed to densify and harden structure 100 and create desired stress therein. A planarization process is then performed down to nitride isolation layer 128. In FIG. 1J, nitride isolation layer 128 and pad oxide layer 126 are etched away. In FIG. 1K, PMOS transistor 116 and NMOS transistor 106 are completed using conventional gate stack 138 and 140 formation with spacers 142, source/drain formations (144, 146, 148, and 150), and suicide formation 152.

Figure 2A:
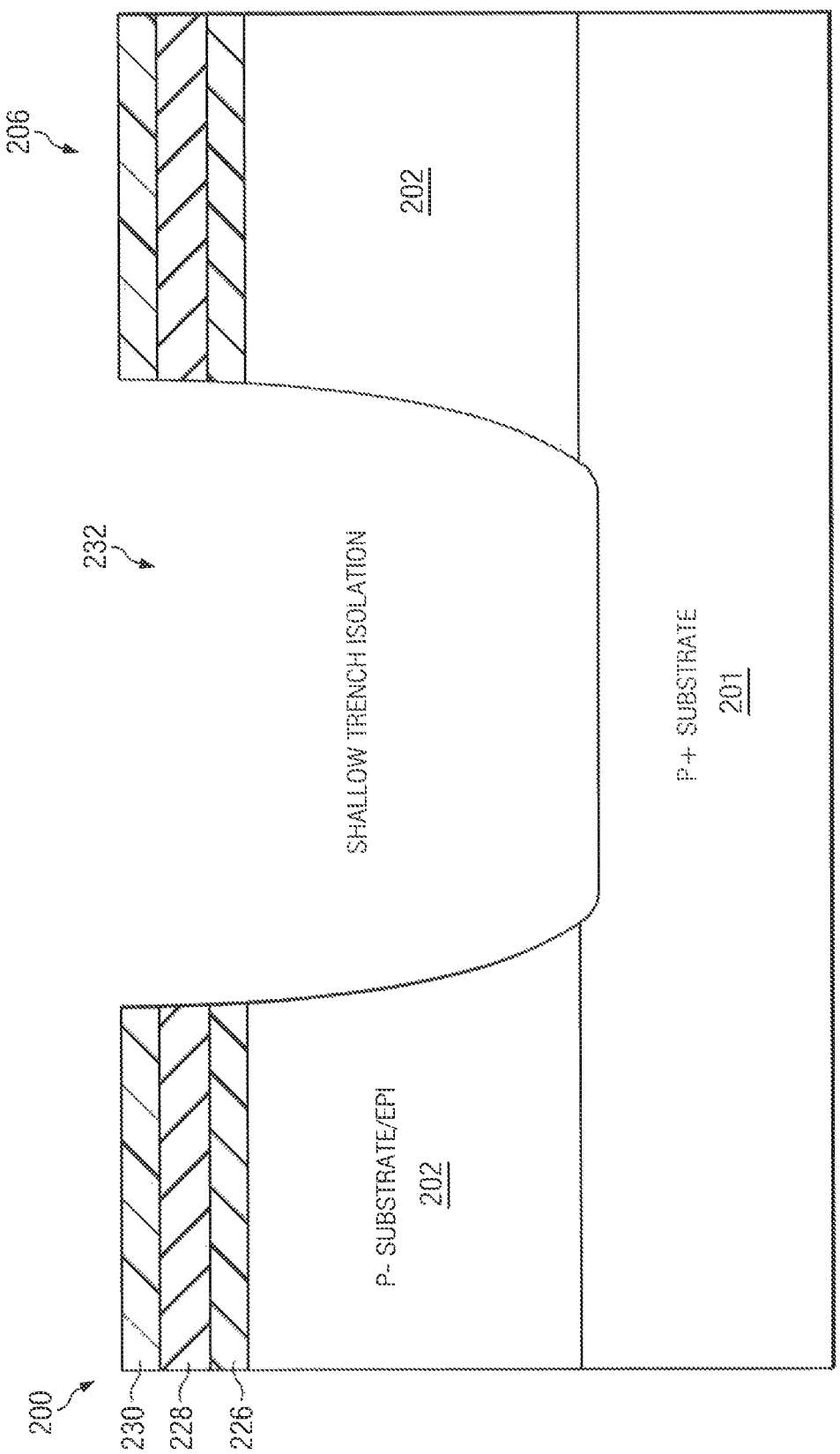
FIGS. 2A to 2I illustrate a fabrication process for a semiconductor structure with a channel stack using a blanket channel and shallow trench isolation first approach.
Figure 2B:
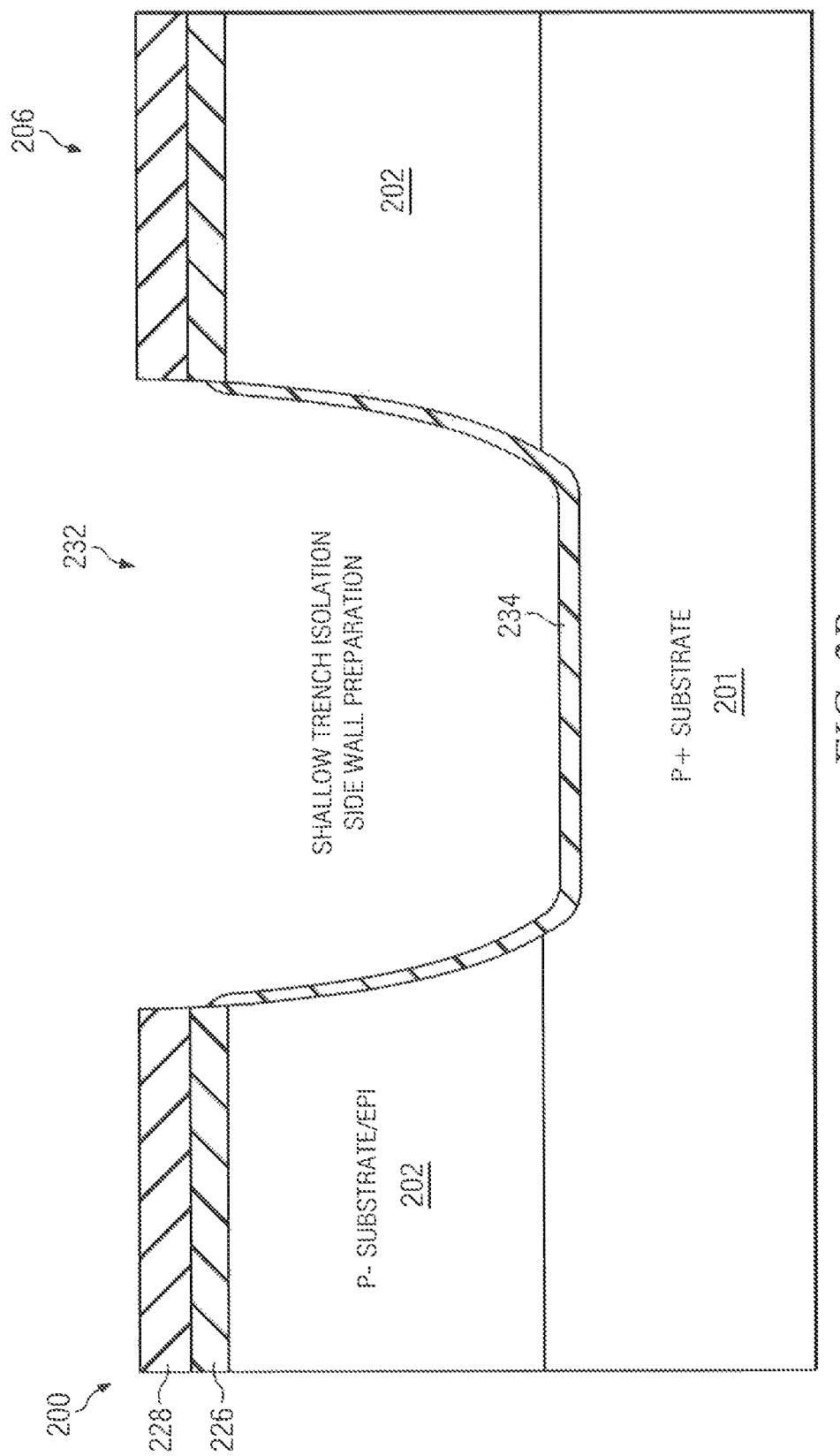

FIGS. 2A to 2I show a blanket channel and shallow trench isolation first approach for forming a structure 200 having transistor elements with the three layer channel stack to optimize overall transistor performance. The process begins in FIG. 2A with a P+ substrate 201 and a P− silicon epitaxy layer 202 formed thereon and used for structure 200. The initial steps for isolating transistor elements is performed by depositing a pad oxide layer 226 on structure 200, depositing a nitride layer 228 on pad oxide layer 226, and patterning a photoresist mask 230 to leave an exposed area 232 for a shallow trench isolation region. Portions of nitride isolation layer 228, pad oxide layer 226, silicon epitaxy layer 202, and substrate 201 are etched away in area 232 to leave a trench. In FIG. 2B, photoresist mask 230 as removed and a liner 234 is grown over structure 200 and into the trench.

Figure 2C:
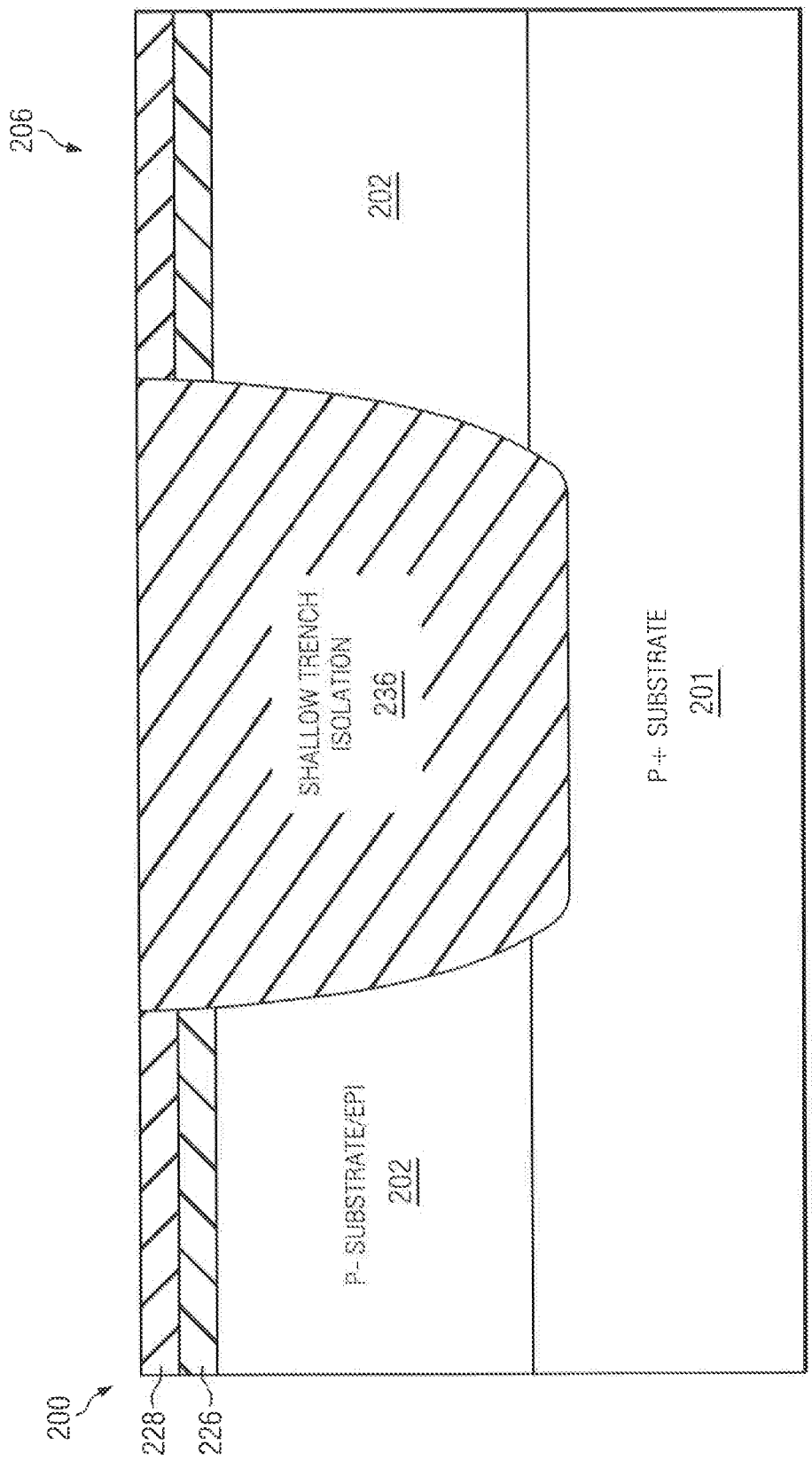
Figure 2D:
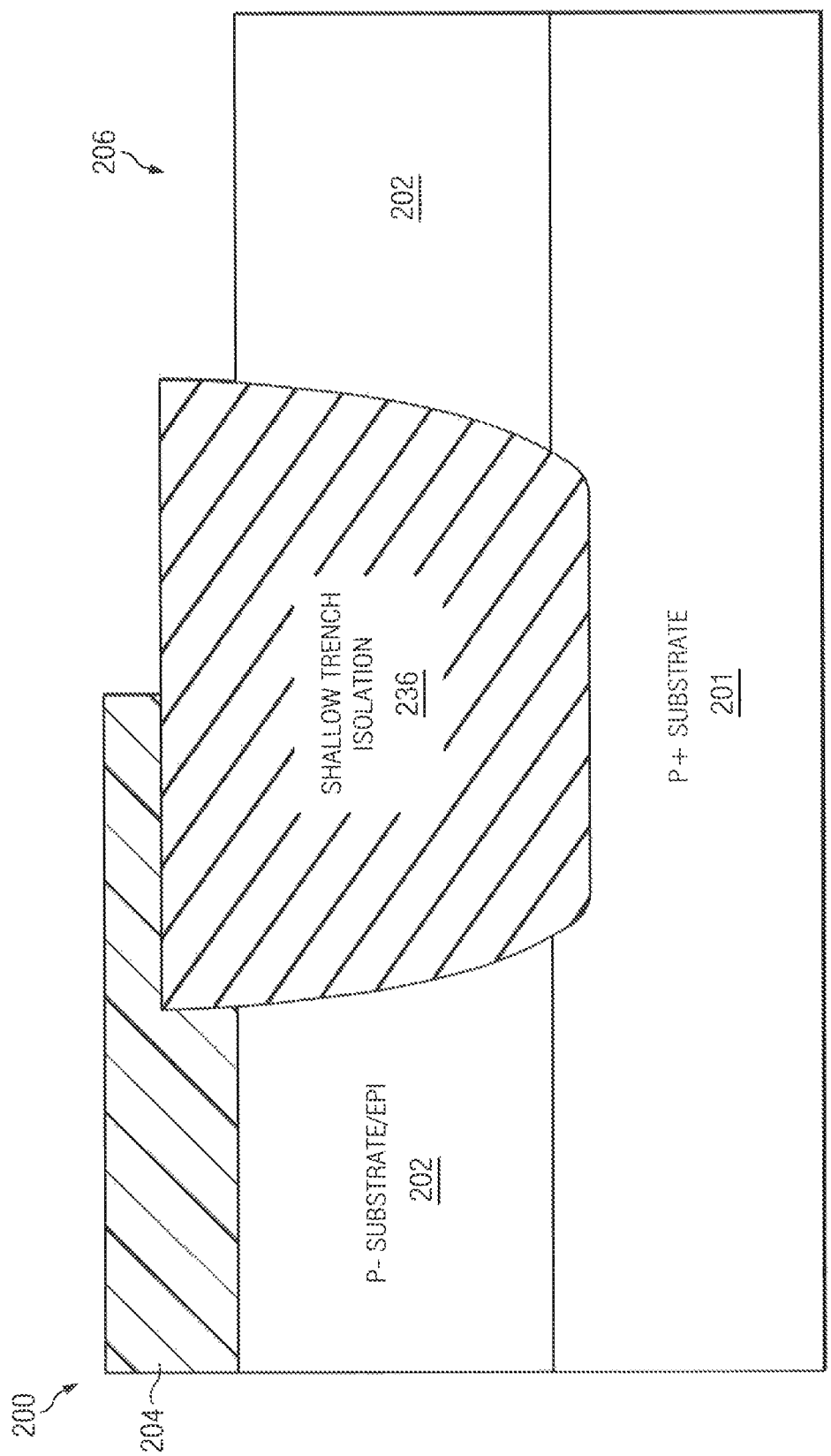

In FIG. 2C, the trench is filled with oxide to establish shallow trench isolation region 236. A re-flow anneal is performed to minimize voids in structure 200 and a curing anneal is performed to densify and harden structure 200 and create desired stress therein. A planarization process is then performed down to nitride isolation layer 228. In FIG. 2D, nitride isolation layer 228 and pad oxide layer 226 are etched away. Initial patterning is performed by forming a photoresist mask 204 and etching away desired portions of the photoresist mask 204 to expose an area 206 for a first transistor element, in this instance a NMOS transistor.

Figure 2E:
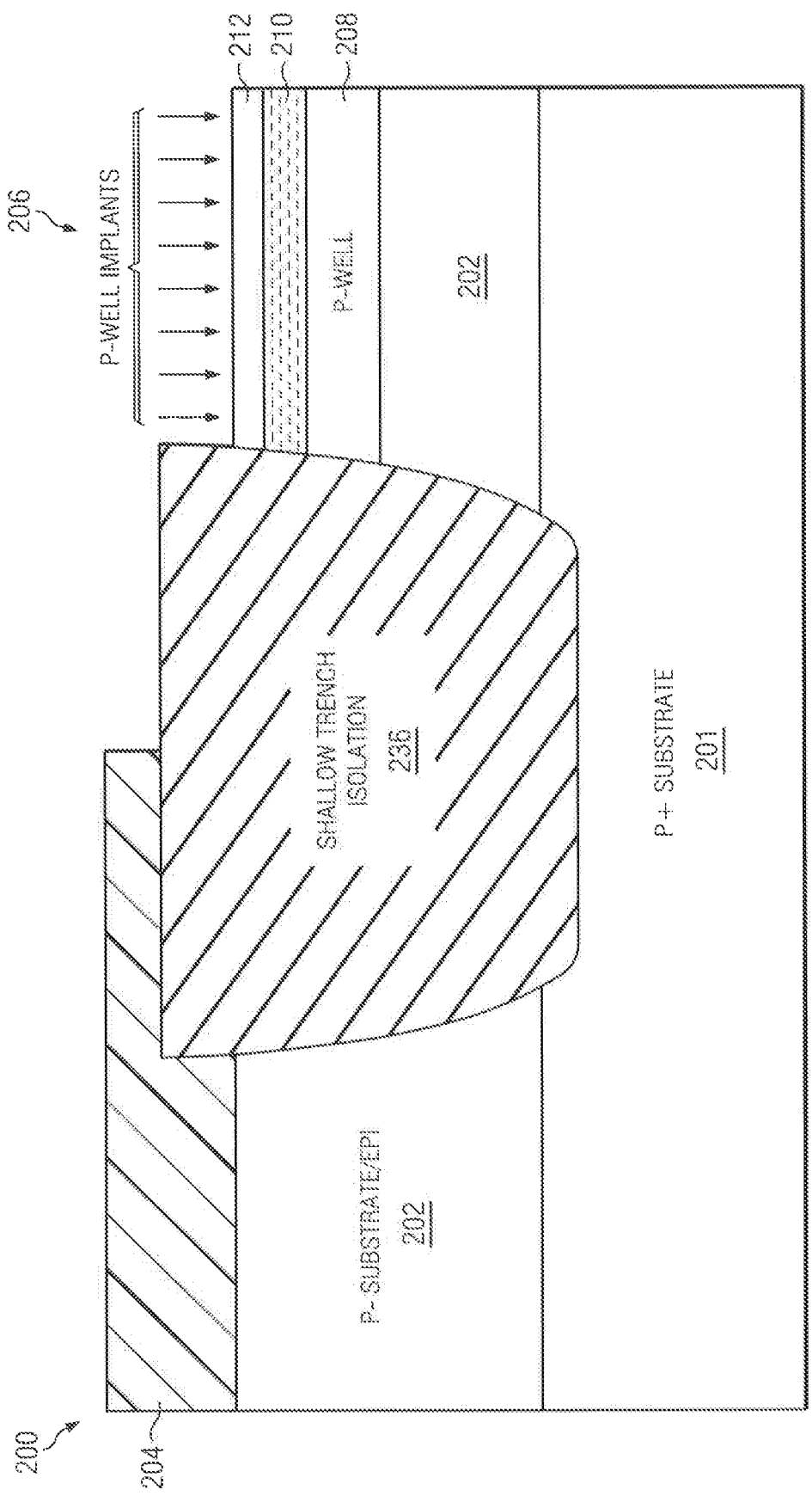

In FIG. 2E, ion implantation is performed to create a p-well region 208. Another ion implantation is performed to create a screening layer 210. Another ion implantation is performed to create a threshold voltage control layer 212. Alternatively, threshold voltage control layer 212 may be formed through diffusion from screening layer 210.

Figure 2F:
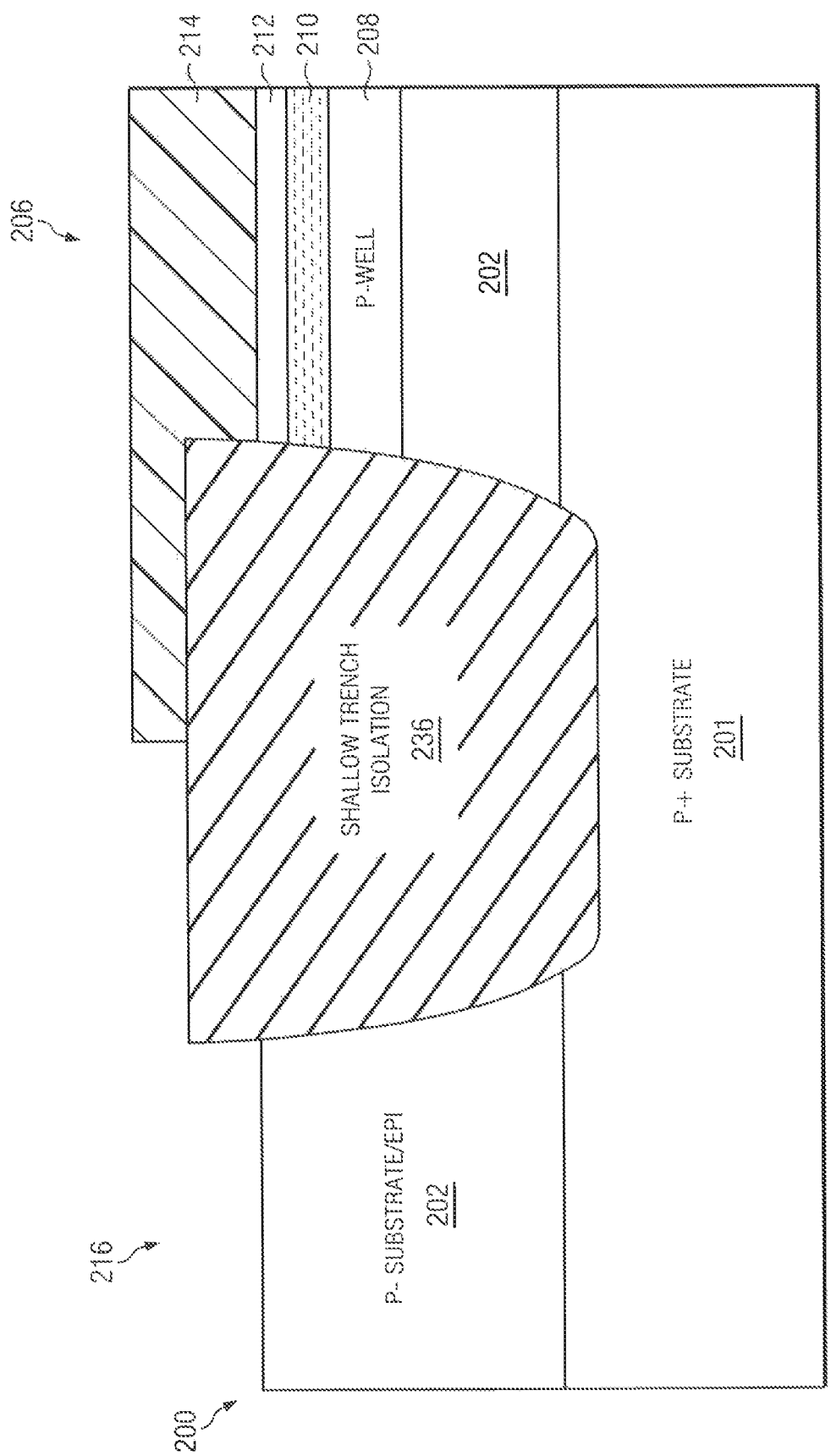
Figure 2G:
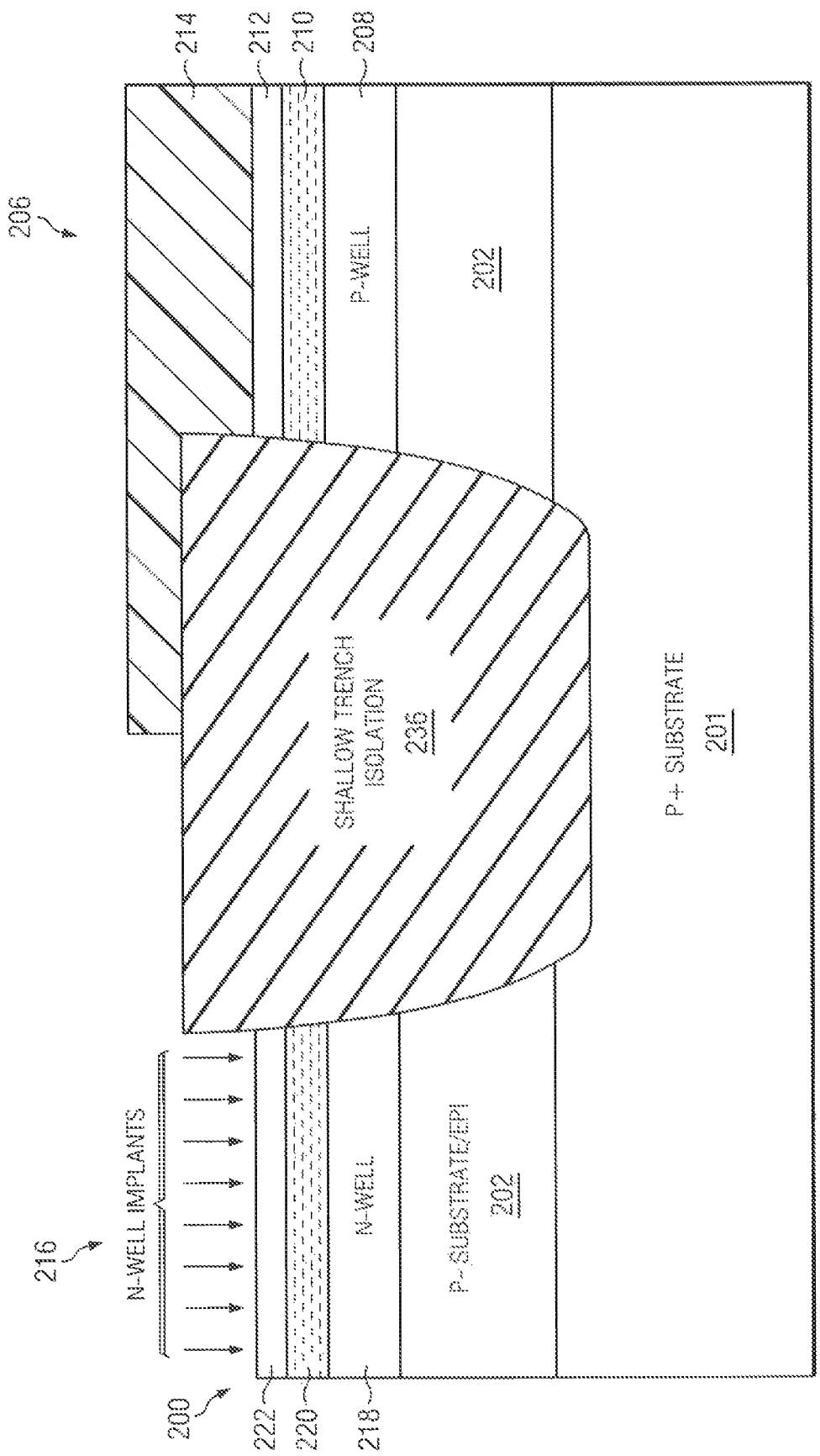

In FIG. 2F, photoresist layer 204 is removed and a new photoresist layer 214 is patterned to expose an area 216 for a second transistor element, in this instance a PMOS transistor. In FIG. 2G, ion implantation is performed to create a n-well region 218. Another ion implantation is performed to create a screening layer 220. Another ion implantation is performed to create a threshold voltage control layer 222. Alternatively, threshold voltage control layer 222 may be formed through diffusion from screening layer 220.

Figure 2H:
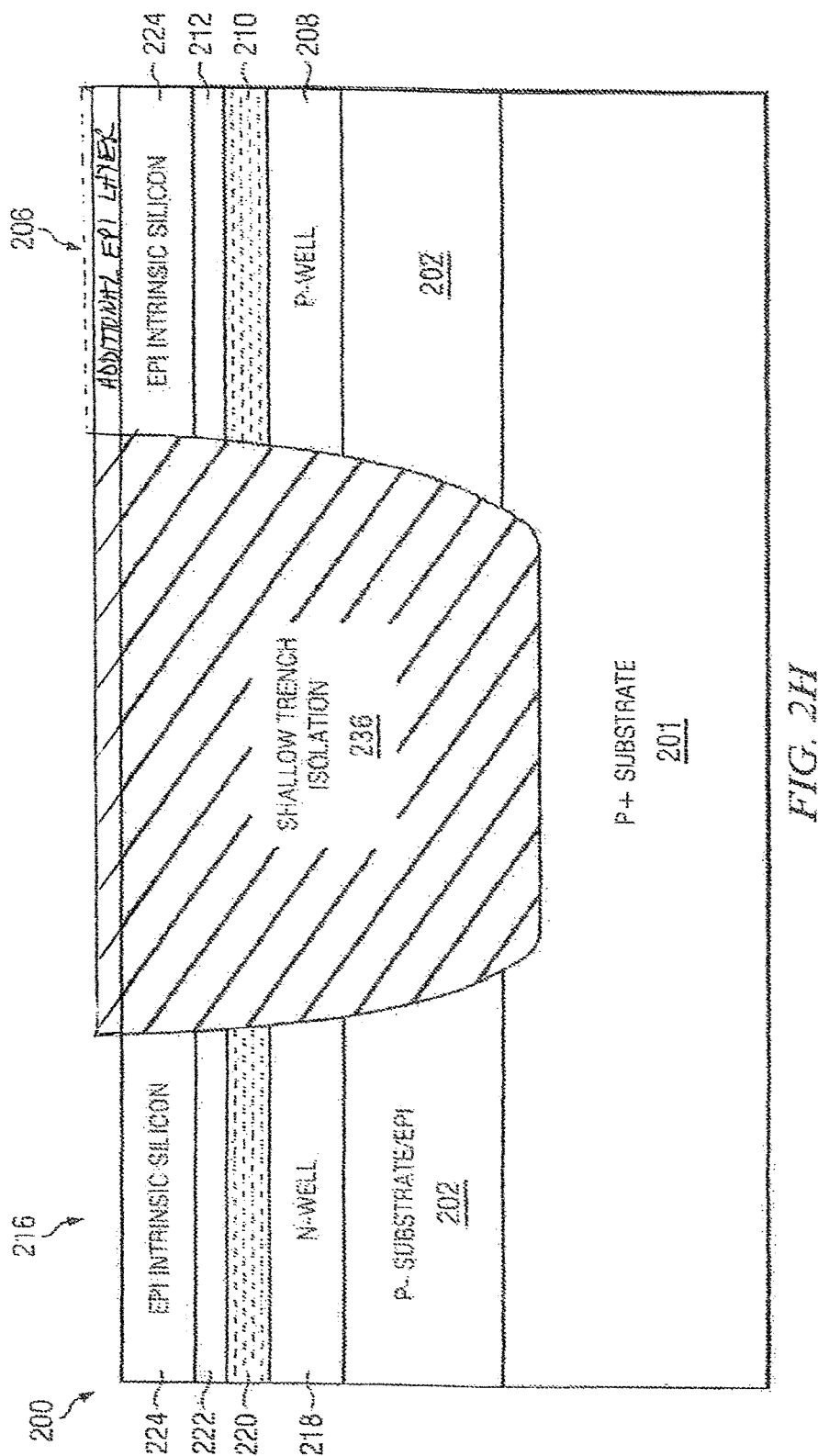

In FIG. 2H, photoresist layer 216 is removed and an epitaxial layer 224 of intrinsic silicon is grown across PMOS transistor 216 and NMOS transistor 206. The portion of epitaxial layer 224 formed over shallow trench isolation region 236 is then removed. Alternatively, individual epitaxial layers 224 may be separately grown for PMOS transistor 216 and NMOS transistor 206. In this manner, different thicknesses of epitaxial layers 224 may be formed between different transistor elements. In addition, a combination of a blanket epitaxial channel growth across all transistor elements (with removal over shallow trench isolation regions 236) with one thickness followed by selective additional growth to epitaxial layer 224 only for those transistor elements desired to have a thicker epitaxial layer 224 as compared to other transistor elements in structure 200 may optionally be performed to form transistor elements with different thicknesses in their respective epitaxial layer 224. As an example, a particular transistor element may have its channel layer start with an epitaxial growth of 25 nm in order to end up with a channel layer thickness of 10 nm after the fabrication process. Another transistor element may have its channel layer start with an epitaxial growth of greater thickness in order to achieve a greater final thickness after the completion of the fabrication process.

Figure 2I:
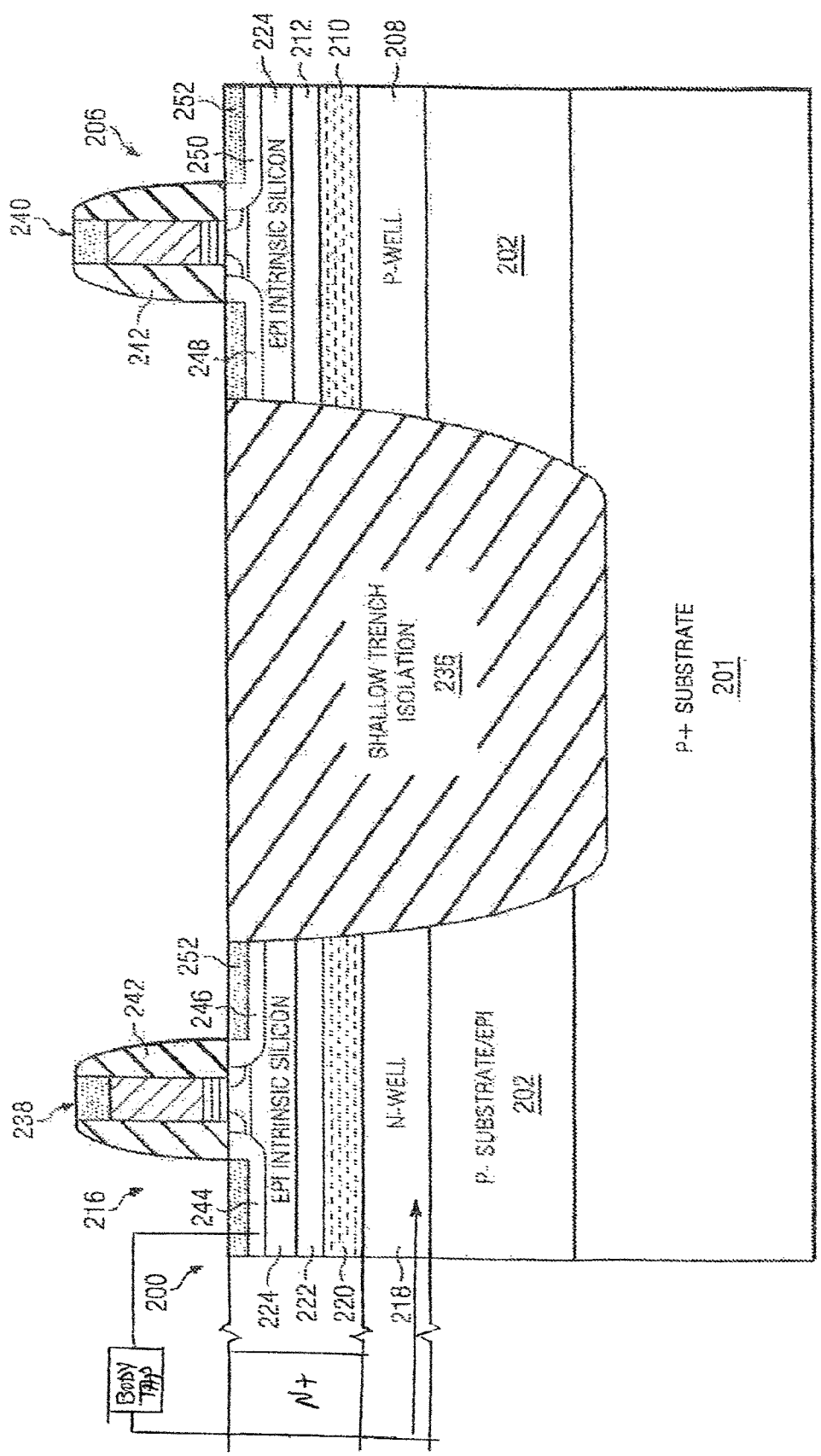

In FIG. 2I, PMOS transistor 216 and NMOS transistor 206 are completed using conventional gate stack 238 and 240 formation with spacers 242, source/drain formations (244, 246, 248, and 250), and silicide formation 252.

Figure 3A:
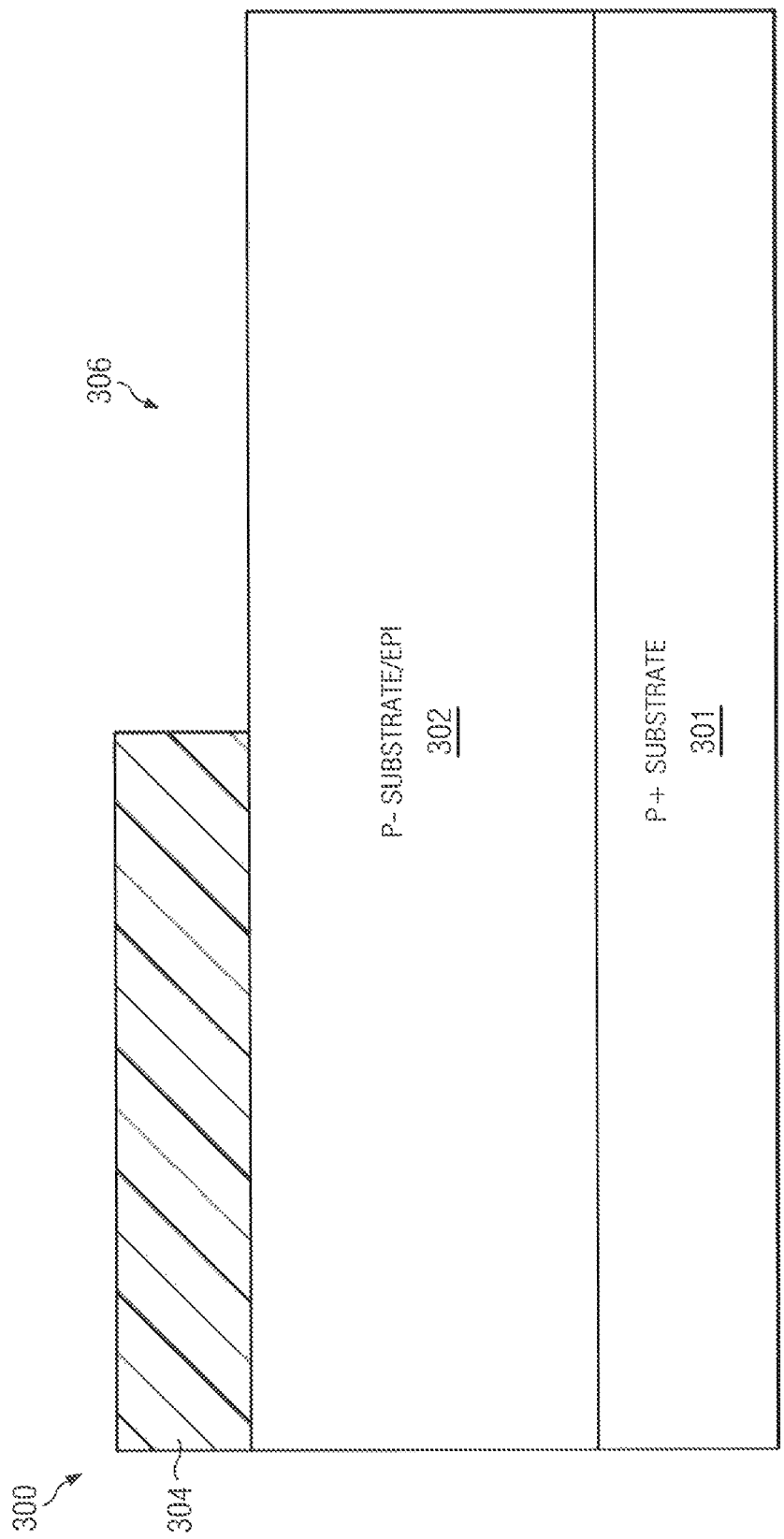
FIGS. 3A to 3I illustrate a fabrication process for a semiconductor structure with a channel stack using a multiple blanket epitaxial layer and shallow trench isolation last approach.
Figure 3B:
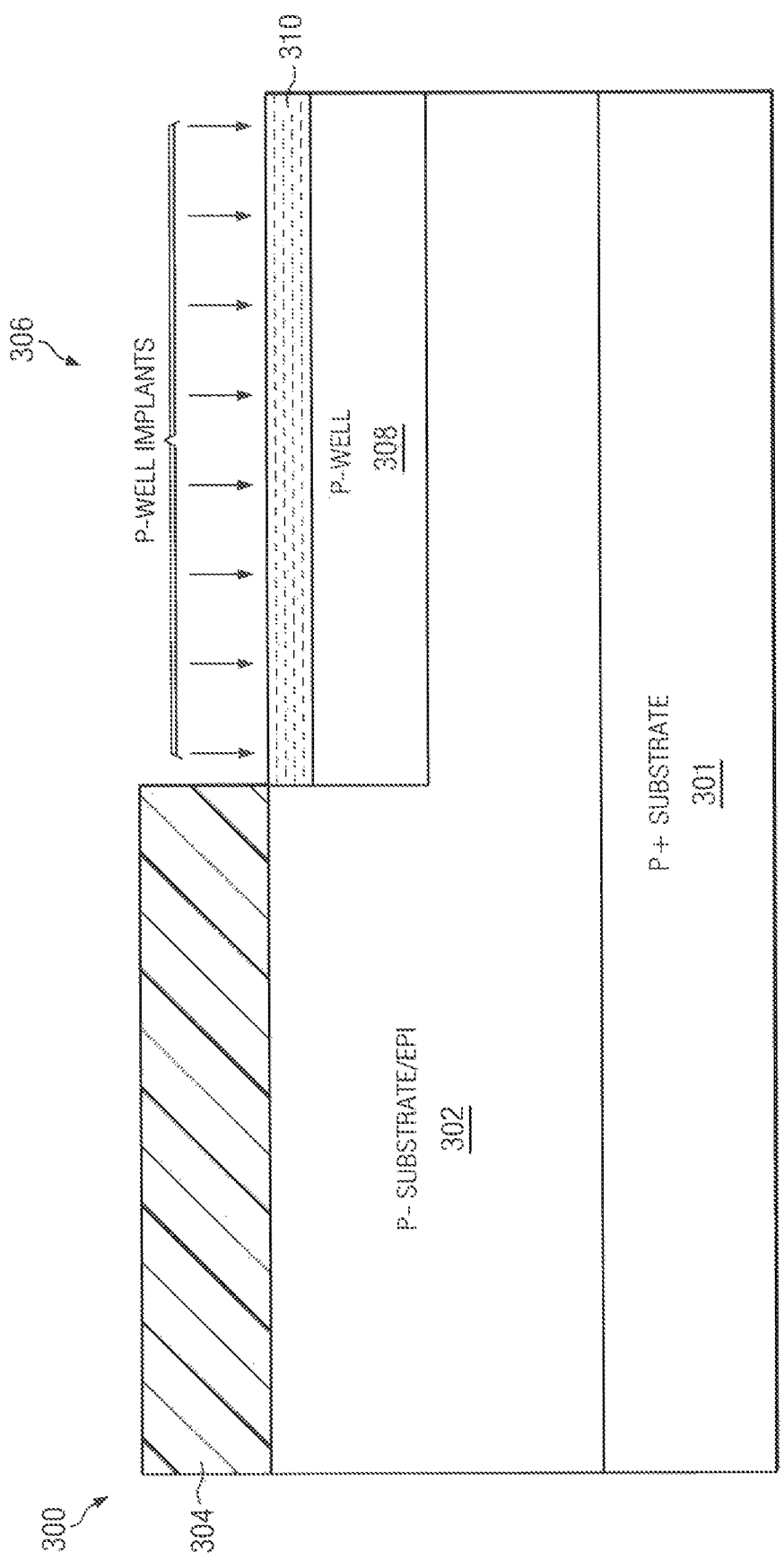

FIGS. 3A to 3I show a multiple blanket epitaxial layer and shallow trench isolation last approach for forming a structure 300 having transistor elements with the three layer channel stack to optimize overall transistor performance. The process begins in FIG. 3A with a P+ substrate 301 and a P− silicon epitaxy layer 302 formed thereon and used for structure 300. Initial patterning is performed by forming a photoresist mask 304 and etching away desired portions of the photoresist mask 304 to expose an area 306 for a first transistor element, in this instance a NMOS transistor. Optionally, a blanket screening layer (not shown) may be epitaxially grown or deposited on structure 300 prior to patterning of photoresist mask 304. In FIG. 3B, ion implantation is performed to create a p-well region 308. Another ion implantation is performed to create a screening layer 310, either in p-well region 308 or in the portion of the optional blanket epitaxial layer associated with NMOS transistor element 306.

Figure 3C:
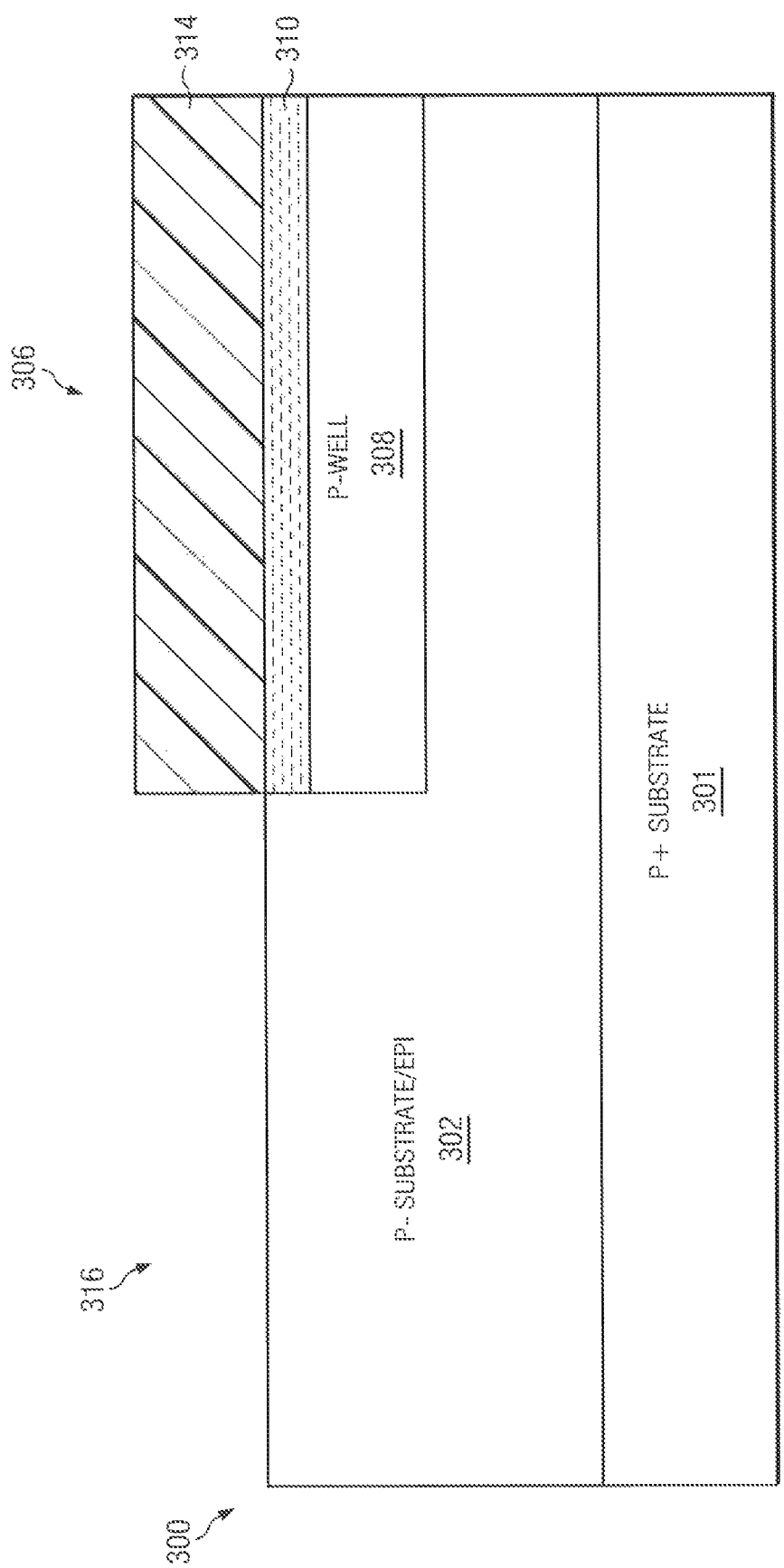
Figure 3D:
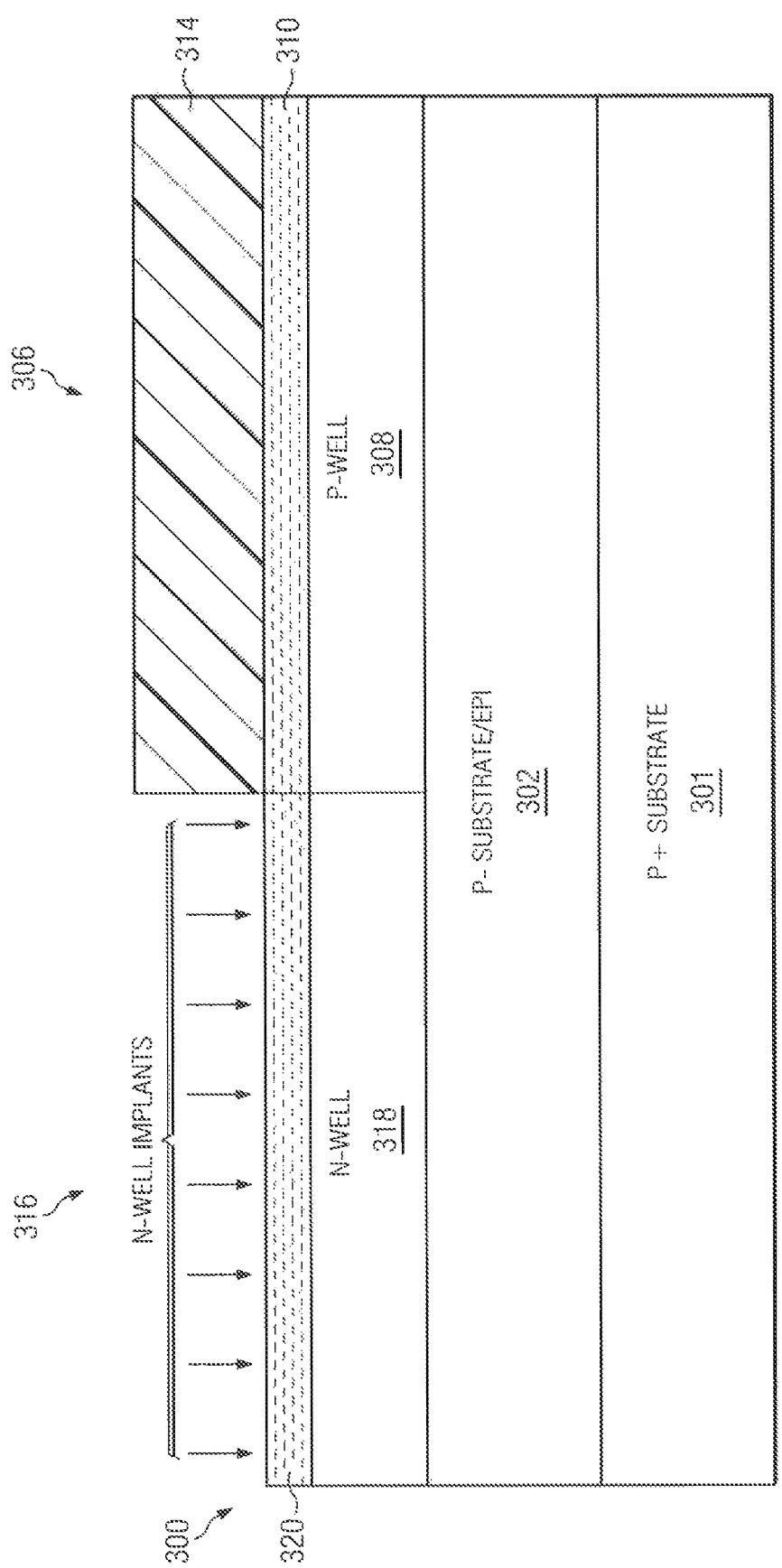

In FIG. 3C, photoresist layer 304 is removed and a new photoresist layer 314 is patterned to expose an area 316 for a second transistor element, in this instance a PMOS transistor. In FIG. 3D, ion implantation is performed to create a n-well region 318. Another ion implantation is performed to create a screening layer 320, either in n-well region 318 or in the portion of the optional blanket epitaxial layer associated with PMOS transistor element 316.

Figure 3E:
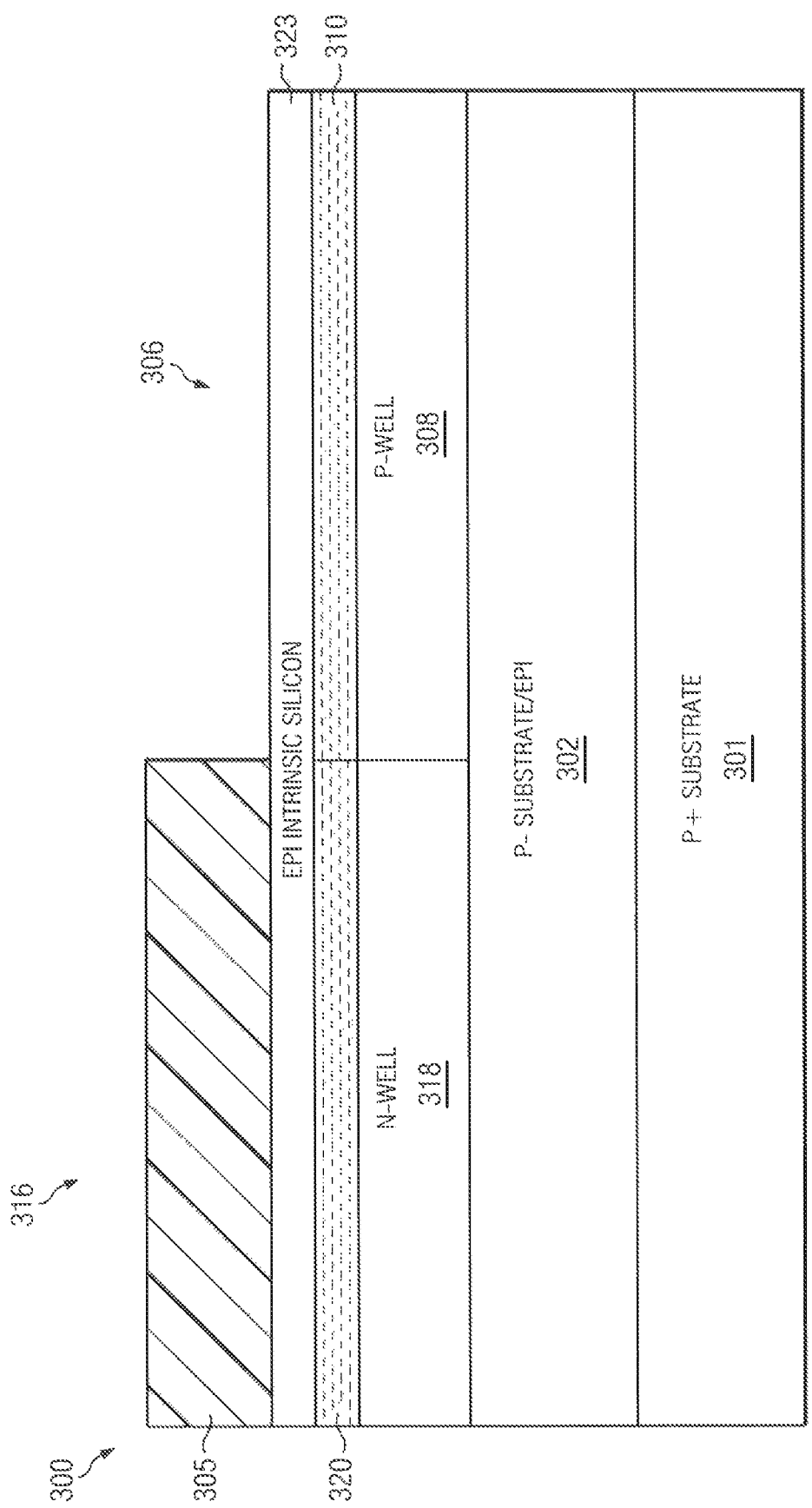
Figure 3F:
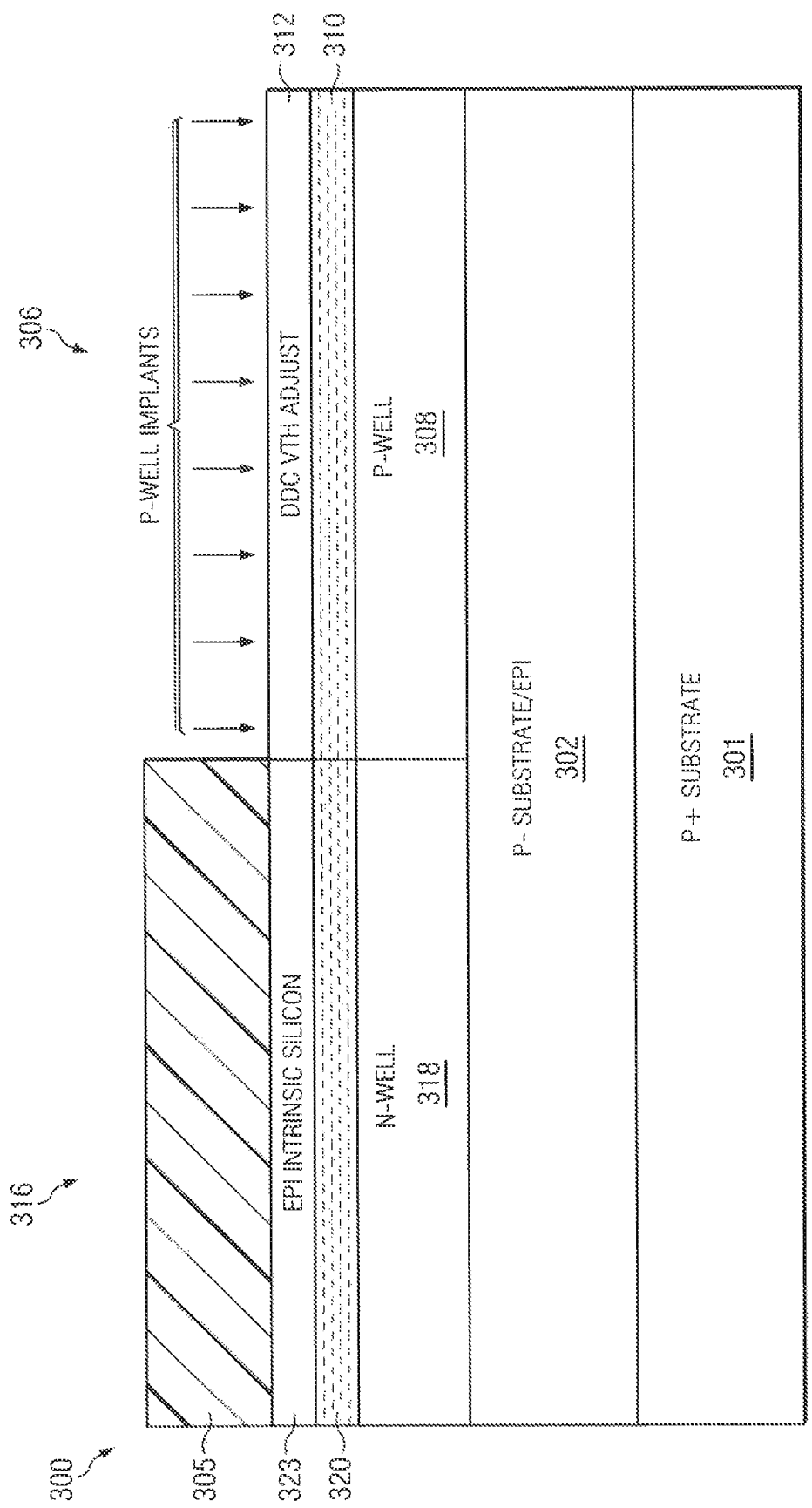

In FIG. 3E, photoresist layer 316 is removed and an epitaxial layer 323 of intrinsic silicon is grown across PMOS transistor 316 and NMOS transistor 306. Epitaxial layer 323 will become separate threshold voltage control layers 322 and 312 respectively for each of PMOS transistor 316 and NMOS transistor 306. A new photoresist layer 305 is patterned to expose NMOS transistor 306. In FIG. 3F, the exposed portion of epitaxial layer 323 is subjected to ion implantation to create threshold voltage control layer 312 for NMOS transistor 306.

Figure 3G:
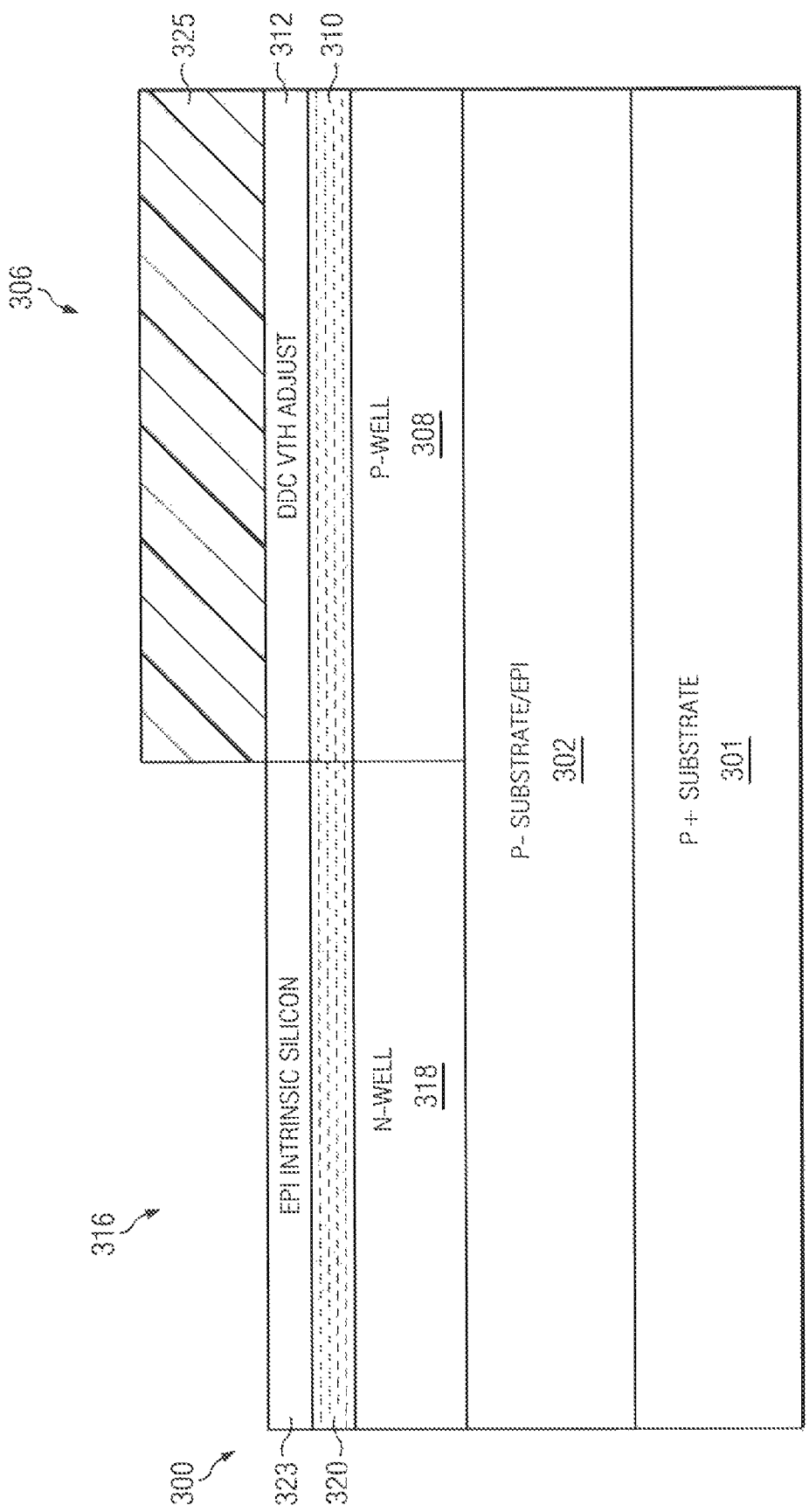
Figure 3H:
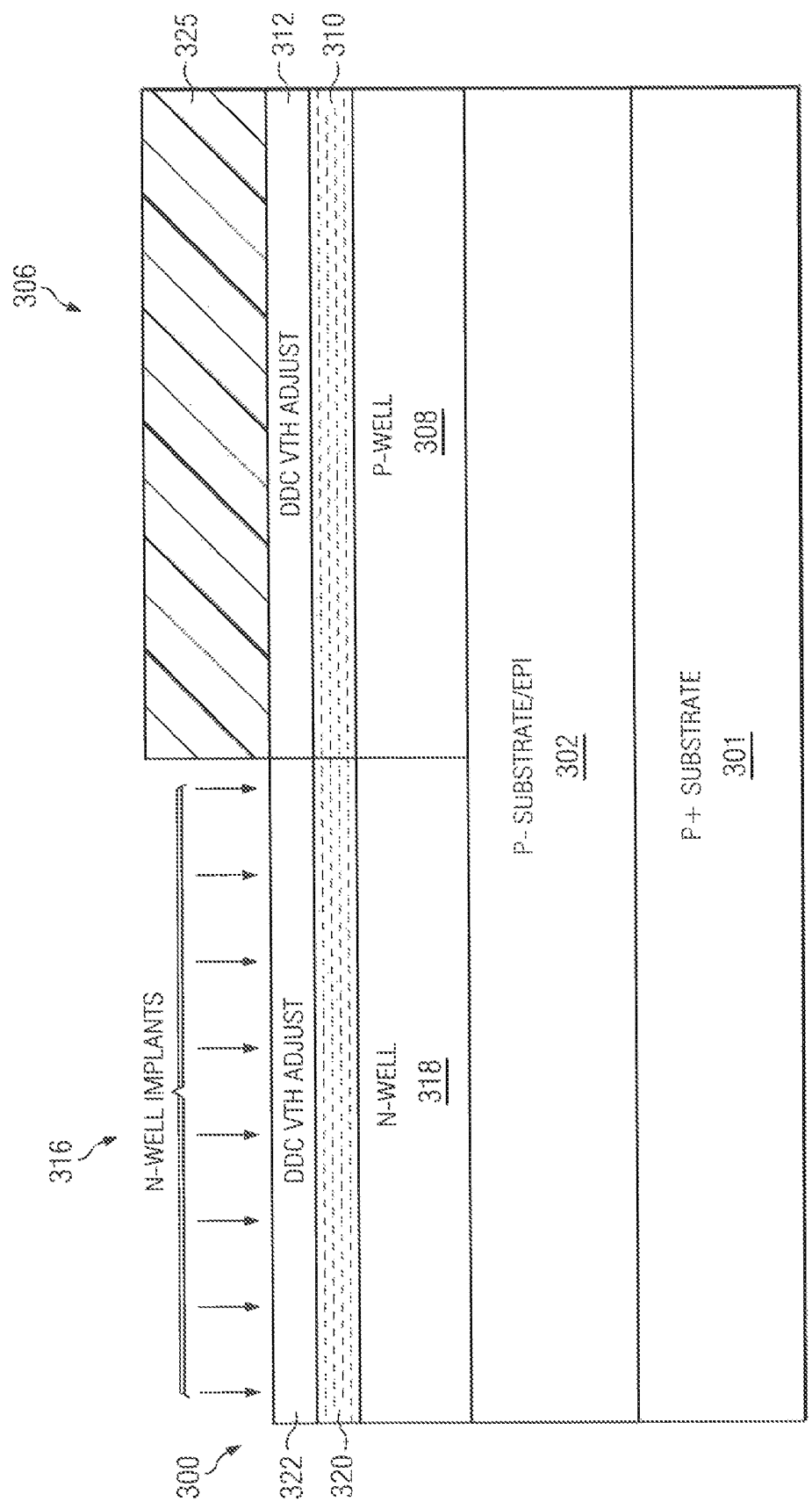

In FIG. 3G, photoresist layer 305 is removed and a new photoresist layer 325 is patterned to expose PMOS transistor element 316. In FIG. 3H, the exposed portion of epitaxial layer 323 is subjected to ion implantation to create threshold voltage control layer 322 for PMOS transistor 316.

Figure 3I:
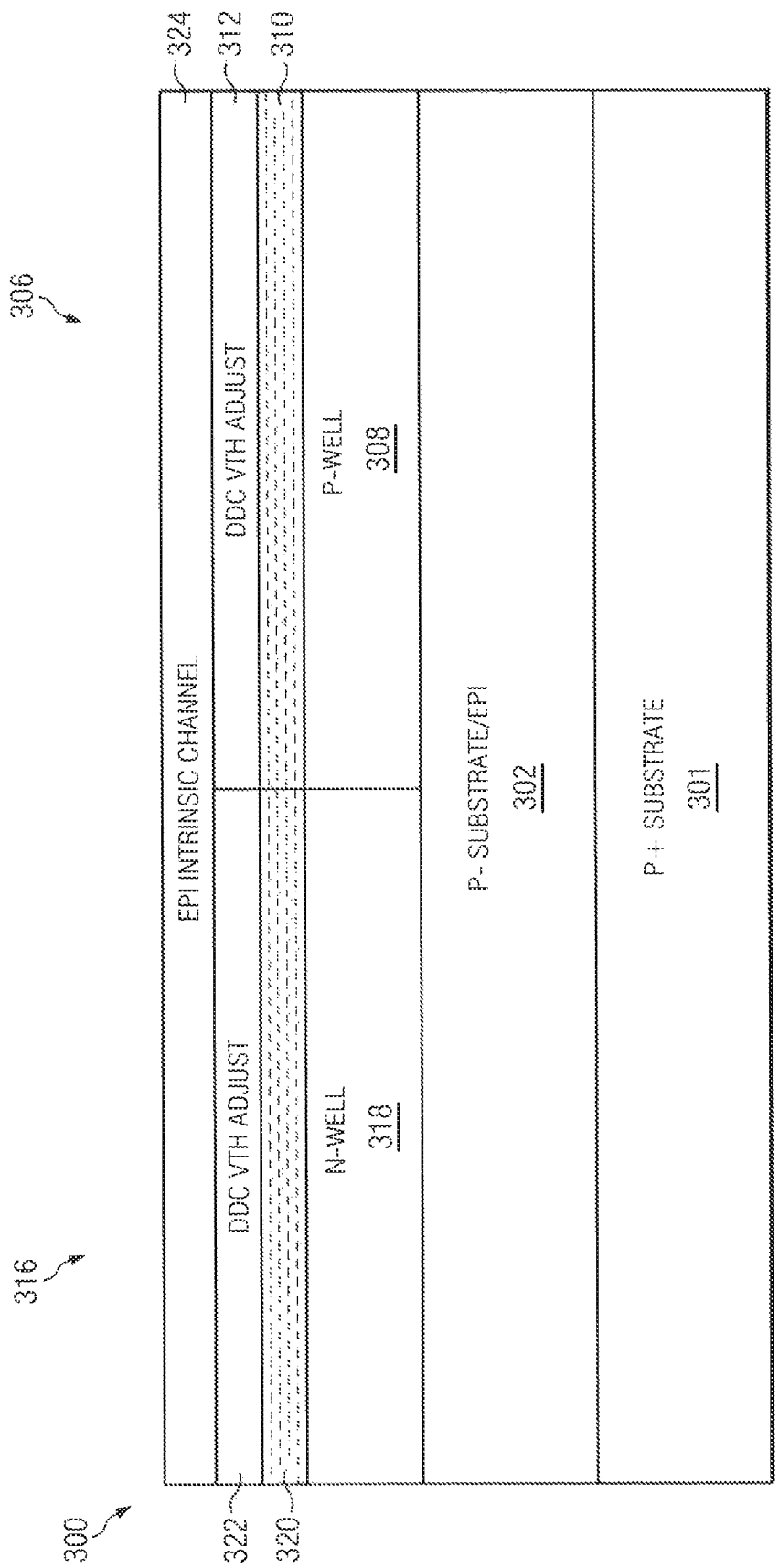

In FIG. 3I, photoresist layer 325 is removed and an epitaxial layer 324 of intrinsic silicon is grown across PMOS transistor element 116 and NMOS transistor element 106. Epitaxial layer 324 becomes the channel for each of PMOS transistor 316 and NMOS transistor 306. Isolation and further processing may be performed as shown and described above with respect to FIGS. 1F to 1K.

Though not shown, a shallow trench isolation first process may be performed on P+ substrate 301 and P− silicon epitaxy layer 302 similar to that shown and described above with respect to FIGS. 2A to 2D. Blanket epitaxial layers may then be formed as described above to subsequently establish the screening layers, threshold voltage control layers, and channel layers for PMOS transistor element 116 and NMOS transistor element 106. An extra step is required to remove any epitaxial layer formed on the isolation regions.

Formation of the screening layer and the threshold voltage control layer may be performed in different ways in each of the processes provided above. The screening layer may be formed through ion implantation into the p-well region, through in-situ deposition or growth of doped material, or through intrinsic silicon epitaxial growth followed by ion implantation. The threshold voltage control layer may be formed through in-situ deposition or growth of doped material or through intrinsic silicon epitaxial growth followed by ion implantation. The channel layer is formed through intrinsic silicon epitaxial growth.

Materials used for the screening layers for the PMOS transistor elements in each fabrication process may include arsenic, phosphorous, and/or antimony. When arsenic is used for the PMOS transistor elements, ion implantation of the arsenic is performed prior to epitaxial growth of the channel layer (and also prior to epitaxial growth of the threshold voltage control layer where this process step is performed). To prevent diffusion of screening layer material, a material that has a lower diffusion characteristic may be used. For a PMOS transistor element, antimony diffuses less than arsenic in the thermal cycles of the fabrication process. The use of antimony solves a problem of diffusion of the material in the screening layer into the epitaxial channel layer.

Figure 4:
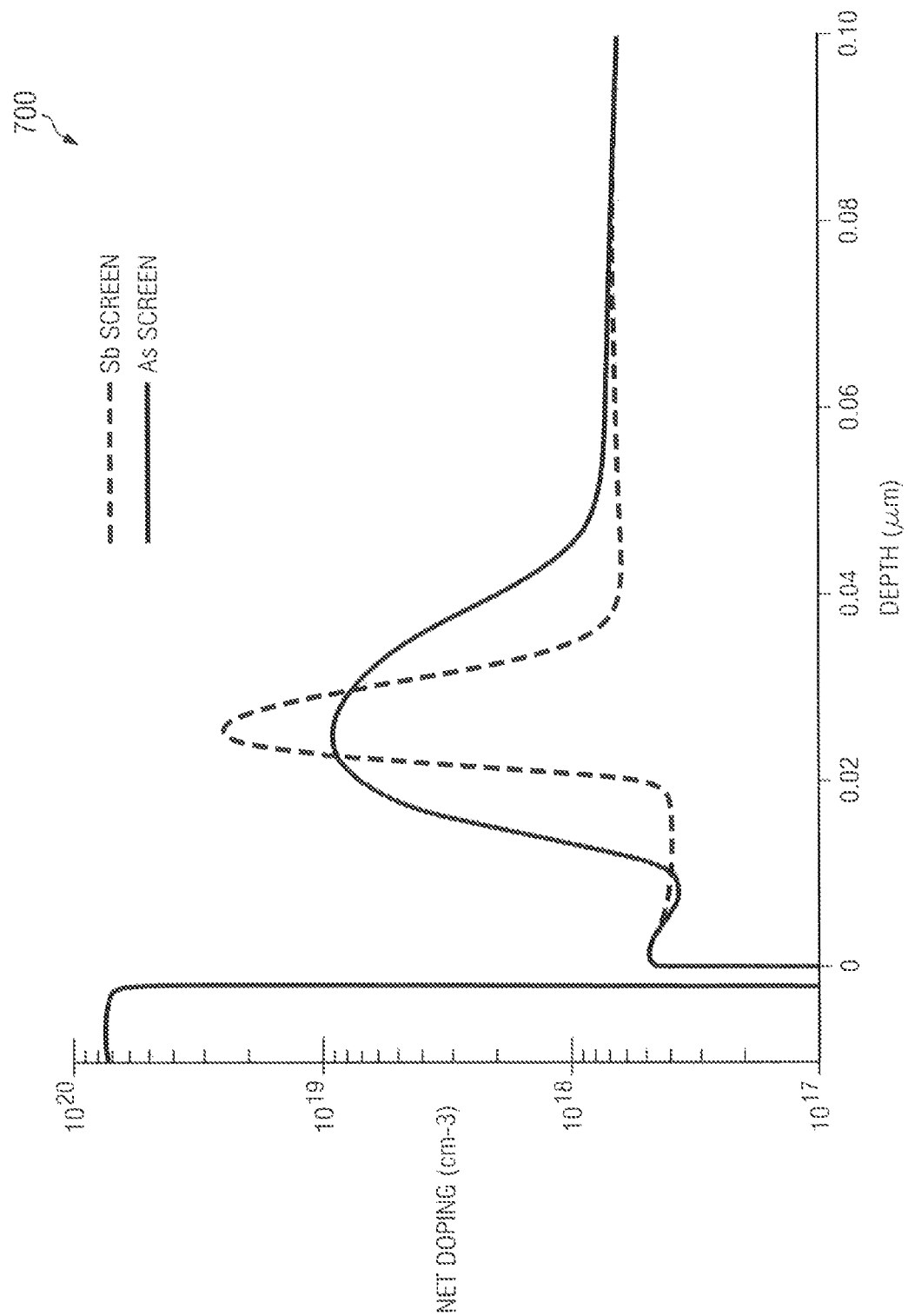
FIG. 4 illustrates a vertical doping profile of arsenic and antimony used in the screening layer of a transistor element.
Figure 5:
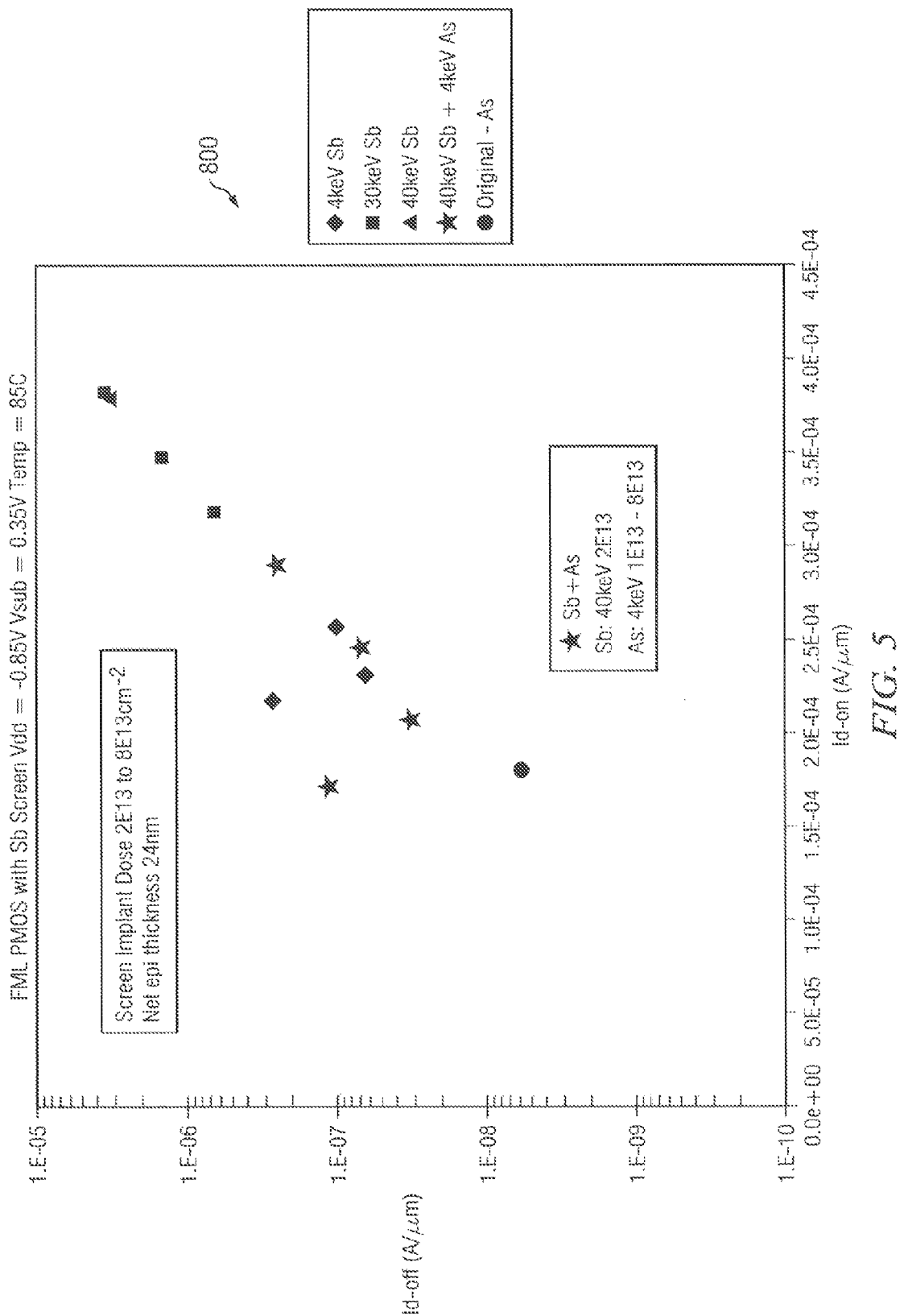
FIG. 5 illustrates a comparison graph of Id-off and Id-on for arsenic and antimony.

FIG. 4 shows a vertical doping profile 700 of arsenic and antimony. Because antimony has lower diffusion than arsenic, the screen doping profile is sharper with antimony as compared to arsenic at the same doping energy and dopant concentration. This sharper doping profile of antimony causes higher leakage currents (Id-off) than would be achieved with arsenic as the screen implant for the same epitaxial channel layer thickness. FIG. 5 shows a comparison graph 800 of Id-off and Id-on for arsenic and antimony. Arsenic provides a lower leakage current than antimony. Leakage current for antimony gets worse at higher implant energies. However, an improvement in leakage current is achieved by adding arsenic into the antimony implant.

Figure 6:
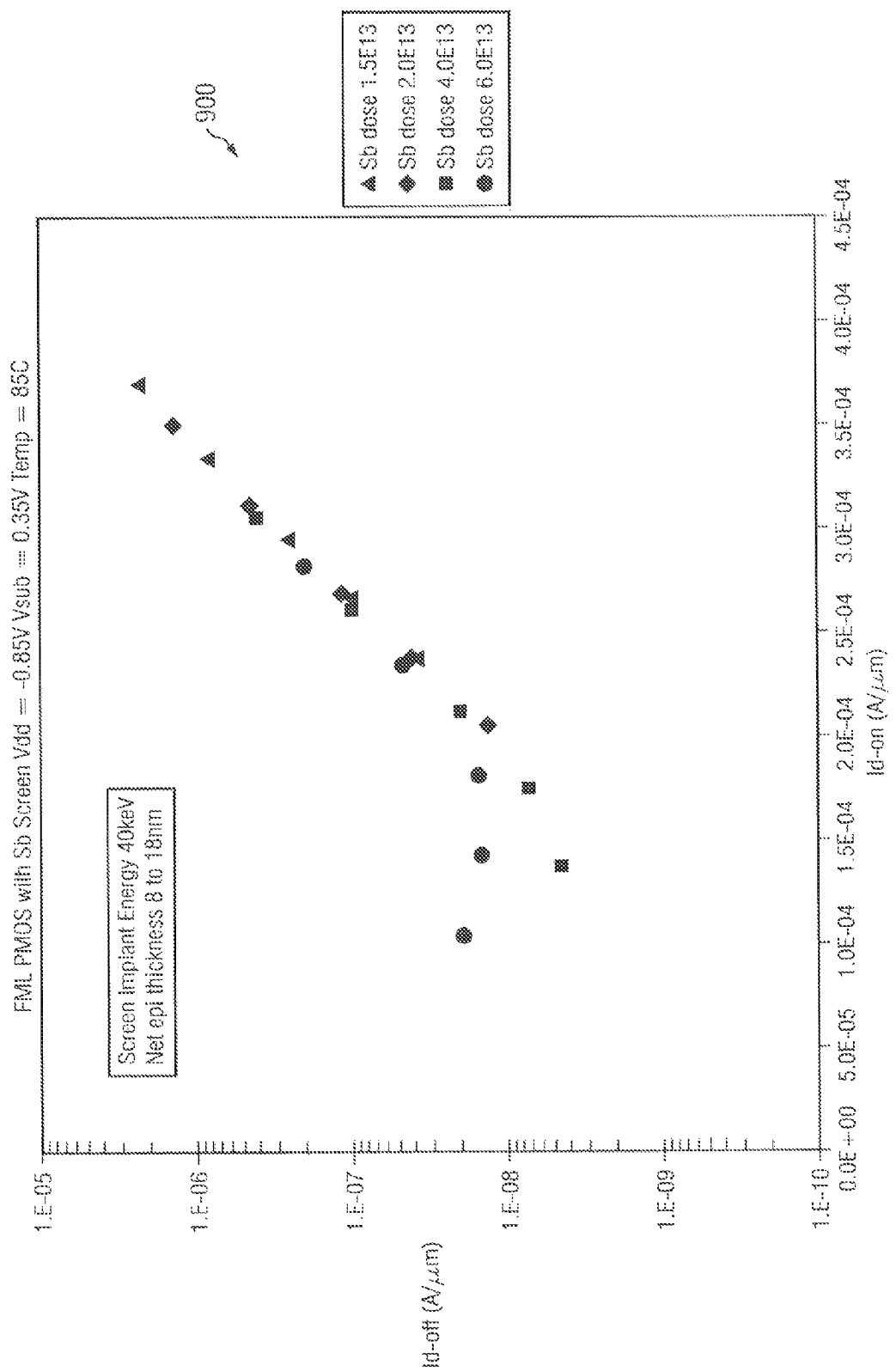
FIG. 6 illustrates a comparison graph of Id-off and Id-on for antimony in the screening layer of a transistor element at different dopant concentrations and various thicknesses of the epitaxial channel layer.

Another manner in which the leakage current for antimony can be reduced is to decrease the thickness or otherwise have a smaller thickness for the epitaxial channel layer of the PMOS transistor element as compared to the NMOS transistor element. FIG. 6 shows a comparison graph 900 of Id-off and Id-on for antimony at different dopant concentrations and various thicknesses of the epitaxial channel layer. In general, as the thickness of the epitaxial channel layer varies from thinnest to thickest, the leakage current using the antimony implant increases from a relative lower level to a relative higher level. Thus, a reduction in epitaxial channel layer thickness causes a reduction in leakage current for a transistor element using an antimony screen implant.

Figure 7:
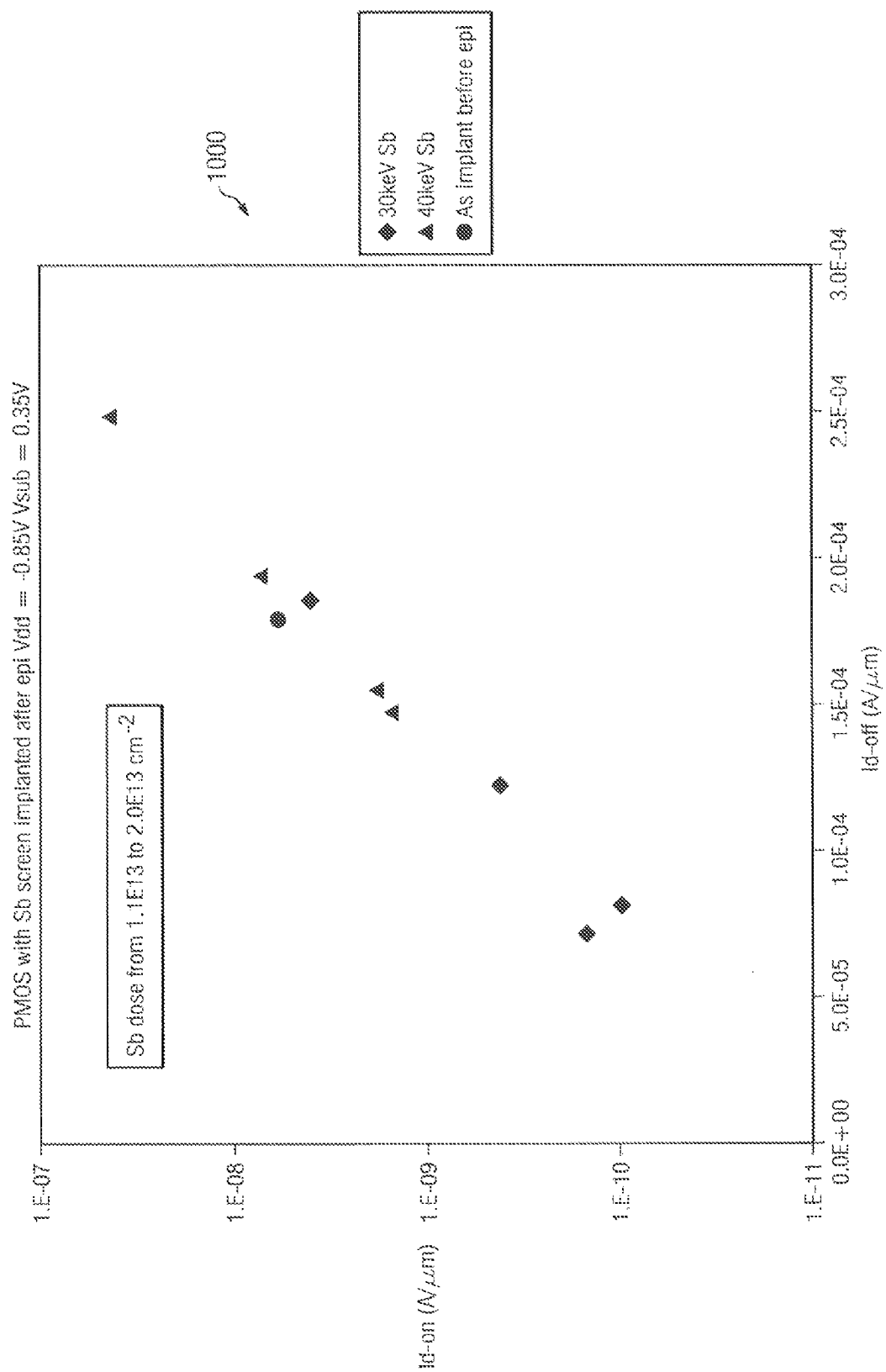
FIG. 7 shows a comparison graph of Id-off and Id-on for antimony used in the screening layer of a transistor element at different dopant concentrations implanted after epitaxial growth of the channel layer.

Reduction in epitaxial channel layer thickness, though achievable, may be costly to implement into the fabrication process. Though techniques have been discussed above that provide an ability to obtain differing epitaxial channel layer thicknesses, such techniques still result in additional steps being performed in the fabrication process. A technique to avoid reducing the thickness of the epitaxial channel layer for an antimony screen implant is to implant the antimony screen after the epitaxial channel layer for the PMOS transistor element is grown. The reduced straggle and diffusion of antimony compared to arsenic makes it possible to achieve an acceptable doping profile using this implant after epi technique. This technique can be integrated into a full CMOS process and the processes discussed above by implanting or otherwise forming the screening layer for the NMOS transistor element before epitaxial growth of the channel layer, forming the channel layer through intrinsic silicon epitaxial growth, and then implanting the screening layer for the PMOS transistor element through the epitaxial channel layer. FIG. 7 shows a comparison graph 1000 of Id-off and Id-on for antimony at different dopant concentrations implanted after epitaxial growth of the channel layer. As can be seen, a reduction in leakage current is obtained through this process as compared to arsenic implanted before formation of the epitaxial channel layer. With sufficiently high implant energy, the antimony peak can be located from 10 to 30 nm below the surface of the epitaxial channel layer when antimony is implanted after epitaxial channel layer formation. Better results were obtained when using a dopant concentration of 2e13 atoms/cm$^2$ or less than with higher dopant concentrations for antimony implanted through the epitaxial channel layer.

Another alternative process is to use a dual implant with antimony and a faster diffusing n-type dopant such as arsenic, both done before the deposition or other formation of the epitaxial channel layer. Diffusion of the arsenic into the threshold voltage control layer will increase the threshold voltage and decrease the leakage current as compared to an only. The arsenic implant energy would typically be the same as or less than the antimony implant energy. The dopant concentration of the arsenic may be chosen to give a doping profile peak concentration the same as or less than that of the antimony dopant concentration. Though disclosed as an antimony screening layer and an arsenic threshold voltage control layer, it may be desirable to have an arsenic screening layer and an antimony threshold voltage control layer.

It may be useful to perform an anneal step following the antimony implant to improve the activation of the antimony dopant. This anneal step would typically be in the range of 950° C. to 1050° C. with a duration from several milliseconds to several seconds. It may also be useful to perform an anneal step following the arsenic implant before formation of the epitaxial channel layer. This anneal step would typically be in the range of 800° C. to 1000° C. with a duration from several milliseconds to several seconds.

Figure 11:
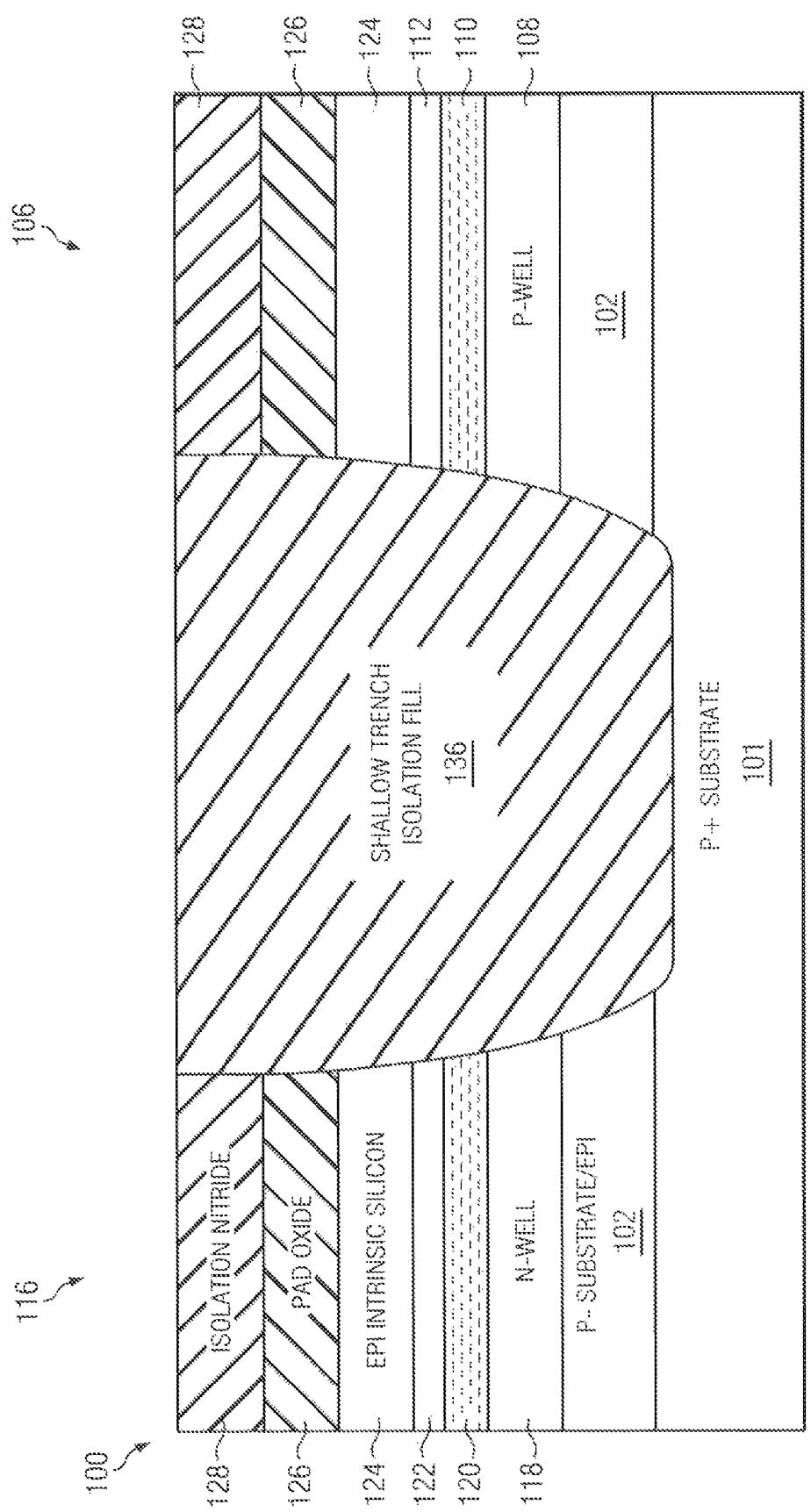
FIG. 11 shows a simulated doping profile with the same conditions of FIG. 9 but with a higher energy arsenic implant of 10 keV at an anneal temperature of 800° C.
Figure 8:
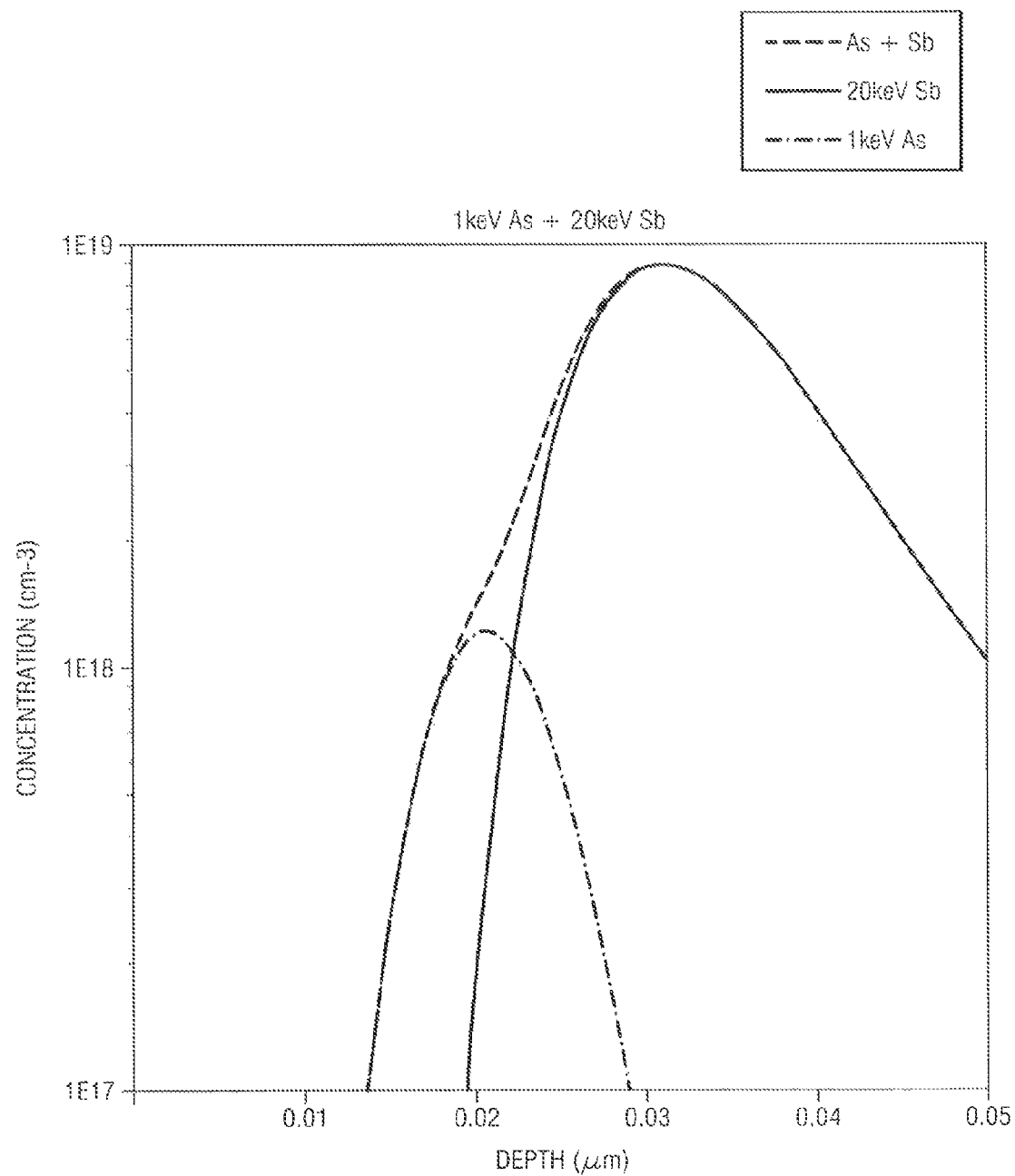
FIG. 8 shows a simulated doping profile where antimony and arsenic are implanted to establish the screening layer and the threshold voltage control layer.
Figure 9:
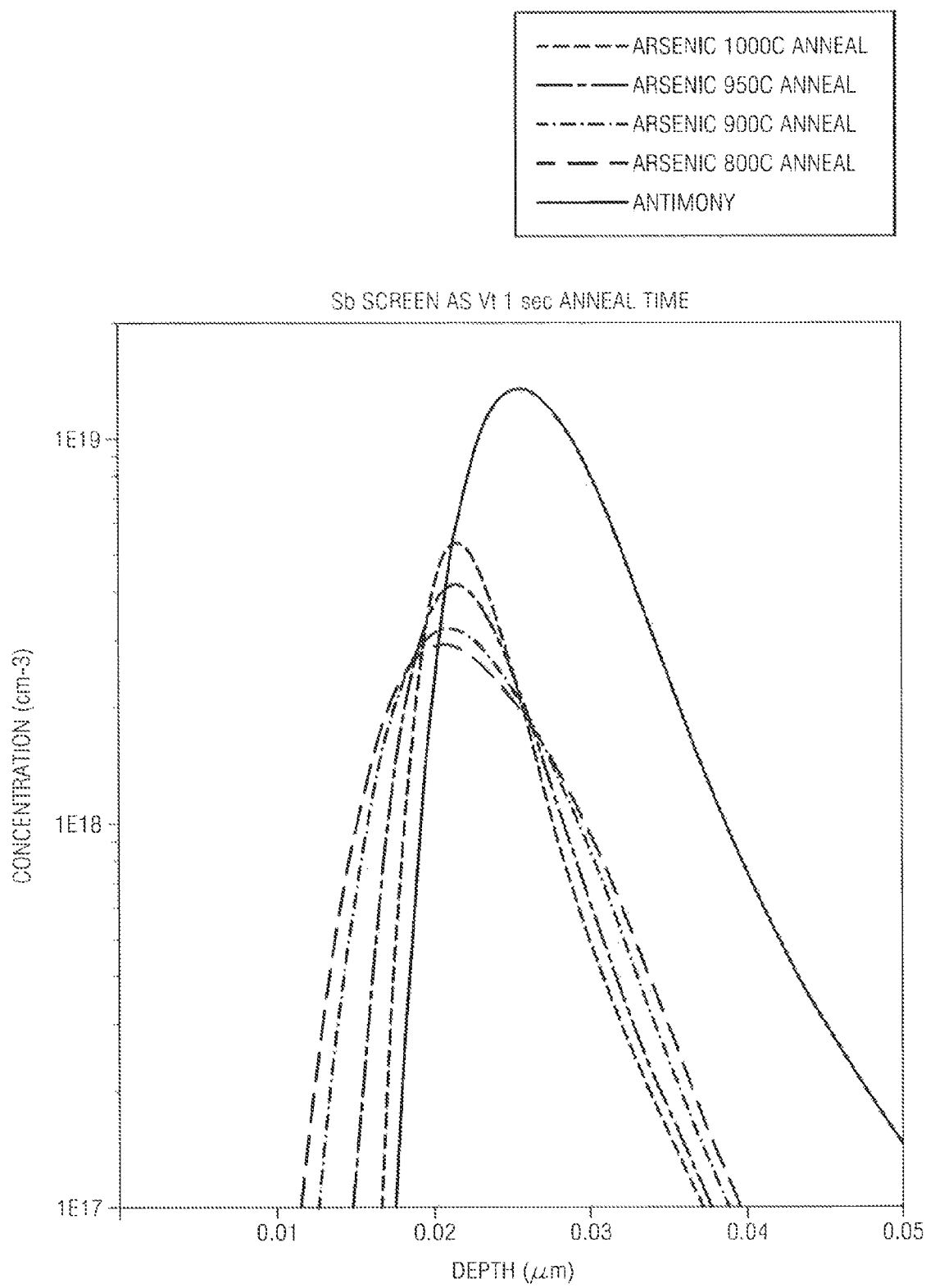
FIG. 9 shows a simulated doping profile where antimony and arsenic are implanted prior to epitaxial channel layer formation at various anneal temperatures.
Figure 10:
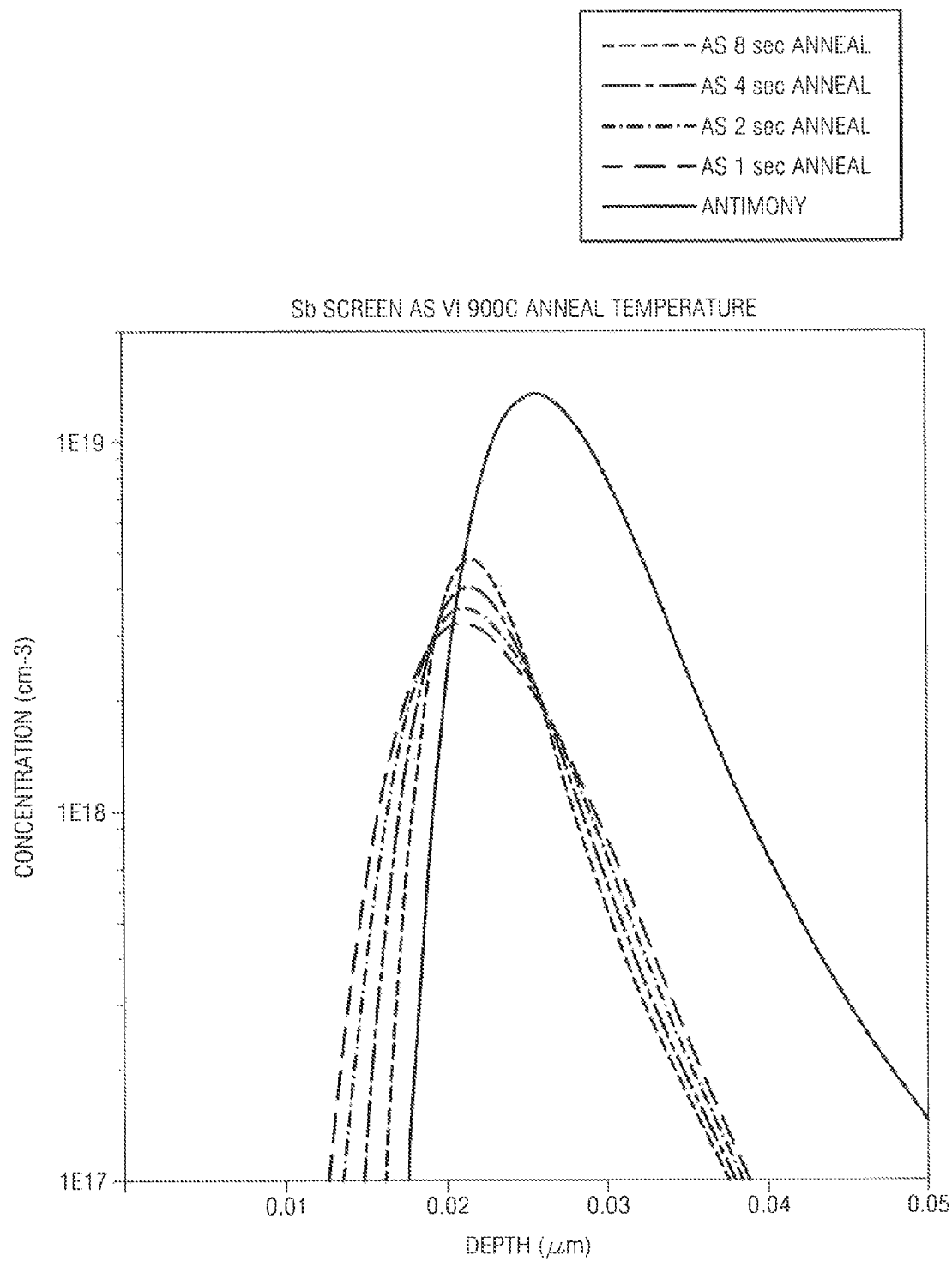
FIG. 10 shows a similar doping profile of FIG. 9 where the anneal temperature is a constant 900° C. but with various anneal times.
Figure 11:
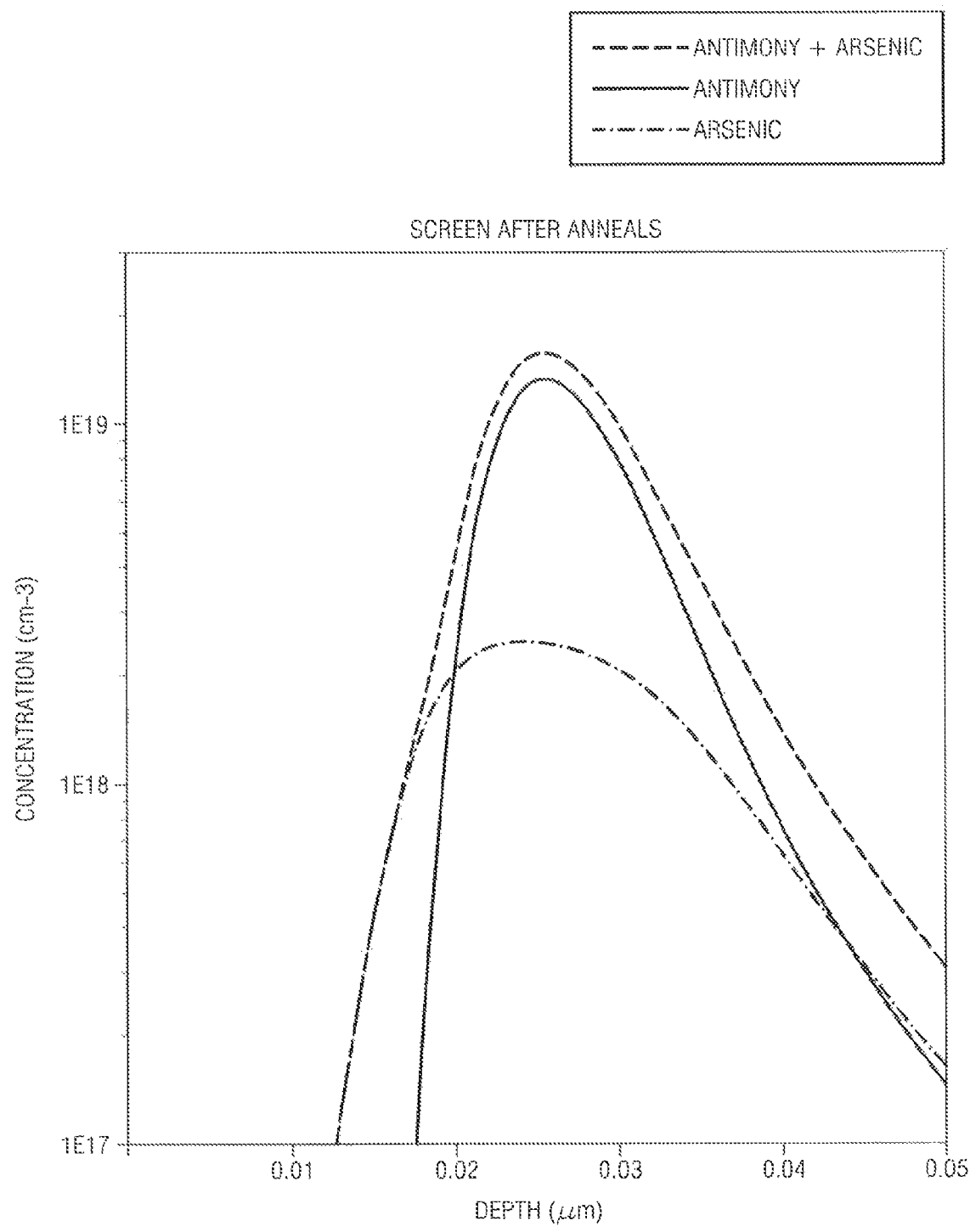
Figure 12:
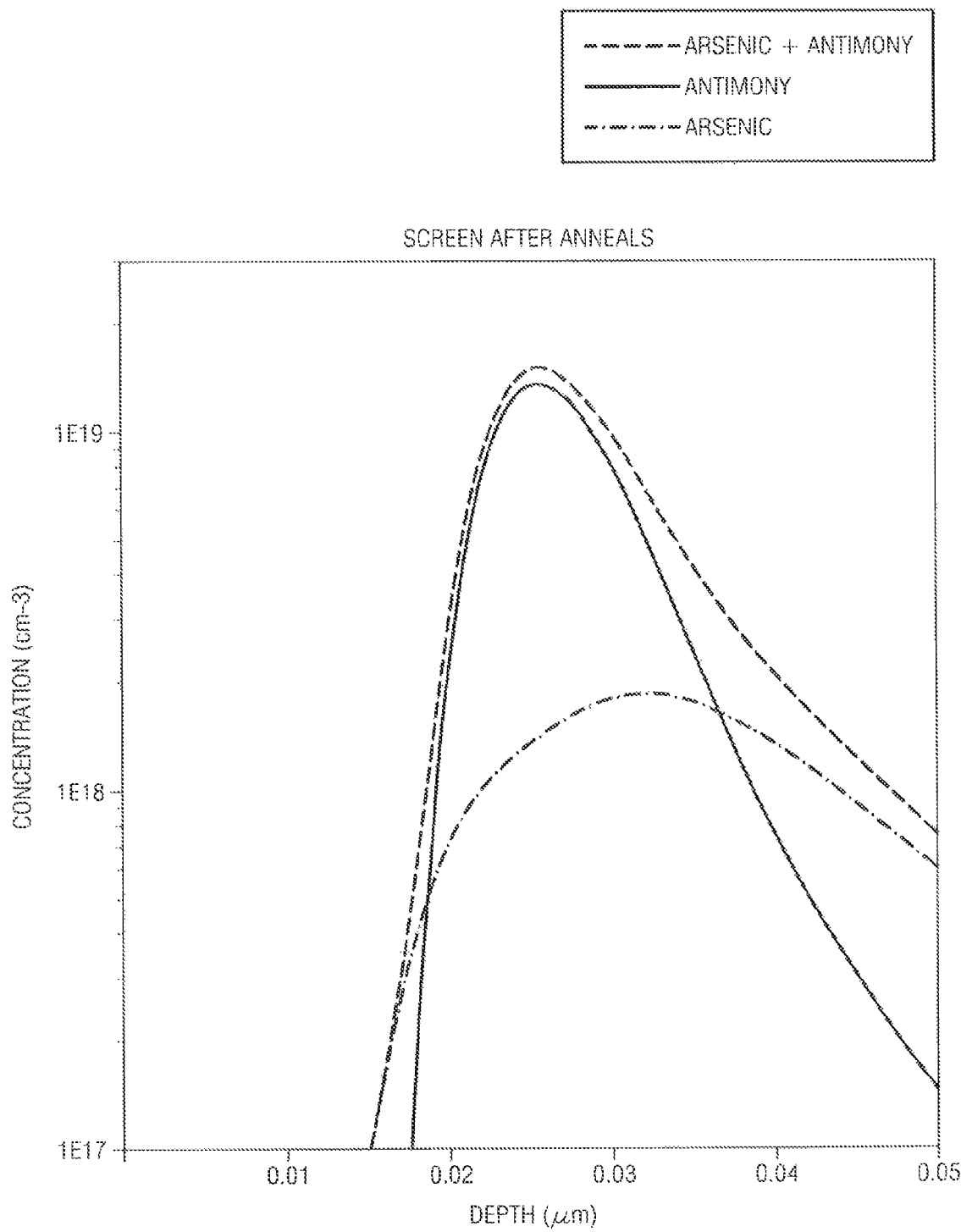
FIG. 12 is a similar doping profile of FIG. 11 but with an arsenic implant energy higher than the antimony implant energy.

FIG. 8 shows a simulated doping profile where antimony is implanted at an energy of 20 keV with a dopant concentration of 1.5e13 atoms/cm$^2$, arsenic is implanted at an energy of 1 keV with a dopant concentration of 5e12 atoms/cm$^2$ and an anneal is performed at a temperature of 800° C. for a duration of one second. The dashed line shows the combined arsenic—antimony implant. FIG. 9 shows a simulated doping profile where antimony is implanted at an energy of 10 keV with a doping concentration of 1.5e13 atoms/cm$^2$ to establish the screening layer, arsenic is implanted at an energy of 4 keV with a doping concentration of 5e12 atoms/cm$^2$ to establish the threshold voltage control layer, and a constant anneal time of one second for anneal temperatures from 800° C. to 1000° C. FIG. 10 shows a similar doping profile where the anneal temperature is a constant 900° C. but with various anneal times. FIG. 11 shows a simulated doping profile with the same conditions of FIG. 9 but with a higher energy arsenic implant of 10 keV at an anneal temperature of 800° C. FIG. 12 is a similar doping profile but with an arsenic implant energy of 20 keV, higher than the antimony implant energy of 10 keV. The dashed lines show the profile for the combined implant.

The antimony profile is essentially unchanged by the anneals. The arsenic anneal has the effect of reducing arsenic diffusion into the subsequently formed epitaxial channel layer. Higher anneal temperatures and longer anneal durations are more effective in suppressing arsenic diffusion into the epitaxial channel layer while lower anneal temperatures and shorter anneal durations allow more diffusion. Thus, the anneal temperature and time can be used to set the threshold voltage by controlling the diffusion of arsenic. This arsenic anneal step can be done in conjunction with the antimony anneal step or as a single anneal without an antimony anneal. The epitaxial channel layer may then be deposited after the anneal.

Figure 13:
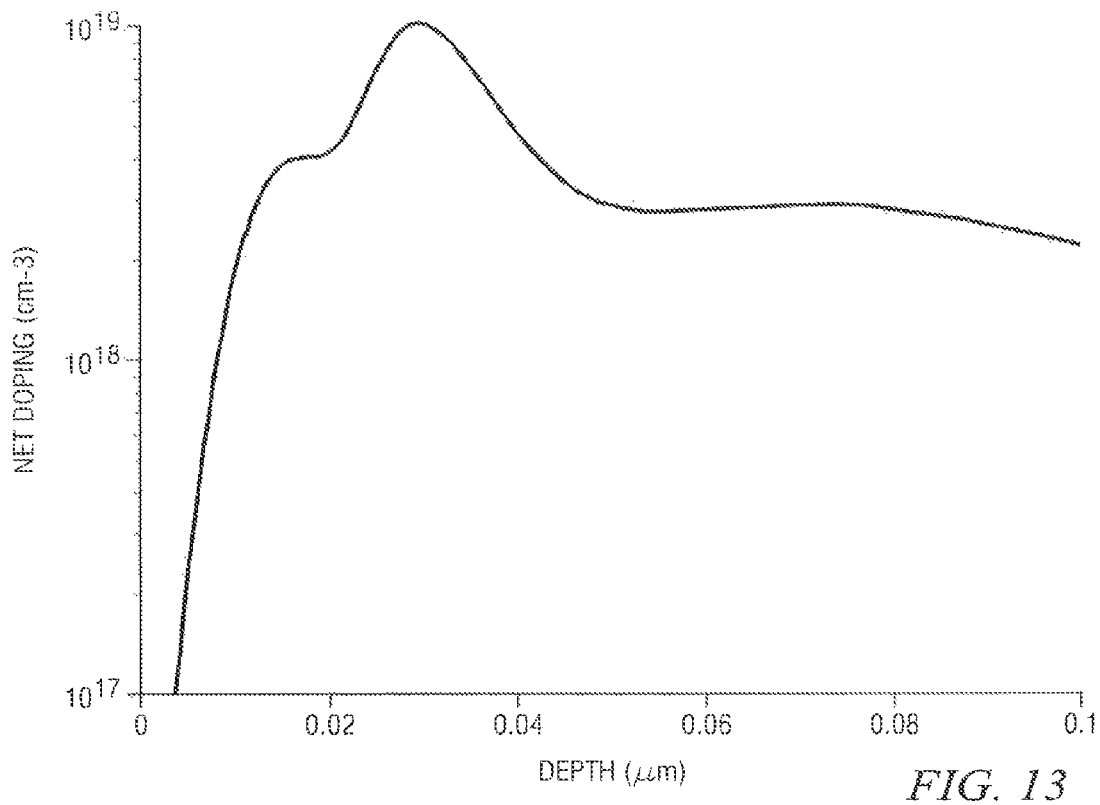
FIG. 13 shows a simulated doping profile where antimony is implanted before deposition of the epitaxial channel layer followed by a second antimony implant after deposition of the epitaxial channel layer.
Figure 14:
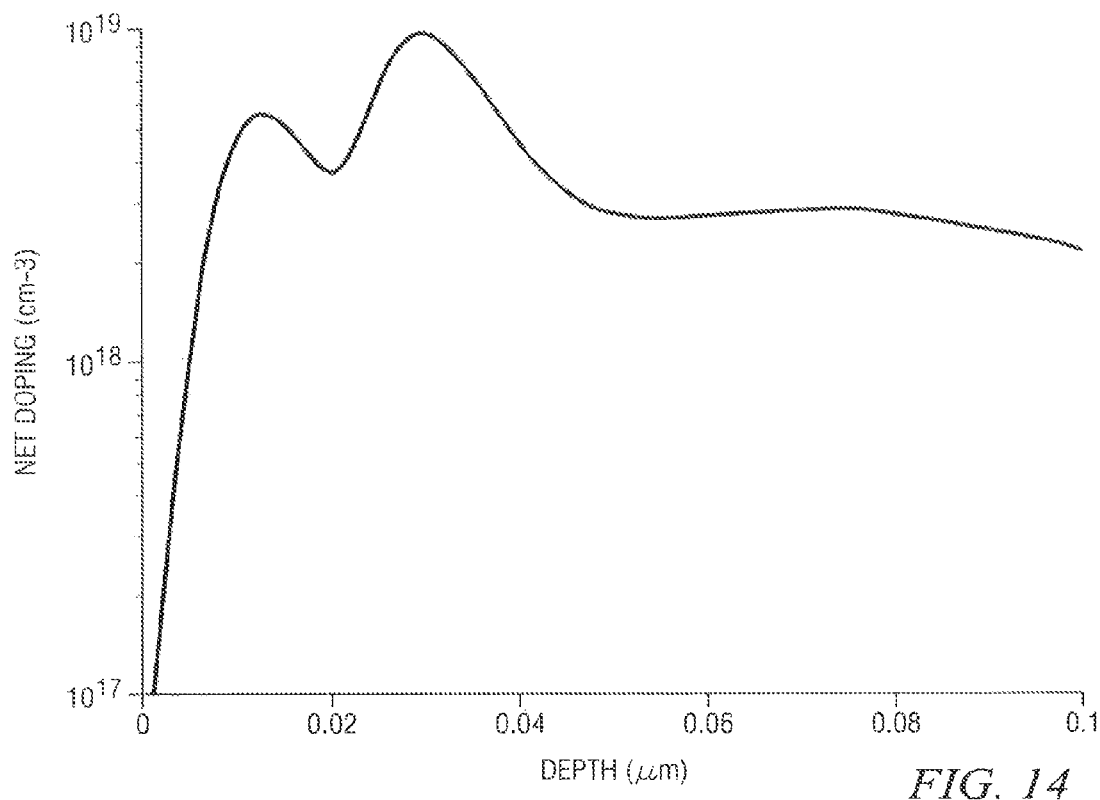
FIG. 14 shows a similar doping profile of FIG. 13 but with the second antimony implant being at a lower energy.

Another alternative process is to implant or otherwise form the screening layer with antimony prior to formation of the epitaxial channel layer and then implant antimony following formation of the epitaxial channel layer. This process can be performed to adjust the threshold voltage of the PMOS transistor element. FIG. 13 shows a simulated doping profile where antimony is implanted with an energy of 20 keV at a doping concentration of 1.5e13 atoms/cm$^2$ before deposition of the epitaxial channel layer followed by an antimony implant with an energy of 30 keV at a doping concentration of 1.0e13 atoms/cm$^2$ after deposition of a 20 nm epitaxial channel layer. FIG. 14 shows a similar doping profile but with the second antimony implant being at an energy of 20 keV. It may be possible to implant arsenic after the formation of the epitaxial channel layer instead of antimony, though the sharp doping profile of antimony is better for this technique.

The epitaxial thickness of 20 nm used in FIGS. 8 through 14 is for illustrative purposes. The thickness of the epitaxial layer may be more or less than 20 nm, as required for device performance in a particular case.

Although the present disclosure has been described in detail with reference to a particular embodiment, it should be understood that various other changes, substitutions, and alterations may be made hereto without departing from the spirit and scope of the appended claims. For example, though not shown, a body tap to the well regions of the transistor elements may be formed in order to provide further control of threshold voltage.

Although the present disclosure includes a description with reference to a specific ordering of processes, other process sequencing may be followed and other incidental process steps may be performed to achieve the end result discussed herein. Moreover, process steps shown in one set of figures may also be incorporated into another set of figures as desired.

Numerous other changes, substitutions, variations, alterations, and modifications may be ascertained by those skilled in the art and it is intended that the present disclosure encompass all such changes, substitutions, variations, alterations, and modifications as falling within the spirit and scope of the appended claims. Moreover, the present disclosure is not intended to be limited in any way by any statement in the specification that is not otherwise reflected in the appended claims.

What is claimed is:
1. A transistor structure with a channel stack, the transistor structure having a semiconductor substrate with a plurality of pre-formed doped wells formed therein, comprising:
   a first region having:
      a first doped well providing a foundation for a PMOS transistor element;

a first doped screening layer implanted in the semiconductor substrate in contact with the first doped well;

a first doped threshold voltage control layer in contact with the first doped screening layer;

a second region having:

a second doped well providing a foundation for an NMOS transistor element;

a second doped screening layer implanted in the semiconductor substrate in contact with the second well;

a second doped threshold voltage control layer in contact with the second doped screening layer; and a third layer formed from undoped epitaxial blanket deposition on the semiconductor substrate, separate from and on top of the first and second doped threshold voltage control layers, the third undoped epitaxial layer allowing establishment of an intrinsic channel for each of the PMOS and NMOS transistor elements;

a fourth layer formed from undoped epitaxial blanket deposition on the third layer for only one of the PMOS and NMOS transistor elements so that one of the PMOS and NMOS transistor elements has an overall undoped epitaxial intrinsic channel layer thickness greater than the other one of the PMOS and NMOS transistor elements.

2. The transistor structure of claim 1, wherein the first doped threshold voltage control layer comprises dopants selected from the group consisting of antimony and arsenic.

3. The transistor structure of claim 1, wherein the first doped screening layer is doped with antimony or arsenic.

4. The transistor structure of claim 1, further comprising:
a body tap coupled to at least one of the first doped well and the second doped well.

5. A transistor structure with a channel stack, the transistor structure having a semiconductor substrate with a plurality of pre-formed doped wells formed therein, comprising:

a first region having:

a first doped well providing a foundation for a first PMOS transistor element;

a first doped screening layer implanted in the semiconductor substrate in contact with the first doped well;

a first doped threshold voltage control layer in contact with the first doped screening layer;

a second region having:

a second doped well providing a foundation for a first NMOS transistor element;

a second doped screening layer implanted in the semiconductor substrate in contact with the second well;

a second doped threshold voltage control layer in contact with the second doped screening layer; and a third layer formed from undoped epitaxial blanket deposition on the semiconductor substrate, separate from and on top of the first and second doped threshold voltage control layers, the third undoped epitaxial layer allowing establishment of an intrinsic channel for each of the first PMOS and first NMOS transistor elements;

one or more additional PMOS transistor elements formed in the semiconductor substrate in a same manner as the first PMOS transistor element;

a fourth layer formed from undoped epitaxial blanket deposition on the third layer when deposited only on the one or more additional PMOS transistor elements so that an overall undoped epitaxial intrinsic channel layer thickness for the one or more additional PMOS transistor elements is greater than that of the first PMOS transistor element.

6. The transistor structure of claim 5, wherein the first doped threshold voltage control layer comprises dopants selected from the group consisting of antimony and arsenic.

7. The transistor structure of claim 5, wherein the first doped screening layer is doped with antimony or arsenic.

8. The transistor structure of claim 5, further comprising:
a body tap coupled to at least one of the first doped well and the second doped well.

9. A transistor structure with a channel stack, the transistor structure having a semiconductor substrate with a plurality of pre-formed doped wells formed therein, comprising:

a first region having:

a first doped well providing a foundation for a first PMOS transistor element;

a first doped screening layer implanted in the semiconductor substrate in contact with the first doped well;

a first doped threshold voltage control layer in contact with the first doped screening layer;

a second region having:

a second doped well providing a foundation for a first NMOS transistor element;

a second doped screening layer implanted in the semiconductor substrate in contact with the second well;

a second doped threshold voltage control layer in contact with the second doped screening layer; and a third layer formed from undoped epitaxial blanket deposition on the semiconductor substrate, separate from and on top of the first and second doped threshold voltage control layers, the third undoped epitaxial layer allowing establishment of an intrinsic channel for each of the first PMOS and first NMOS transistor elements;

one or more additional NMOS transistor elements formed in the semiconductor substrate in a same manner as the first NMOS transistor element; and a fourth layer formed from undoped epitaxial blanket deposition on the third layer when deposited only on the one or more additional NMOS transistor elements so that an overall undoped epitaxial intrinsic channel layer thickness for the one or more additional NMOS transistor elements is greater than that of the first NMOS transistor element.

10. The transistor structure of claim 9, wherein the first doped threshold voltage control layer comprises dopants selected from the group consisting of antimony and arsenic.

11. The transistor structure of claim 9, wherein the first doped screening layer is doped with antimony or arsenic.

12. The transistor structure of claim 9, further comprising:
a body tap coupled to at least one of the first doped well and the second doped well.

* * * * *